US008301973B2

(12) United States Patent  
Limberg

(10) Patent No.: US 8,301,973 B2  
(45) Date of Patent: Oct. 30, 2012

(54) DIGITAL TELEVISION SYSTEMS EMPLOYING CONCATENATED CONVOLUTIONAL CODED DATA

(75) Inventor: Allen LeRoy Limberg, Port Charlotte, FL (US)

(73) Assignee: Samsung Electronics Co., Ltd., Suwon-si (KR)

( * ) Notice: Subject to any disclaimer, the term of this patent is extended or adjusted under 35 U.S.C. 154(b) by 568 days.

(21) Appl. No.: 12/580,534

(22) Filed: Oct. 16, 2009

(65) Prior Publication Data

US 2010/0100793 A1 Apr. 22, 2010

Related U.S. Application Data

(60) Provisional application No. 61/196,303, filed on Oct. 16, 2008, provisional application No. 61/196,847, filed on Oct. 21, 2008, provisional application No. 61/197,105, filed on Oct. 23, 2008, provisional application No. 61/197,554, filed on Oct. 28, 2008, provisional application No. 61/198,691, filed on Nov. 7, 2008, provisional application No. 61/204,300, filed on Jan. 5, 2009.

(51) Int. Cl.  
*G06F 11/00* (2006.01)
(52) U.S. Cl. .................................................. 714/758
(58) Field of Classification Search .................... 714/758  
See application file for complete search history.

(56) References Cited

U.S. PATENT DOCUMENTS

| 6,779,146 | B1 * | 8/2004 | Jones et al. | 714/748 |
| 7,573,962 | B1 * | 8/2009 | Tapp et al. | 375/347 |
| 7,599,348 | B2 * | 10/2009 | Kang et al. | 370/350 |
| 2006/0052052 | A1 * | 3/2006 | Jung et al. | 455/3.01 |
| 2010/0281346 | A1 * | 11/2010 | Choi et al. | 714/784 |
| 2011/0063514 | A1 * | 3/2011 | Choi et al. | 348/608 |
| 2011/0078539 | A1 * | 3/2011 | Kim et al. | 714/758 |

* cited by examiner

*Primary Examiner* — Bryce Bonzo  
(74) *Attorney, Agent, or Firm* — Sughrue Mion, PLLC

(57) ABSTRACT

In iterative-diversity (ID) transmission systems for signals with concatenated convolutional coding (CCC), paired iterative diversity signals each have ½ the code rate of the 8VSB DTV signals prescribed by the 1995 ATSC Digital Television Broadcast Standard. Known serial concatenated convolutional coding (SCCC) or novel parallel concatenated convolutional coding (PCCC) is used in such system. Pairs of CCC signals code data bits and ones' complemented data bits respectively, using similar coding algorithms. Receivers for this transmission system use respective turbo decoders for turbo decoding the earlier-transmitted and later-transmitted CCC signals. Turbo decoding of the earlier-transmitted portions of iterative diversity signals is delayed to be contemporaneous with turbo decoding of the later-transmitted portions of iterative diversity signals. This facilitates the turbo decoders exchanging information concerning confidence levels of data bits during the turbo decoding procedures.

19 Claims, 53 Drawing Sheets

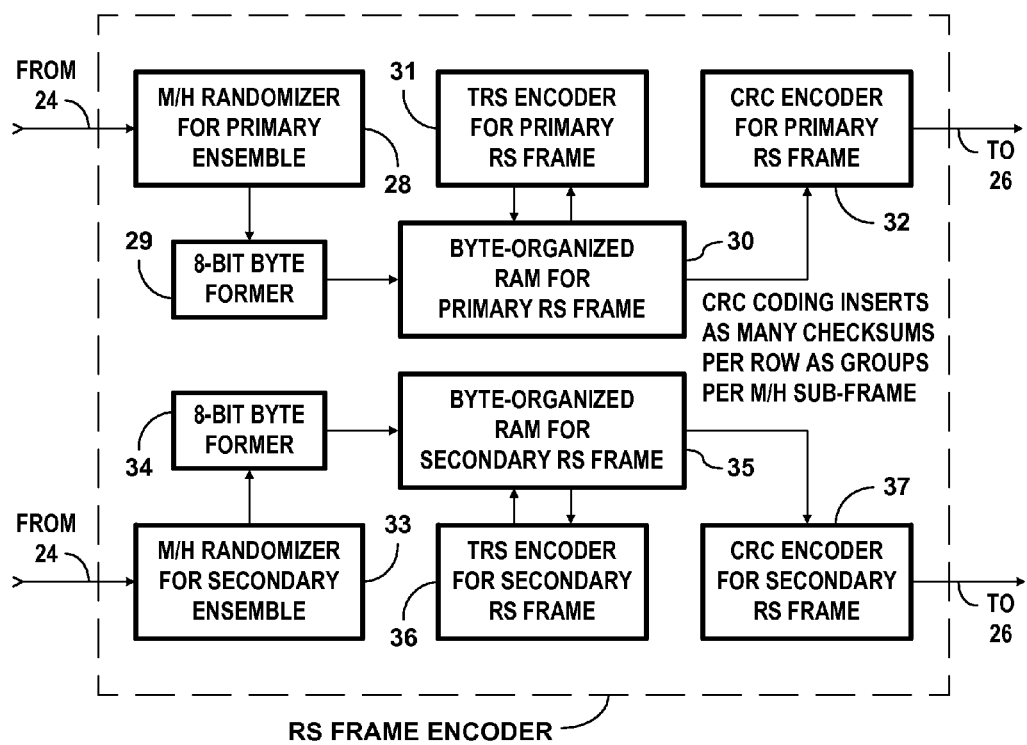
Fig. 3
Fig. 4    BIT ORDER IN 1/2 RATE M/H FOR SCCC
D'S ARE DATA BITS.    P'S ARE PARITY BITS.
Fig. 5    BIT ORDER IN 1/2 RATE M/H FOR PCCC

| SLOT NUMBERS FOR INITIAL TRANSMISSION | SLOT NUMBERS FOR FINAL TRANSMISSION |
| --- | --- |
| 0 | 1 |
| 0, 4 | 1, 5 |
| 0, 4, 8 | 1, 5, 9 |
| 0, 4, 8, 12 | 1, 5, 9, 13 |
| 0, 4, 8, 12, 2 | 1, 5, 9, 13, 3 |
| 0, 4, 8, 12, 2, 6 | 1, 5, 9, 13, 3, 7 |
| 0, 4, 8, 12, 2, 6, 10 | 1, 5, 9, 13, 3, 7, 11 |
| 0, 4, 8, 12, 2, 6, 10, 14 | 1, 5, 9, 13, 3, 7, 11, 15 |

Fig. 7 Iterative-Diversity Slot Allocations

| SLOT NUMBERS FOR INITIAL TRANSMISSION | SLOT NUMBERS FOR FINAL TRANSMISSION |
| --- | --- |
| 1 | 0 |
| 1, 5 | 0, 4 |
| 1, 5, 9 | 0, 4, 8 |
| 1, 5, 9, 13 | 0, 4, 8, 12 |
| 1, 5, 9, 13, 3 | 0, 4, 8, 12, 2 |
| 1, 5, 9, 13, 3, 7 | 0, 4, 8, 12, 2, 6 |
| 1, 5, 9, 13, 3, 7, 11 | 0, 4, 8, 12, 2, 6, 10 |
| 1, 5, 9, 13, 3, 7, 11, 15 | 0, 4, 8, 12, 2, 6, 10, 14 |

Fig. 8 Iterative-Diversity Slot Allocations

⋮

| | |
|---|---|
| ON A SLOT-INTERLEAVED BASIS WITHIN M/H FRAME # (N - 2), READ FROM RS FRAME ENCODER # (N - 3) TO BLOCK PROCESSOR 7 AS "INITIAL" TRANSMISSION, & READ FROM RS FRAME ENCODER # (2N - 3) TO BLOCK PROCESSOR 7 AS "FINAL" TRANSMISSION. ALSO, THEREAFTER RE-WRITE TRS-ENCODER RAM(S) IN RS FRAME ENCODER # (2N - 3) WITH NEW RANDOMIZED M/H DATA FOR SUBSEQUENT TRS & CRC ENCODING THEREOF BEFORE READING AGAIN FROM RS FRAME ENCODER # (2N - 3) TO BLOCK PROCESSOR 7 IN SUB-ROUTINE S-R (2N - 2). | S-R (N-2) |
| ON A SLOT-INTERLEAVED BASIS WITHIN M/H FRAME # (N - 1), READ FROM RS FRAME ENCODER # (N - 2) TO BLOCK PROCESSOR 7 AS "INITIAL" TRANSMISSION, & READ FROM RS FRAME ENCODER # (2N - 2) TO BLOCK PROCESSOR 7 AS "FINAL" TRANSMISSION. ALSO, THEREAFTER RE-WRITE TRS-ENCODER RAM(S) IN RS FRAME ENCODER # (2N - 2) WITH NEW RANDOMIZED M/H DATA FOR SUBSEQUENT TRS & CRC ENCODING THEREOF BEFORE READING AGAIN FROM RS FRAME ENCODER # (2N - 2) TO BLOCK PROCESSOR 7 IN SUB-ROUTINE S-R (2N - 1). | S-R (N-1) |
| ON A SLOT-INTERLEAVED BASIS WITHIN M/H FRAME # N, READ FROM RS FRAME ENCODER # (N - 1) TO BLOCK PROCESSOR 7 AS "INITIAL" TRANSMISSION, & READ FROM RS FRAME ENCODER # (2N - 1) TO BLOCK PROCESSOR 7 AS "FINAL" TRANSMISSION. ALSO, THEREAFTER RE-WRITE TRS-ENCODER RAM(S) IN RS FRAME ENCODER # (2N - 1) WITH NEW RANDOMIZED M/H DATA FOR SUBSEQUENT TRS & CRC ENCODING THEREOF BEFORE READING AGAIN FROM RS FRAME ENCODER # (2N - 1) TO BLOCK PROCESSOR 7 IN SUB-ROUTINE S-R 2N. | S-R N |
| ON A SLOT-INTERLEAVED BASIS WITHIN M/H FRAME # (N + 1), READ FROM RS FRAME ENCODER # N TO BLOCK PROCESSOR 7 AS "INITIAL" TRANSMISSION, & READ FROM RS FRAME ENCODER # 0 TO BLOCK PROCESSOR 7 AS "FINAL" TRANSMISSION. ALSO, THEREAFTER RE-WRITE TRS-ENCODER RAM(S) IN RS FRAME ENCODER # 0 WITH NEW RANDOMIZED M/H DATA FOR SUBSEQUENT TRS & CRC ENCODING THEREOF BEFORE READING AGAIN FROM RS FRAME ENCODER # 0 TO BLOCK PROCESSOR 7 IN SUB-ROUTINE S-R 1. | S-R (N+1) |
| ON A SLOT-INTERLEAVED BASIS WITHIN M/H FRAME # (N + 2), READ FROM RS FRAME ENCODER # (N + 1) TO BLOCK PROCESSOR 7 AS "INITIAL" TRANSMISSION, & READ FROM RS FRAME ENCODER # 1 TO BLOCK PROCESSOR 7 AS "FINAL" TRANSMISSION. ALSO, THEREAFTER RE-WRITE TRS-ENCODER RAM(S) IN RS FRAME ENCODER # 1 WITH NEW RANDOMIZED M/H DATA FOR SUBSEQUENT TRS & CRC ENCODING THEREOF BEFORE READING AGAIN FROM RS FRAME ENCODER # 1 TO BLOCK PROCESSOR 7 IN SUB-ROUTINE S-R 2. | S-R (N+2) |

| SYNTAX | BITS | FORMAT |
|---|---|---|
| TPC_data in initial 2 M/H sub-Frames { | | |
| sub-Frame_number | 1 - 3 | uimsbf |
| Slot_number | 4 - 7 | uimsbf |
| Parade_id | 8 - 14 | uimsbf |
| current_starting_Group_number | 15 - 18 | uimsbf |
| current_number_of_Groups_minus_1 | 19 - 21 | uimsbf |
| Parade_Repetition_Cycle_minus_1 | 22 - 24 | uimsbf |
| current_RS_frame_mode | 25 - 26 | bslbf |
| current_RS_code_mode_primary | 27 - 28 | bslbf |
| current_RS_code_mode_secondary | 29 - 30 | bslbf |
| current_CCC_block_mode | 31 - 32 | bslbf |
| current_CCC_outer_code_mode_a | 33 - 34 | bslbf |
| current_CCC_outer_code_mode_b | 35 - 36 | bslbf |
| current_CCC_outer_code_mode_c | 37 - 38 | bslbf |
| current_CCC_outer_code_mode_d | 39 - 40 | bslbf |
| FIC_version | 41 - 45 | uimsbf |
| Parade_continuity_counter | 46 - 49 | uimsbf |
| current_total_number_of_Groups | 50 - 54 | uimsbf |
| reserved | 55 - 59 | 11111 |
| diversity_transmission_mode | 60 - 61 | bslbf |
| iterative_diversity_delay | 62 - 64 | uimsbf |
| Z-sub-2_bits_in_M/H_data_precoded? | 65 | bslbf |
| reserved | 66 - 75 | 1111111111 |
| TPC_protocol_version_major_update | 76 - 77 | bslbf |
| TPC_protocol_version_minor_update | 78 - 80 | bslbf |
| } | | |

Fig. 11 Bit Syntax of TPC in M/H Sub-Frames #0 & #1

| SYNTAX | BITS | FORMAT |
|---|---|---|
| TPC_data in final 3 M/H sub-Frames { | | |
|   sub-Frame_number | 1 - 3 | uimsbf |
|   Slot_number | 4 - 7 | uimsbf |
|   Parade_id | 8 - 14 | uimsbf |
|   next_starting_Group_number | 15 - 18 | uimsbf |
|   next_number_of_Groups_minus_1 | 19 - 21 | uimsbf |
|   Parade_Repetition_Cycle_minus_1 | 22 - 24 | uimsbf |
|   next_RS_frame_mode | 25 - 26 | bslbf |
|   next_RS_code_mode_primary | 27 - 28 | bslbf |
|   next_RS_code_mode_secondary | 29 - 30 | bslbf |
|   next_CCC_block_mode | 31 - 32 | bslbf |
|   next_CCC_outer_code_mode_a | 33 - 34 | bslbf |
|   next_CCC_outer_code_mode_b | 35 - 36 | bslbf |
|   next_CCC_outer_code_mode_c | 37 - 38 | bslbf |
|   next_CCC_outer_code_mode_d | 39 - 40 | bslbf |
|   FIC_version | 41 - 45 | uimsbf |
|   Parade_continuity_counter | 46 - 49 | uimsbf |
|   next_total_number_of_Groups | 50 - 54 | uimsbf |
|   current_total_number_of_Groups | 55 - 59 | uimsbf |
|   diversity_transmission_mode | 60 - 61 | bslbf |
|   iterative_diversity_delay | 62 - 64 | uimsbf |
|   Z-sub-2_bits_in_M/H_data_precoded? | 65 | bslbf |
|   reserved | 66 - 75 | 1111111111 |
|   TPC_protocol_version_major_update | 76 - 77 | bslbf |
|   TPC_protocol_version_minor_update | 78 - 80 | bslbf |
| } | | |

Fig. 12 Bit Syntax of TPC in M/H Sub-Frames #2, #3 & #4

| CCC_outer_code_mode | MEANING |
|---|---|
| 00 | OUTER CODING HAS CODE RATE OF 1/2 & GIVES RISE TO SCCC IN THE CCC BLOCK. |
| 01 | OUTER CODING HAS CODE RATE OF 1/4 & GIVES RISE TO SCCC IN THE CCC BLOCK. |
| 10 | OUTER CODING HAS CODE RATE OF 1/2, IS COMPLEMENTED & GIVES RISE TO PCCC IN THE CCC BLOCK. |
| 11 | OUTER CODING HAS CODE RATE OF 1/2, IS NOT COMPLEMENTED & GIVES RISE TO PCCC IN THE CCC BLOCK. |

Fig. 13   Bit Syntax of CCC_outer_code_mode

| SYNTAX | BITS | FORMAT |
|---|---|---|
| FIC_chunk_header() { | | |
|    FIC_chunk_major_protocol_version | 1 - 2 | uimsbf |
|    FIC_chunk_minor_protocol_version | 3 - 5 | uimsbf |
|    FIC_chunk_header_extension_length | 6 - 8 | uimsbf |
|    ensemble_loop_header_extension_length | 9 - 11 | uimsbf |
|    MH_service_loop_extension_length | 12 - 14 | uimsbf |
|    reserved | 15 | '1' |
|    current_next_indicator | 16 | bslbf |
|    transport_stream_id | 17 - 32 | uimsbf |
|    num_ensembles | 33 - 40 | uimsbf |
| } | | |

Fig. 14   Bit Syntax of FIC-Chunk Header

| SYNTAX | NO. OF BITS | FORMAT |
|---|---|---|
| FIC_Chunk_payload ( ) { | | |
|   for (i = 0, i < num_ensembles; i++){ | | |
|     ensemble_id | 8 | uimsbf |
|     reserved | 3 | 111 |
|     ensemble_protocol_version | 5 | uimsbf |
|     SLT_ensemble_indicator | 1 | bslbf |
|     GAT_ensemble_indicator | 1 | bslbf |
|     final_transmission_of_this_M/H data? | 1 | bslbf |
|     MH_service_signaling_channel_version | 5 | uimsbf |
|     num_MH_services | 8 | uimsbf |
|     for (j= 0, j < num_ensembles; j++){ | | |
|       MH_service_id | 16 | uimsbf |
|       reserved | 3 | 111 |
|       multi_ensemble_service | 2 | uimsbf |
|       MH_service_status | 2 | uimsbf |
|       SP_indicator | 1 | bslbf |
|     } | | |
|   } | | |
|   FIC_chunk_stuffing | 89 & up | |
| } | | |

Fig. 15 Bit Syntax of FIC-Chunk Payload

| multi_ensemble_service | MEANING |
|---|---|
| 00 | THIS M/H ENSEMBLE DELIVERS ALL THE IP STREAMS FORMING THIS M/H SERVICE. |
| 01 | THIS M/H ENSEMBLE DELIVERS ONLY PART OF THE IP STREAMS FORMING THIS M/H SERVICE, BUT DELIVERS IP STREAMS SUFFICIENT TO SUPPORT A PORTION OF THE SERVICE MEANINGFUL IN ITSELF. |
| 10 | THIS M/H ENSEMBLE DELIVERS ONLY PART OF THE IP STREAMS FORMING THIS M/H SERVICE, & DELIVERS IP STREAMS INSUFFICIENT TO SUPPORT A PORTION OF THE SERVICE MEANINGFUL IN ITSELF. |
| 11 | THIS M/H ENSEMBLE DELIVERS COMPLEMENTARY IP STREAMS FORMING THIS M/H SERVICE, SENT AS AN INITIAL PART OF AN ID TRANSMISSION, WHICH PART IS SUFFICIENT IN ITSELF TO SUPPORT THE M/H SERVICE. |

Fig. 16 Bit Syntax of multi_ensemble_service

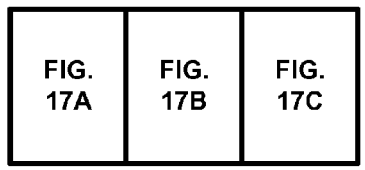
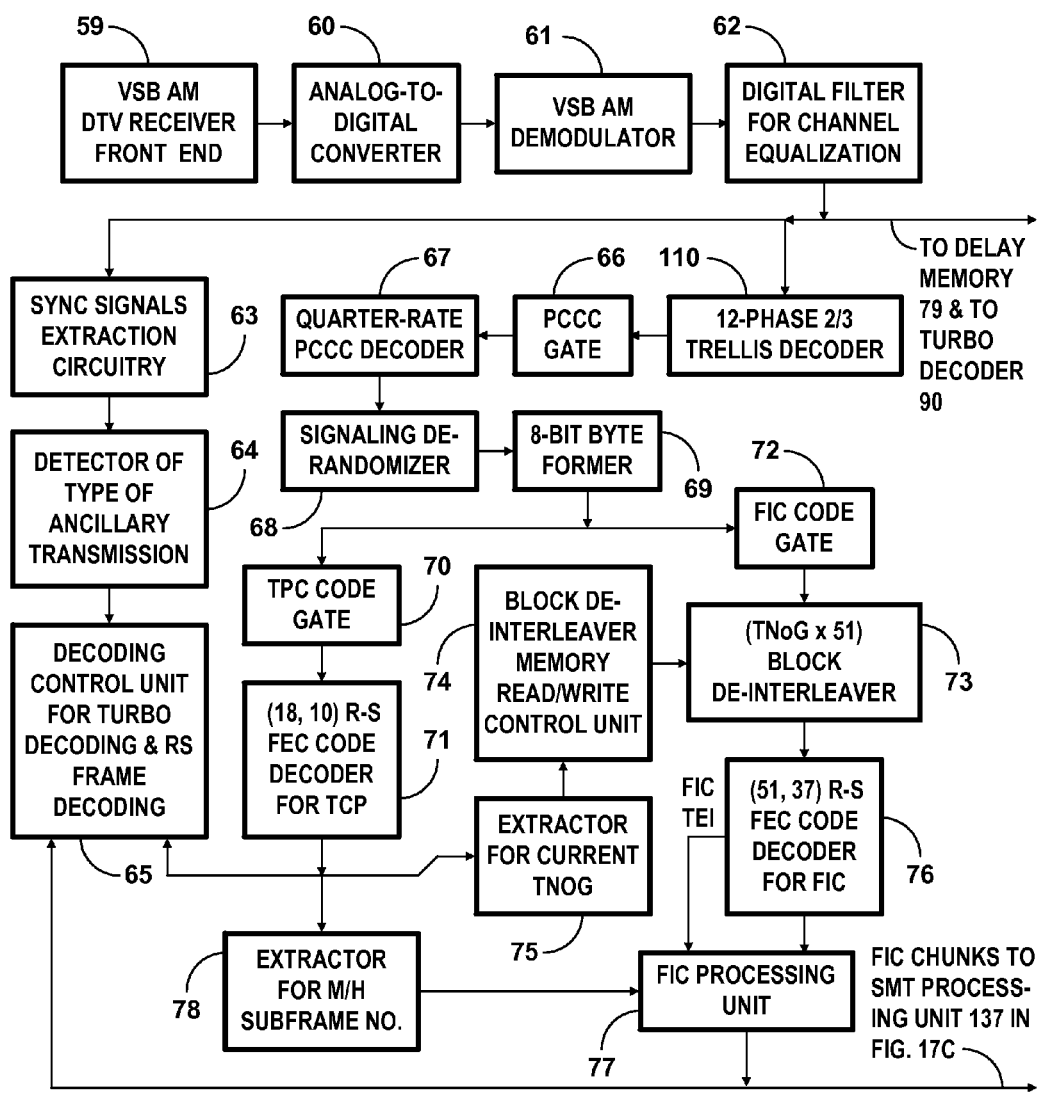
Fig. 17A

DIGITAL TELEVISION SYSTEMS EMPLOYING CONCATENATED CONVOLUTIONAL CODED DATA

CROSS-REFERENCE TO RELATED APPLICATIONS

This application claims priority from U.S. Provisional Applications Ser. Nos. 61/196,303, 61/196,847, 61/197,105, 61/197,554, 61/198,691 and 61/204,300 filed on Oct. 16, 2008, Oct. 21, 2008, Oct. 23, 2008, Oct. 28, 2008, Nov. 7, 2008 and Jan. 5, 2009, respectively, the disclosures of which provisional applications are incorporated in their entirety herein by reference.

BACKGROUND

1. Field

The invention relates to digital television (DTV) signals for over-the-air broadcasting, transmitters for such broadcast DTV signals, receivers for such broadcast DTV signals and in particular those items as designed for implementing a system of broadcasting robust data to mobile/handheld receivers, collectively referred to as "M/H" receivers.

2. Related Art

The Advanced Television Systems Committee (ATSC) published a Digital Television Standard in 1995 as Document A/53, hereinafter referred to simply as "A/53" for sake of brevity. Annex D of A/53 titled "RF/Transmission Systems Characteristics" is particularly incorporated by reference into this specification. In the beginning years of the twenty-first century, efforts were made to provide for more robust transmission of data over broadcast DTV channels without unduly disrupting the operation of so-called "legacy" DTV receivers already in the field. In 2009, these efforts culminated in a candidate ATSC standard directed to broadcasting digital television and digital data to M/H receivers being drafted. This candidate standard, referred to as "A/153", is incorporated by reference within this specification.

A/153 prescribes forward-error-correction coding of data transmitted to M/H receivers, which FEC coding comprises transversal Reed-Solomon (TRS) coding combined with lateral cyclic-redundancy-check (CRC) codes to locate byte errors for the TRS coding. This FEC coding helps overcome temporary fading in which received signal strength momentarily falls below that needed for successful reception. The strongest TRS codes prescribed by A/153 can overcome such drop-outs in received signal strength that are as long as four tenths of a second.

Another known technique for overcoming temporary fading is iterative diversity. Iterative diversity can also overcome certain types of intermittent radio-frequency (RF) interference. Communications systems provide for iterative diversity of received signals by transmitting a composite signal composed of two component content-representative signals, one of which is delayed with respect to the other. The composite signal is broadcast to one or more receivers through a communications channel. At a receiver, delayed response to the initially transmitted component content-representative signal supplied from a buffer memory is contemporaneous in time with the finally transmitted component content-representative signal. Under normal conditions, the receiver detects and reproduces the content of the finally transmitted signal as soon as it is received. However, if a drop-out in received signal strength occurs, then the receiver detects and reproduces the content of the initially transmitted signal as read from buffer memory. If the delay period and the associated delay buffer are large enough, then fairly long drop-outs in received signal strength can be overcome. This capability not only requires a several fold increase in the amount of memory required in a receiver; it halves the effective code rate of the transmission. However, overcoming drop-outs as a long as a few seconds are envisioned is soon being feasible.

Thomson, Inc. proposed forms of iterative diversity its engineers called "staggercasting" for use in robust portions of 8-VSB transmissions. Thomson, Inc. has advocated iterative diversity in which the earlier and final transmissions of the same data are combined in the "transport" layer of the receiver. The "transport" layer of the receiver is subsequent to the "physical" layer of the receiver, which recovers transport-stream (TS) packets from the robust portions of 8-VSB transmissions. TS packets from the earlier one of the iterated transmissions replace missing TS packets in the later one of the iterated transmissions in staggercasting. For a brief time Thomson, Inc. and Micronas GmbH representatives within the ATSC took a position that the earlier and final transmissions of the same data could be advantageously combined in the physical layer of the receiver, rather in its transport layer, but later withdrew from that position. Thomson and Micronas jointly proposed a concatenation of outer block coding with inner ⅔ trellis coding per 8-VSB for each component transmission, pointing out that earlier and final transmissions of the same coded data could be combined along the lines used in digital audio broadcasting (DAB).

SUMMARY

The inventor perceived that the processing of "soft" decisions in turbo decoding allows a more sophisticated approach to be taken for iterative diversity reception. "Soft" decisions concerning the contents of an earlier transmitted turbo codeword and concerning the contents of a later transmitted repeat of the earlier transmitted turbo codeword can be analyzed for selecting which of corresponding portions of the two turbo codewords as received is more likely to be correct. The selection procedure can synthesize a turbo codeword that is more likely to be correct than either of the turbo codewords from which the parts of the synthesized turbo codeword are drawn. The synthesized turbo codeword can then be subjected to turbo decoding and R-S decoding procedures.

The inventor subsequently invented a form of iterative diversity in which parallelly concatenated convolutional coding (PCCC) was dissected for transmission. Data and the parity bits for one of the two convolutional codes used in the PCCC are transmitted at an earlier time. Subsequently, at a later time, the data are retransmitted together with the parity bits for the other of the two convolutional codes used in the PCCC. In a receiver, "soft" decisions concerning the originally transmitted data and "soft" decisions concerning the re-transmitted data are compared, and a best estimate of the data is developed for PCCC decoding. Deep fading conditions that prevent successful reception of one of the transmissions may not affect the other transmission severely enough to prevent its being successfully received. This invention is disclosed in A. L. R. Limberg's U.S. patent application Ser. No. 12/218,131 filed Jul. 11, 2008, titled "Systems for Reducing Adverse Effects of Deep Fade in DTV Signals Designed for Mobile Reception" and published Jan. 15, 2009 with publication No. 2009-0016432

Some time after this, the inventor realized that this concept can be applied to SCCC of the types used in A-VSB and in MPH. Of especial interest is the application of this concept to SCCC in which the initial transmission and the final transmission are each at a code rate that is nominally one half that of ordinary 8-VSB. Overall, a code rate that is nominally one quarter that of ordinary 8VSB results, and AWGN performance was expected to be as good as that of previously proposed A-VSB or MPH signals having a code rate that is nominally one quarter that of ordinary 8-VSB. However, except when SNR is very low for both transmissions of the iterative-diversity signals, reception should be possible. Deep fading conditions can be tolerated that would not be successfully received using the previously proposed A-VSB or MPH signals having a code rate that is nominally one quarter that of ordinary 8-VSB. This invention is disclosed in A. L. R. Limberg's U.S. patent application Ser. No. 12/228,959 filed Aug. 18, 2008, titled "Staggercasting of DTV Signals That Employ Serially Concatenated Convolutional Coding" and published Feb. 26, 2009 with publication No. 2009-0052544.

A problem that receivers for iterative-diversity SCCC or PCCC DTV signals are prone to is difficulty in changing channels quickly owing to the latent delay involved in combining the earlier transmitted signals with later transmitted signals. The inventor discerned that this problem can be alleviated when strong signals are received. When a channel is initially tuned to, only the later transmitted codewords of the iterative-diversity SCCC or PCCC are decoded until earlier transmitted words that have been temporarily stored for combining with the later transmitted words of the iterative-diversity SCCC or PCCC become available.

For some time in his work on iterative diversity, the inventor sought to use half-code-rate outer convolutional coding similarly to the ways it is specified in A/153. The desire was that either the initial or the final ones of the iterative-diversity transmissions could be usefully received by the first generation of receivers designed for receiving transmissions made in accordance with A/153. The half-code-rate outer convolutional coding used in A/153 is mapped into 8VSB symbols such that the original data bits occupied the most significant bits (MSBs) of the three-bit symbols. Difficulties were encountered in doing this, which led the inventor to consider mapping the half-code-rate outer convolutional coding into 8VSB symbols such that the original data bits occupied the secondmost significant bits of the three-bit symbols rather than their MSBs. Later on, these difficulties were overcome. So, the inventor laid aside this mapping in favor of the one employed in A/153.

However, before laying it aside, the inventor had observed that the alternative mapping scheme had the following advantage. The data bits were directly involved in both the inner and the outer convolutional coding, so that updating of soft data bits was done both in the inner decoding step(s) and in the outer decoding step(s) of turbo decoding procedures, rather than just in the outer decoding step(s). Interestingly, the set of parity bytes generated by the ⅔ trellis coding used as inner coding in the concatenated convolutional coding was independent of the set of parity bytes generated by the outer coding. So, as the inventor observed, the outer convolutional coding and the inner convolutional coding are in effect parallelly concatentated, rather than serially concatenated. PCCC reduces error faster than SCCC in regions where error rate is significantly higher than one in a billion, but error reduction by PCCC tends to slow at lower BERs, which phenomenon is referred to as the "bit-error-rate floor". Presumably, the systems on which A/153 was based mapped the half-code-rate outer convolutional coding into 8VSB symbols such that the original data bits occupied the most significant bits (MSBs) of the three-bit symbols in order to avoid the BER floor problem.

Published U.S. Patent Application Ser. No. 2001-0025358 caught the inventor's attention in a review of patent literature concerning concatenated convolutional coding that he conducted later on, in October 2008. This patent application filed by D. B. Eidson, A. Krieger and R. Murali of Conexant Systems, Inc. is titled "Iterative Decoder Employing Multiple External Code Error Checks to Lower the Error Floor". The abstract suggests that cyclic-redundancy-check (CRC) codes may be used to improve the performance of turbo decoding procedures for concatenated convolutional coding. CRC codes can be used to check whether or not strings of data bits in the results of decoding outer convolutional coding are presumably correct. Those strings of data bits with checksums indicating they are very likely to be correct can have the confidence levels associated with their parent soft bits heightened. Re-interleaving will scatter the parent soft bits descriptive of data that have the heightened confidence levels throughout the extrinsic information fed back via the turbo loop, to be used in the next iteration of decoding of inner convolutional coding.

As mentioned above, the SCCC that was proposed for inclusion in A/153 and subsequently adopted includes CRC codes used for locating byte errors for the TRS decoding. This suggested to the inventor that he try to use the CRC codes to improve the performance of turbo decoding procedures for the SCCC proposed for the A/153.

Straightforward attempts to do this will not work, the inventor subsequently found. The reason is that the CRC codes proposed for inclusion in A/153 and subsequently adopted are applicable only to the data bits in the SCCC as de-interleaved for processing by the decoder for the outer convolutional coding. When the results of decoding the outer convolutional coding are re-interleaved for processing by the decoder for the inner convolutional coding, the problem that is encountered is that the decoder for the inner convolutional coding does not respond to data bits. The scattered data bits with heightened confidence levels are de-interleaved so as to be supplied in the same data string order for outer convolutional decoding as they originally were. There is no appreciable increase in coding gain.

The inventor realized, casting back to his earlier work, that this problem was avoided by mapping the half-code-rate outer convolutional coding into 8VSB symbols such that the original data bits occupied the secondmost significant bits of the three-bit symbols rather than their MSBs. That is, the data bits would be directly involved in the ⅔ trellis coding procedure, rather than indirectly involved as specified by the proposed A/153. The inventor realized that heightening the confidence levels associated with the parent soft bits of data in CRC codewords with checksums indicating they are very likely to be correct effectively avoided the problem of the BER floor that might otherwise be associated with the resulting concatenated convolutional coding. The inventor further realized that directly involving the data bits in the ⅔ trellis coding procedure should be useful in transmitting signals at half the code rate of conventional 8VSB signals, even though iterative diversity was not employed.

One aspect of the invention concerns methods for broadcasting signals of the general type associated with transmitting 8VSB digital television, in which methods the transmission of outer convolutional coding is in effect parallelly concatenated with the inner convolutional coding provided by ⅔ trellis coding. The outer convolutional coding is of data that has already been encoded using cyclic-redundancy-check (CRC) coding.

Another aspect of the invention concerns methods for broadcasting signals of the general type associated with transmitting 8VSB digital television, which methods provide for iterative-diversity transmissions of concatenated convolutional coding (CCC) in which the inner convolutional coding is provided by ⅔ trellis coding. The CCC is parallel concatenated convolutional coding (PCCC) in some embodiments of this aspect of the invention and is serial concatenated convolutional coding (SCCC) in other embodiments of this aspect of the invention.

Other aspects of the invention are embodied in M/H receivers of a new type for usefully receiving signals of the general type associated with transmitting 8VSB digital television, in which 8VSB signals the outer convolutional coding is in effect parallelly concatenated with the inner convolutional coding provided by ⅔ trellis coding rather than serially concatenated as specified by A/153. In a preferred design of such M/H receiver, CRC coding of the data bits in the parallelly concatenated convolutional codes are decoded and used to improve iterative turbo decoding procedures.

Further aspects of the invention are embodied in receivers for usefully receiving iterative-diversity 8VSB signals, in which signals the outer convolutional coding is parallelly concatenated with the inner convolutional coding provided by ⅔ trellis coding Still further aspects of the invention are embodied in M/H receivers for usefully receiving iterative-diversity 8VSB signals, in which signals the outer convolutional coding is serially concatenated with the inner convolutional coding provided by ⅔ trellis coding.

BRIEF DESCRIPTION OF THE DRAWINGS

FIG. 3 is a detailed schematic diagram of one of the RS Frame encoders in the FIG. 2 M/H Frame encoder.

FIG. 4 is a diagram of the bit order of half-rate outer convolutional coding when M/H data are encoded in SCCC.

FIG. 5 is a diagram of the bit order of half-rate outer convolutional coding when M/H data are encoded in PCCC.

FIGS. 7 and 8 are tables showing alternative ways of allocating Slots for iterative-diversity transmissions in accordance with aspects of the invention.

FIGS. 9A and 9B are portions of a flow diagram of the cyclic operation of a portion of the FIG. 2 M/H Frame encoder.

FIG. 11 is a table showing a preferred bit syntax for the Transmission Parameter Channel (TPC) that the novel signaling encoder of the FIG. 1 DTV transmitter apparatus uses during the initial two Sub-Frames of each M/H Frame, which bit syntax is novel and provides for signaling receivers concerning iterative-diversity transmissions.

FIG. 12 is a table showing a preferred bit syntax for the Transmission Parameter Channel (TPC) that the novel signaling encoder of the FIG. 1 DTV transmitter apparatus uses during the final three Sub-Frames of each M/H Frame, which bit syntax is novel and provides for signaling receivers concerning iterative-diversity transmissions.

FIG. 13 is a table showing a preferred bit syntax for a CCC_outer_code_mode that the FIG. 11 and FIG. 12 TPC tables use in place of the SCCC_outer_code_mode used in the TPC tables specified by A/153.

FIG. 14 is a table showing the bit syntax for the FIC-Chunk headers, which is the same as that specified by A/153.

FIG. 15 is a table showing a preferred bit syntax for an FIC-Chunk, which differs from that specified by A/153 in that a reserved bit is used for signaling whether an Ensemble of M/H data is being transmitted a final time or will be transmitted again.

FIG. 16 is a table showing a preferred bit syntax for a multiple_ensemble_service field included in FIC-Chunks and in Service Map Tables for M/H transmissions (SMT-MHs), which novel bit syntax for the multiple_ensemble_service fields allows for interative-diversity (ID) transmissions.

Figure 1:
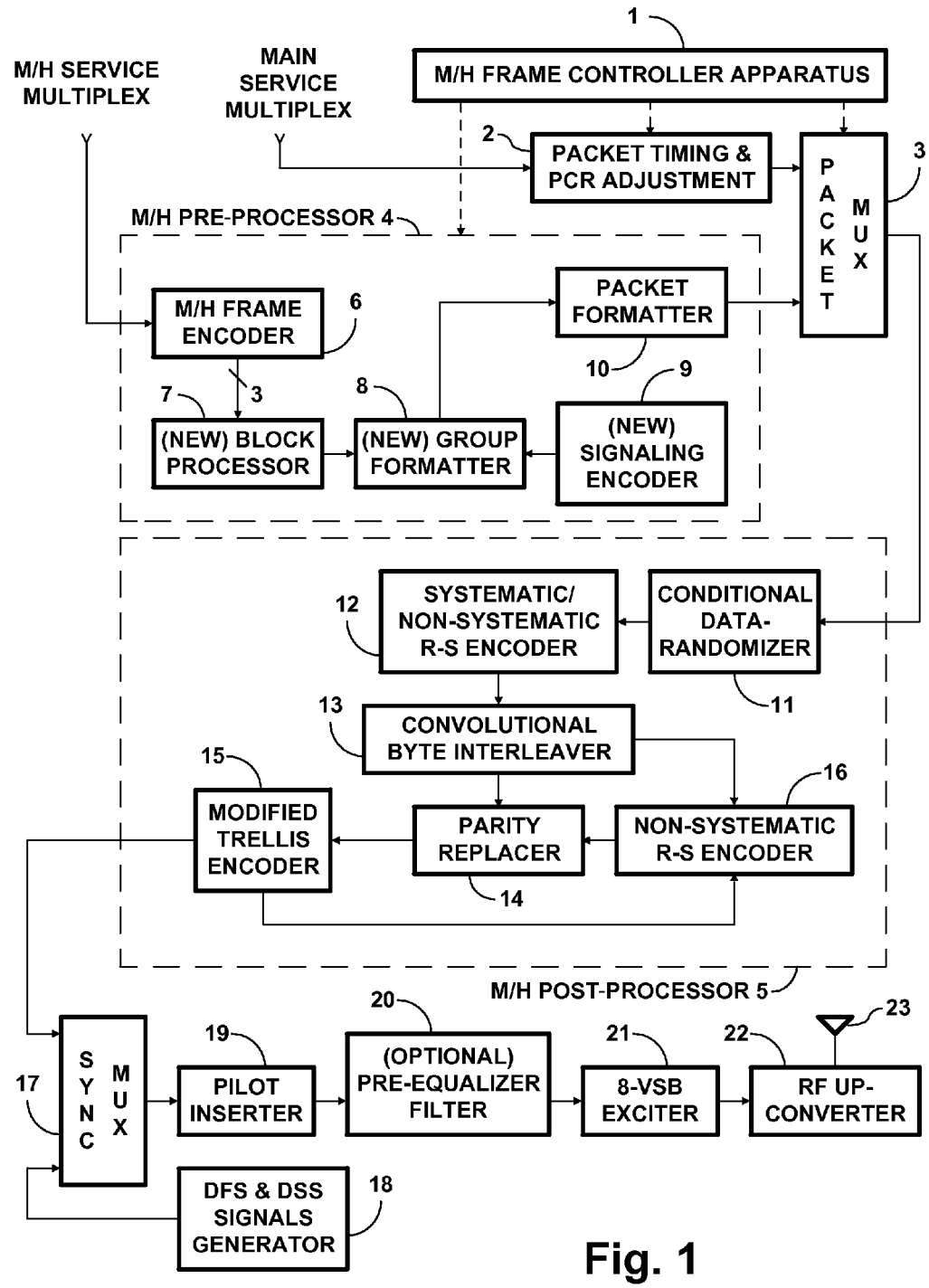
FIG. 1 is a schematic diagram of DTV transmitter apparatus with novel M/H Frame encoder, novel block processor, and novel signaling encoder, which novel elements in accordance with aspects of the invention implement iterative-diversity transmissions.

Connections for control signals are indicated by successions of short dashes. Shim delays that a person of ordinary skill in the art would be customarily introduce to make signal timings precisely correct may in some instances be omitted in the figures of the drawing. This is done to conform to drafting limitations while keeping the figures easy to understand.

DETAILED DESCRIPTION OF EXEMPLARY EMBODIMENTS

FIG. 1 shows transmitter apparatus for broadcast DTV signals including those intended for reception by mobile/handheld (M/H) receivers. The transmitter apparatus receives two sets of input streams: one consists of the MPEG transport stream (TS) packets of the main-service data and the other consists of the M/H-service data. The M/H-service data are encapsulated in 208-byte-long MPEG-like TS packets before emission, which MPEG-like TS packets have been called "M/H encapsulating packets" or more simply "MHE packets". This avoids disrupting the reception of the main-service data by legacy 8-VSB receivers. M/H-service data are carried by Internet-Protocol (IP) packets, however. The FIG. 1 transmitter apparatus combines the MPEG TS packets of the main-service data and the IP TS packets of the M/H-service data within one stream of MPEG or MPEG-like TS packets. Then, the FIG. 1 transmitter apparatus processes the combined stream for transmission as an ATSC trellis-coded 8-VSB signal.

M/H Frame controller apparatus 1 controls these procedures. The main-service multiplex stream of data is supplied to packet timing and PCR adjustment circuitry 2 before the packets of that stream are routed to a packet multiplexer 3 to be time-division multiplexed with MHE packets encapsulating M/H-service data. (PCR is the acronym for "Program Clock Reference".) Because of their time-division multiplexing with the MHE packets encapsulating M/H-service data, changes have to be made to the time of emission of the main-service stream packets compared to the timing that would occur with no M/H stream present. The packet timing and PCR adjustment circuitry 2 makes these timing changes responsive to control signals supplied thereto from the M/H Frame controller apparatus 1. The packet multiplexer 3 time-division multiplexes the main-service TS packets with TS packets encapsulating M/H-service data, as directed by control signals from the M/H Frame controller apparatus 1. The operations of the M/H transmission system on the M/H data are divided into two stages: the M/H pre-processor 4 and the M/H post-processor 5.

The function of the pre-processor 4 is to rearrange the M/H-service data into an M/H data structure, to enhance the robustness of the M/H-service data by additional FEC processes, to insert training sequences, and subsequently to encapsulate the processed enhanced data within MHE packets, thereby to generate the ancillary transport stream (TS). The operations performed by the pre-processor 4 include M/H Frame encoding, block processing, Group formatting, packet formatting and M/H signaling encoding. The M/H Frame controller apparatus 1 provides the necessary transmission parameters to the pre-processor 4 and controls the multiplexing of the main-service data packets and the M/H-service data packets by the packet multiplexer 3 to organize the M/H Frame.

The function of the post-processor 5 is to process the main-service data by normal 8-VSB encoding and to re-arrange the pre-processed M/H-service data in the combined stream to assure backward compatibility with ATSC 8-VSB. Main-service data in the combined stream are processed exactly the same way as for normal 8-VSB transmission: randomizing, Reed-Solomon (RS) encoding, convolutional byte interleaving and trellis encoding. The M/H-service data in the combined stream are processed differently from the main-service data, with the pre-processed M/H-service data bypassing data randomization. The pre-processed M/H-service data is subjected to non-systematic RS encoding, which re-arranges the bytes of that data. The non-systematic RS encoding allows the insertion of the regularly spaced long training sequences without disturbing legacy receivers. Additional operations are done on the pre-processed M/H-service data to initialize the trellis encoder memories at the beginning of each training sequence included in the pre-processed M/H-service data.

More specifically, the M/H-service multiplex stream of data is supplied to the M/H pre-processor 4 for processing and subsequent encapsulation in the payload fields of MHE transport packets. The MHE transport packets are supplied to the packet multiplexer 3 after data encapsulation within their payload fields is completed.

Still more specifically, the M/H-service multiplex stream of data is supplied to an M/H Frame encoder 6 which provides transverse Reed-Solomon (TRS) coding of data packets. The data packets are also subjected to periodic cyclic-redundancy-check (CRC) coding to locate byte errors for the TRS coding. Each M/H Frame is composed of one or two frames of the TRS coding, and the data in each frame of the TRS-CRC coding are randomized independently from each other and from the data of the main-service multiplex.

The M/H Frame encoder 6 is connected for supplying packets of M/H-service data to a block processor 7, as input signal thereto. The block processor 7 includes encoders for each type of single-phase outer convolutional coding used for M/H transmission and subsequent interleaving circuitry for successive bit pairs of each type of single-phase outer convolutional coding.

A Group formatter 8 is connected for receiving the interleaved outer convolutional coding from the block processor 7 as input addressing signal. The Group formatter 8 includes an interleaved Group format organizer that operates on the Group format as it will appear after the ATSC data interleaver. The interleaved Group format organizer maps the FEC coded M/H-service data from the block processor into the corresponding M/H blocks of a Group, adding pre-determined training data bytes and data bytes to be used for initializing the trellis encoder memories. The interleaved Group format organizer inserts 3-byte headers for the MHE packets. The interleaved Group format organizer also inserts place-holder bytes for main-service data and for non-systematic RS parity. The interleaved Group format organizer adds some dummy bytes to complete construction of the intended Group format. The interleaved Group format organizer assembles an M/H Group of 118 consecutive TS packets. Some of these TS packets are composed of the interleaved outer convolutional coding supplied by the block processor 7. Others of these TS packets are prescribed training signals stored in read-only memory within the Group formatter 8 and inserted at prescribed intervals within the M/H Group. Still others of these TS packets are generated by a signaling encoder 9.

The M/H transmission system has two kinds of signaling channels generated by the signaling encoder 9. One is the Transmission Parameter Channel (TPC), and the other is the Fast Information Channel (FIC). The TPC is for signaling the M/H transmission parameters such as various FEC modes and M/H Frame information. The FIC is provided to enable a receiver to acquire a broadcast service quickly, and the FIC contains cross-layer information between the physical layer of the receiver and its upper layer(s).

Within the Group formatter 8 the interleaved Group format organizer is followed in cascade connection by a byte de-interleaver that complements the ATSC convolutional byte interleaver. The Group formatter 8 is connected for supplying the response of this de-interleaver as its output signal, which is applied as input signal to a packet formatter 10. Initially, the packet formatter 10 expunges the main-service data place holders and the RS parity place holders that were inserted by the interleaved Group format organizer for proper operation of the byte de-interleaver in the Group formatter 8. The packet formatter 10 inserts an MPEG TS sync byte before each 187-byte data packet as a prefix thereof. The packet formatter 10 supplies 118 M/H-data-encapsulating TS packets per M/H Group to the packet multiplexer 3, which time-division multiplexes the M/H-service TS packets and the main-service TS packets to construct M/H Frames.

The M/H Frame controller apparatus 1 controls the packet multiplexer 3 in the following way when the packet multiplexer schedules the 118 TS packets from the packet formatter 10. Thirty-seven packets immediately precede a DFS segment in a 313-segment VSB field of data, and another eighty-one packets immediately succeed that DFS segment. The packet multiplexer 3 reproduces next-in-line main-service TS packets in place of MPEG null packets that contain placeholder bytes for main-service data in their payload fields. The packet multiplexer 3 is connected to supply the TS packets it reproduces to the post-processor 5 as input signal thereto.

More specifically, the packet multiplexer 3 is connected to apply the TS packets it reproduces to a conditional data randomizer 11 as the input signal thereto. The conditional data randomizer 11 suppresses the sync bytes of the 188-byte TS packets and randomizes the remaining data in accordance with conventional 8-VSB practice, but only on condition that it is not encapsulated M/H-service data. The encapsulated M/H-service data bypass data randomization. The other remaining data are randomized per A/53, Annex D, §4.2.2.

An encoder 12 for systematic and non-systematic (207, 187) Reed-Solomon codes is connected to receive, as its input signal, the 187-byte packets that the conditional data randomizer 11 reproduces with conditional data randomization. The RS parity generator polynomial and the primitive field generator for the Reed-Solomon encoder 12 are the same as those A/53, Annex D, FIG. 5 prescribes for (207, 187) Reed-Solomon coding. When the RS encoder 12 receives a main-service data packet, the RS encoder 12 performs the systematic RS coding process prescribed in A/53, Annex D, §4.2.3, appending the twenty bytes of RS parity data to the conclusion of the 187-byte packet. When the RS encoder 12 receives an M/H-service data packet, the RS encoder 12 performs a non-systematic RS encoding process. The twenty bytes of RS parity data obtained from the non-systematic RS encoding process are inserted in a prescribed parity byte location within the M/H data packet.

A convolutional byte interleaver 13 is connected for receiving as its input signal the 207-byte RS codewords that the RS encoder 12 generates. The byte interleaver 13 is generally of the type specified in A/53, Annex D, §4.2.4. The byte interleaver 13 is connected for supplying byte-interleaved 207-byte RS codewords via a Reed-Solomon parity replacer 14 to a modified trellis encoder 15. The basic trellis encoding operation of the modified trellis encoder 15 is similar to that specified in A/53, Annex D, §4.2.4. The trellis encoder 15 converts the byte-unit data from the byte interleaver 13 to symbol units and performs a 12-phase trellis coding process per Section 6.4.1.4 "Main Service Trellis Coding" of A/53, Part 2: 2007. In order for the output data of the trellis encoder 15 to include pre-defined known training data, initialization of the memories in the trellis encoder 15 is required. This initialization is very likely to cause the RS parity data calculated by the RS encoder 12 prior to the trellis initialization to be erroneous. The RS parity data must be replaced to ensure backwards compatibility with legacy DTV receivers. Accordingly, the trellis encoder is connected for supplying the changed initialization byte to an encoder 16 for non-systematic (207, 187) Reed-Solomon codes, which encoder 16 re-calculates the RS parity of the affected M/H packets. The encoder 16 is connected for supplying the re-calculated RS parity bytes to the RS parity replacer 14, which substitutes the re-calculated RS parity bytes for the original RS parity bytes before they can be supplied to the modified trellis encoder 15.

That is, the RS parity replacer 14 reproduces the output of the byte interleaver 13 as the data bytes for each packet in its output signal, but reproduces the output of the non-systematic RS encoder 16 as the RS parity for each packet in its output signal. The RS parity replacer 14 is connected to supply the resulting packets in its output signal to the modified trellis encoder 15 as the input signal thereto.

A synchronization multiplexer 17 is connected for receiving as the first of its two input signals the ⅔ trellis-coded data generated by the modified trellis encoder 15. The sync multiplexer 17 is connected for receiving its second input signal from a generator 18 of synchronization signals comprising the data segment sync (DSS) and the data field sync (DFS) signals. The DSS and DFS are time-division multiplexed with the ⅔ trellis-coded data per custom in the output signal from the sync multiplexer 17, which is supplied to a pilot inserter 19 as input signal thereto. The pilot inserter 19 introduces a direct-component offset into the signal for the purpose of generating a pilot carrier wave during subsequent balanced modulation of a suppressed intermediate-frequency (IF) carrier wave. The output signal from the pilot inserter 19 is a modulating signal, which optionally is passed through a pre-equalizer filter 20 before being supplied as input signal to an 8-VSB exciter 21 to modulate the suppressed IF carrier wave. The sync multiplexer 17, the generator 18 of synchronization signals, and the pilot inserter 19 (as well as the pre-equalizer filter 20, if used) comprise modulator apparatus. This modulator apparatus generates modulating signal for the subsequent radio-frequency-transmission apparatus. The 8-VSB exciter 21 is connected for supplying the suppressed IF carrier wave to a radio-frequency up-converter 22 to be converted upward in frequency to repose within the broadcast channel. The up-converter 22 also amplifies the power of the radio-frequency (RF) signal that it applies to the broadcast antenna 23.

Figure 2:
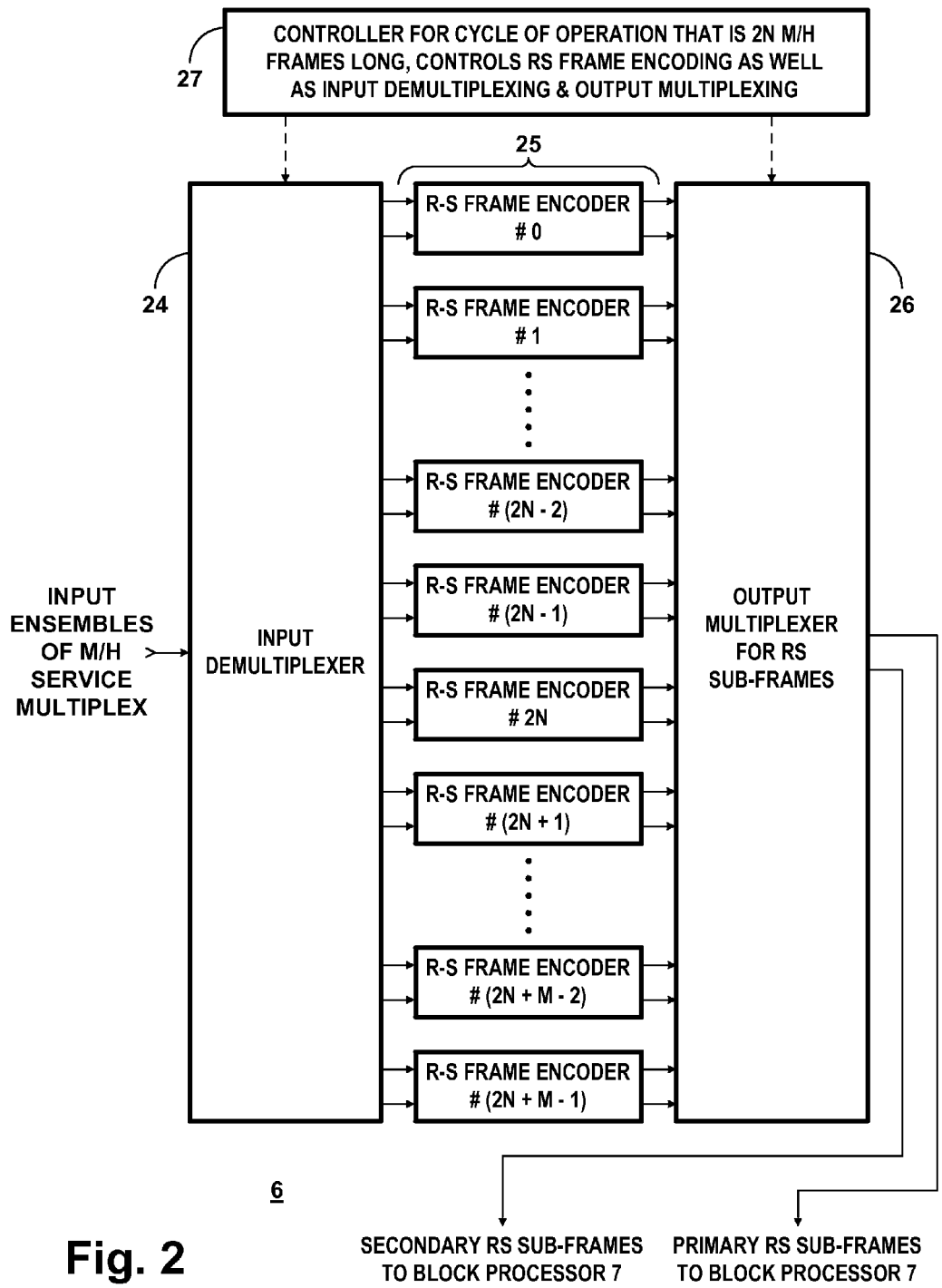
FIG. 2 is a detailed schematic diagram of the novel M/H Frame encoder in the FIG. 1 DTV transmitter apparatus.

FIG. 2 shows the novel M/H Frame encoder 6 of the FIG. 1 DTV transmitter apparatus in some detail. The FIG. 2 M/H Frame encoder 6 comprises elements similar to those in prior-art M/H Frame encoders. The Ensembles of M/H Service Multiplex data are applied as input signals to an input de-multiplexer 24. The input de-multiplexer 24 is further connected for distributing those M/H Ensembles to a set 25 of R-S Frame encoders, M in number, as their respective input signals. This distribution is controlled by a control signal that a controller 26 generates and supplies to the input de-multiplexer 24. An output multiplexer 27 for RS Sub-Frames is connected for time-division multiplexing Sub-Frame responses from the set 25 of R-S Frame encoders for application to the block processor 7. This time-division multiplexing is controlled by a control signal that the controller 26 generates and supplies to the output multiplexer 27.

The FIG. 2 M/H Frame encoder 6 differs from those previously used in that the controller 26 controls 2N M/H Frames of operation, N being an integer typically equal to ten, rather than just a single M/H Frame of operation. The FIG. 2 M/H Frame encoder 6 differs from those previously used in that the number of R-S Frame encoders in the set 25 is not limited to sixteen, but rather to 16N or so. Five successive Sub-Frames of an RS Frame are read from respective memory from each of the R-S Frame encoders # 0 through # (2N−1) in the set 25 not just once as in prior-art M/H operation, but rather twice for implementing iterative-diversity transmissions. Five successive Sub-Frames of an RS Frame are read from respective memory from each of the remaining R-S Frame encoders # 2N through # (2N+M−1) in the set 25 either once or, if there is another iterative-diversity transmission service, twice. Accordingly, the operation of the output multiplexer 27 differs from the operation of the output multiplexers used in prior-art M/H M/H Frame encoders. Generally, the output multiplexer 27 has greater multiplexing capability than the output multiplexer used in a prior-art M/H M/H Frame encoder. Furthermore, the operation of the input de-multiplexer 24 differs from the operation of the input de-multiplexers used in prior-art M/H M/H Frame encoders. Generally, the input de-multiplexer 24 has greater de-multiplexing capability than the input de-multiplexer used in a prior-art M/H M/H Frame encoder. The controller 26 is re-designed to generate the control signals that the input de-multiplexer 24 and the output multiplexer 27 require for their operations over a cycle 2N M/H Frames in duration, which operations include implementing iterative-diversity transmissions.

FIG. 3 shows in more detail the structure of a representative one of the R-S Frame encoders included in the set 25 of R-S Frame encoders. An M/H data randomizer 28 is connected for receiving as input signal thereto a primary Ensemble from the input multiplexer 24 of the M/H Frame encoder 6. The M/H data randomizer 28 is further connected for supplying its response to an 8-bit byte former 29 which forms 8-bit bytes of randomized M/H data to be written into rows of byte-storage locations in a byte-organized random-access memory 30. Thereafter, the byte-storage locations in the RAM 30 are read one partial column at a time to an encoder 31 for transversal Reed-Solomon coding which generates parity bytes to write the remaining byte-storage locations in the column. This completes the primary RS Frame stored within the RAM 30 and successive rows of its byte-storage locations are subsequently read to provide input signal for a cyclic-redundancy-check encoder 32. The response of the CRC encoder 32 reproduces the successive bytes read from the RAM 30, breaking up the succession of bytes into shorter sequences of a prescribed number of bytes, and appending a respective 2-byte checksum to each shorter sequence of a prescribed number of bytes. The response of the CRC encoder 32 is supplied to the output multiplexer 26 of the M/H Frame encoder 6.

An M/H data randomizer 33 is connected for receiving as input signal thereto a secondary Ensemble from the input multiplexer 24 of the M/H Frame encoder 6. The M/H data randomizer 33 is further connected for supplying its response to an 8-bit byte former 34 which forms 8-bit bytes of randomized M/H data to be written into rows of byte-storage locations in a byte-organized random-access memory 35. Thereafter, the byte-storage locations in the RAM 35 are read one partial column at a time to an encoder 36 for transversal Reed-Solomon coding which generates parity bytes to write the remaining byte-storage locations in the column. This completes the secondary RS Frame stored within the RAM 35 and successive rows of its byte-storage locations are subsequently read to provide input signal for a cyclic-redundancy-check encoder 37. The response of the CRC encoder 37 reproduces the successive bytes read from the RAM 35, breaking up the succession of bytes into shorter sequences of a prescribed number of bytes, and appending a respective 2-byte checksum to each shorter sequence of a prescribed number of bytes. The response of the CRC encoder 37 is supplied to the output multiplexer 26 of the M/H Frame encoder 6.

A respective 2-byte CRC checksum is inserted after each row of bytes in the primary RS Frame read from the RAM 30, supposing the M/H transmission complies with A/153. A respective 2-byte CRC checksum ise inserted after each row of bytes in the secondary RS Frame read from the RAM 35, supposing the M/H transmission complies with A/153. A fundamental question is whether this periodicity of CRC checksum is frequent enough to supply enough multiple external code error checks to lower the error floor for PCCC using methodology similar to that described in published U. S. Patent Application Ser. No. 2001-0025358. If (235, 187) transversal R-S coding is used, there will be 235 rows of bytes in each RS Frame, 235/5 =47 rows per each of the five M/H sub-Frames. The 47 CRC checksums at the ends of rows will be split up amongst the number of Groups (NoG) in the M/H sub-Frame, which can be as large as eight. If the outer convolutional code halves the code rate, there are 9624 SCCC payload bytes per Group. There are 76,992 bytes in eight M/H Groups, which divided by 47 means CRC codewords as defined in A/153 can consist of as many as 1638 bytes. In an M/H receiver turbo decoding a Group could be considered to occur in at least six successive parts to reduce problems with error floor.

Even if CRC checksums at the ends of rows of bytes in the RS Frames are frequent enough to be effective to lower the error floor for PCCC, there is the additional problem of whether those CRC checksums are timed so that they are reasonably convenient to utilize in turbo decoding procedures performed on a Group-by-Group basis. If the number of columns in an RS Frame is a multiple M of NoG, appending a 2-bit CRC checksum to each of the M aliquot portions of the rows will apportion the CRC checksums evenly amongst the Groups. The CRC codewords will be the same length no matter what the NoG is. By way of example, suppose that each RS Frame had 2-byte CRC checksums for every 202 bytes of half-rate outer convolutional coding. An RS Frame for NoG of eight would have 1616 columns of bytes, and CRC codewords would be 1632 bytes long. Payload would be reduced by a factor of 1636/1616=1.0124. The percentage loss in payload would be (1636-1616)/1636=1.22%. Turbo decoding of each M/H Group could be considered to occur in 47 successive parts to reduce problems with error floor.

FIG. 3 includes a legend to indicate that the CRC coding in the CRC encoder 38 inserts into each row of bytes read from the RAM 36 for the primary RS Frame a respective checksum for each Group per M/H sub-Frame. The same legend is included to indicate further that the CRC coding in the CRC encoder 43 inserts into each row of bytes read from the RAM 41 for the secondary RS Frame a respective checksum for each Group per M/H sub-Frame. The respective final checksum that the CRC encoder 38 appends to each row of bytes of the primary RS Frame read from the RAM 36 does not necessarily correspond to that prescribed by A/153. The respective final checksum that the CRC encoder 38 appends to each row of bytes can relate to only a concluding portion of that row of bytes, rather than the entire row of bytes. The respective final checksum that the CRC encoder 43 appends to each row of bytes of the secondary RS Frame read from the RAM 41 does not necessarily correspond to that prescribed by A/153 either. The respective final checksum that the CRC encoder 41 appends to each row of bytes can relate to only a concluding portion of that row of bytes, rather than the entire row of bytes.

FIG. 4 shows the bit order in the one-half-rate convolutional coding generated in the block processor 7 responsive to a byte of data composed of successive bits $D_1, D_2, D_3, D_4, D_5, D_6, D_7$ and $D_8$ of data, when M/H data are transmitted using one-third-rate SCCC per A/153. The parity bits $P_1, P_2, P_3, P_4, P_5, P_6, P_7$ and $P_8$ succeed respective ones of the data bits $D_1, D_2, D_3, D_4, D_5, D_6, D_7$ and $D_8$ in the one-half-rate outer convolutional coding.

FIG. 5 shows the bit order in the one-half-rate convolutional coding generated in the block processor 7 responsive to a byte of data composed of successive bits $D_1, D_2, D_3, D_4, D_5,$ $D_6, D_7$ and $D_8$ of data, when M/H data are transmitted using one-third-rate PCCC, rather than the one-third-rate SCCC prescribed by A/153. The parity bits $P_1, P_2, P_3, P_4, P_5, P_6, P_7$ and $P_8$ precede respective ones of the data bits $D_1, D_2, D_3, D_4, D_5, D_6, D_7$ and $D_8$ in the responses of the encoders 42 and 44. This reverses the order of data bit and parity bit in the symbols of outer-coded M/H data that are subsequently supplied to the modified trellis encoder 14 shown in FIG. 1. This reversal causes the parity bits of the outer convolutional coding to be independent of the parity bits of the inner convolutional coding generated by the modified trellis encoder 14.

Figure 6:
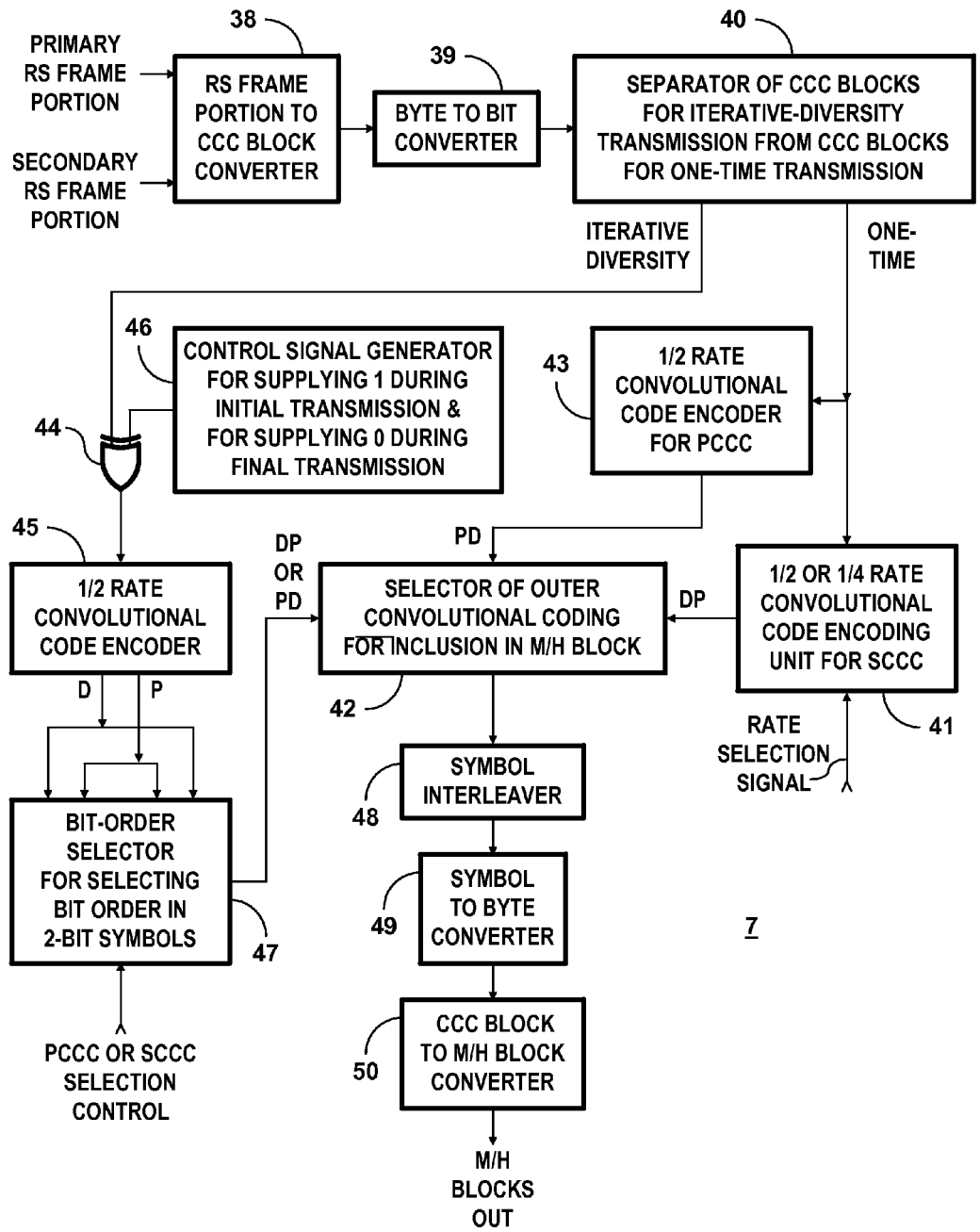
FIG. 6 is a detailed schematic diagram of the novel block processor in the FIG. 1 DTV transmitter apparatus.

FIG. 6 is a detailed schematic diagram of the novel block processor 7 in the FIG. 1 DTV transmitter apparatus. A byte-organized random-access memory is operated as an RS Frame Portion to CCC Block converter 38 in the block processor 7. Bytes from a portion of a primary RS Frame and possibly bytes from a secondary RS Frame are written into this RAM, which is subsequently read for organizing either single M/H Blocks or pairs of M/H Blocks into respective CCC Blocks that are supplied to a byte-to-bit converter 39. The byte-to-bit converter 39 is connected for supplying its bitstream response to a separator 40 for separating CCC Blocks to be transmitted only once from those CCC Blocks to be transmitted twice to implement iterative diversity.

An encoding unit 41 for the ½ or ¼ rate convolutional coding used in SCCC transmissions per A/153 is connected for receiving from the separator 40 those RS Frame portions to be transmitted only once. The coding rate of the outer convolutional coding performed by the encoding unit 41 is selected in response to a rate selection signal supplied thereto. The encoding unit 41 generates 2-bit symbols, each with the data bit before the parity bit as shown in FIG. 4. The output port of the encoding unit 41 is connected for supplying the outer convolutional coding generated by the encoding unit 41 to a first input port of a selector 42 for possible selection for inclusion in an M/H Block.

An encoder 43 for half-rate convolutional coding is also connected for receiving the RS Frame portions separated for transmission by the separator 40 for transmission just once. The encoder 43 generates 2-bit symbols, each with the parity bit preceding the data bit as shown in FIG. 5. The output port of the encoder 43 is connected for supplying the outer convolutional coding generated by the encoder 43 to a second input port of the selector 42 for possible selection for inclusion in an M/H Block.

A desirable feature of a concatenated convolutional code (CCC) is for its additional set of parity bits to be dispersed differently in time than the original set of parity bits, so there is time diversity between the two sets of parity bits. When the two sets of parity bits are substantially contemporaneous, this is achieved by using different time-interleaving of the two sets of parity bits. In iterative-diversity transmissions, the time diversity between a set of parity bits in the initial transmission and a set of parity bits in the final transmission a few seconds later in time occurs as a matter of course. So, there is no need to time-interleave the set of parity bits in the initial transmission and the set of parity bits in the final transmission in order to achieve time diversity between them. In the particular form of iterative-diversity transmissions initiated by the M/H Frame encoder 6 and the block processor 7 the initially transmitted bitstream is ones' complementary to the finally transmitted bitstream. This iterative-diversity coding employs CCC that differs from CCC that is generally used in that the data bits are not transmitted just once, but twice.

An exclusive-OR gate 44 is connected for supplying its response to the input port of an encoder 45 for one-half-rate convolutional coding. One input port of the XOR gate 44 is connected for receiving from the separator 40 those RS Frame portions for iterative-diversity transmissions. The other input port of the XOR gate 43 is connected for receiving a control signal from a control signal generator 46. The control signal generator 46 generates a logic ONE control signal when an RS Frame portion separated for iterative-diversity transmission is to be transmitted an initial time. This ONE conditions the XOR gate 44 to ones' complement, in its own response that is applied as input signal to the encoder 45, the response of the byte-to-bit converter 39 selected for iterative-diversity transmission by the selector 40. The encoder 45 responds to the XOR gate 44 response by generating an initial set of parity bits for the initial-compent transmission of the complete iterative-diversity transmission. The control signal generator 46 generates a logic ZERO control signal when the RS Frame portion separated for iterative-diversity transmission is to be transmitted a final time. This ZERO conditions the XOR gate 44 to reproduce in its own response the response of the byte-to-bit converter 39 selected for iterative-diversity transmission by the selector 40. The encoder 44 responds to the XOR gate 44 response by generating a final set of parity bits for the final-compent transmission of the complete iterative-diversity transmission. This final set of parity bits differs from the initial set of parity bits for the iterative-diversity transmission.

If there are portions of the response of the byte-to-bit converter 39 that are only sparsely populated by ONEs, the convolutional coding generated by the encoder 45 will also be sparsely populated by ONEs and consequently will be less powerful. Another desirable feature of a parallel concatenated convolutional code is for its additional set of parity bits to be densely populated by ONEs where the original set of parity bits is sparsely populated by ONEs. If there are portions of the response of the byte-to-bit converter 39 that are only sparsely populated by ONEs, ones' complemented response of the byte-to-bit converter 39 will be densely populated by ONEs. The additional set of parity bits that the encoder 45 generates in response to this denser population of ONEs will tend to be less under-populated by ONEs than the set generated in response to the non-complemented response of the byte-to-bit converter 39.

FIG. 6 shows bit-order selector 47 connected for receiving the 2-bit symbols that the encoder 45 generates and is operated for reproducing those 2-bit symbols with bit order selected by PCCC or SCCC selection control. FIG. 6 further shows the output port of the bit-order selector 47 connected for supplying the reproduced 2-bit symbols to a third input port of the third input port of the selector 42 for possible selection for inclusion in an M/H Block. FIG. 6 shows the output port of the encoder 45 connected for supplying each successive 2-bit symbol of its response data bit before parity bit to a first input port of the selector 47. The selector 47 reproduces the 2-bit symbol in this order when the PCCC or SCCC selection control selects SCCC for iterative-diversity transmissions. FIG. 6 shows the output port of the encoder 45 connected for supplying each successive 2-bit symbol of its response parity bit before data bit to a second input port of the selector 47. The selector 47 reproduces the 2-bit symbol in this order when the PCCC or SCCC selection control selects PCCC for iterative-diversity transmissions.

The selector 42 is operated for reproducing at its output port the bit symbols received at a selected one of its input ports, selection being made each for successive M/H Group. The output port of the selector 42 is connected for supplying the pairs of bit-interleaved data and parity bits of outer convolutional coding it selectively reproduces as input symbols to the input port of a symbol interleaver 48. The symbol interleaver 48 is connected for supplying the output symbols in its symbol-interleaved response to a symbol-to-byte converter 49 for conversion to 8-bit bytes for being written into a byte-organized random-access memory operated as an SCCC Block to M/H Block converter 50. M/H Blocks are subsequently read from this RAM to the Group formatter 8 shown in the FIG. 1 general schematic diagram.

The Group formatter 8 in the FIG. 1 DTV transmitter apparatus is operated for placing the initial and final transmissions of data for iterative-diversity reception into different sets of Slots within M/H Sub-Frames. The general principle for delaying the final transmissions from the corresponding initial transmissions is that the delay is always the same, being an integral number of M/H Sub-Frames plus or minus an odd integral number of Slots. This places the initial transmissions in even-numbered Slots and the final transmissions in odd-numbered Slots within M/H Sub-Frames, or vice versa. Such arrangements allow the Slot_number in the TPC signal to be used by receivers to distinguish M/H Groups conveying initial transmissions from M/H Groups conveying final transmissions. Slot allocations for facilitating iterative-diversity reception are made first, with leftover Slots then being allocated to other services. Delaying the final transmissions from the corresponding initial transmissions by an integral number of M/H Frames plus or minus one Slot interval facilitates the iterative-diversity transmissions being confined within a prescribed number of M/H Frames, which simplifies program scheduling. At the time the invention was made this integral number of M/H Frames was preferably ten, which provides for withstanding drop-outs in received signal strength that are almost a second in duration. Delay for a lesser number of M/H Frames may be a practical necessity until the cost of delay memory comes down over time. Delaying the final transmissions from the corresponding initial transmissions by just one Slot is an interesting degenerate case, since it facilitates transmission of data at a code rate one-quarter the 8VSB symbol rate, which transmission can be decoded by receivers using the same turbo decoding arrangements used for iterative-diversity reception. The delay memory requirement is modest, and the quarter-rate coding is strong.

FIG. 7 shows how Slots are allocated when the initial transmissions are followed by final transmissions of corresponding data after a delay equal to the duration of an integral number of M/H Sub-Frames plus one Slot. If the initial transmissions are just in Slot #0 of each M/H Sub-Frame, the final transmissions are just in Slot #1 of each M/H Sub-Frame. If the initial transmissions are only in Slots #0 and #4 of each M/H Sub-Frame, the final transmissions are only in Slots #1 and #5 of each M/H Sub-Frame. If the initial transmissions are only in Slots #0, #4 and #8 of each M/H Sub-Frame, the final transmissions are in Slots #1, #5 and #9 of each M/H Sub-Frame. If the initial transmissions are in Slots #0, #4, #8 and #12 of each M/H Sub-Frame, the final transmissions are in Slots #1, #5, #9 and #13 of each M/H Sub-Frame. If the initial transmissions are in Slots #0, #4, #8, #12 and #2 of each M/H Sub-Frame, the final transmissions are in Slots #1, #5, #9, #13 and #3 of each M/H Sub-Frame. If the initial transmissions are in Slots #0, #4, #8, #12, #2 and #6 of each M/H Sub-Frame, the final transmissions are in Slots #1, #5, #9, #13, #3 and #7 of each M/H Sub-Frame. If the initial transmissions are in Slots #0, #4, #8, #12, #2, #6 and #10 of each M/H Sub-Frame, the final transmissions are in Slots #1, #5, #9, #13, #3, #7 and #11 of each M/H Sub-Frame. If the initial transmissions are in Slots #0, #4, #8, #12, #2, #6, #10 and #14 of each M/H Sub-Frame, the final transmissions are in Slots #1, #5, #9, #13, #3, #7, #11 and #15 of each M/H Sub-Frame.

FIG. 8 shows how Slots are allocated when the final transmissions are delayed from the corresponding initial transmissions by an integral number of M/H Sub-Frames minus one Slot. This places the initial transmissions in odd-numbered Slots and the final transmissions in even-numbered Slots within M/H Sub-Frames, reversing the order from that shown in FIG. 7. If the final transmission is just in Slot #0 of each M/H Sub-Frame, the initial transmission is just in Slot #1 of each M/H Sub-Frame. If the final transmissions are only in Slots #0 and #4 of each M/H Sub-Frame, the initial transmissions are only in Slots #1 and #5 of each M/H Sub-Frame. If the final transmissions are only in Slots #0, #4 and #8 of each M/H Sub-Frame, the initial transmissions are in Slots #1, #5 and #9 of each M/H Sub-Frame. If the final transmissions are in Slots #0, #4, #8 and #12 of each M/H Sub-Frame, the initial transmissions are in Slots #1, #5, #9 and #13 of each M/H Sub-Frame. If the final transmissions are in Slots #0, #4, #8, #12 and #2 of each M/H Sub-Frame, the initial transmissions are in Slots #1, #5, #9, #13 and #3 of each M/H Sub-Frame. If the final transmissions are in Slots #0, #4, #8, #12, #2 and #6 of each M/H Sub-Frame, the initial transmissions are in Slots #1, #5, #9, #13, #3 and #7 of each M/H Sub-Frame. If the final transmissions are in Slots #0, #4, #8, #12, #2, #6 and #10 of each M/H Sub-Frame, the initial transmissions are in Slots #1, #5, #9, #13, #3, #7 and #11 of each M/H Sub-Frame. If the final transmissions are in Slots #0, #4, #8, #12, #2, #6, #10 and #14 of each M/H Sub-Frame, the initial transmissions are in Slots #1, #5, #9, #13, #3, #7, #11 and #15 of each M/H Sub-Frame.

Figure 9A:
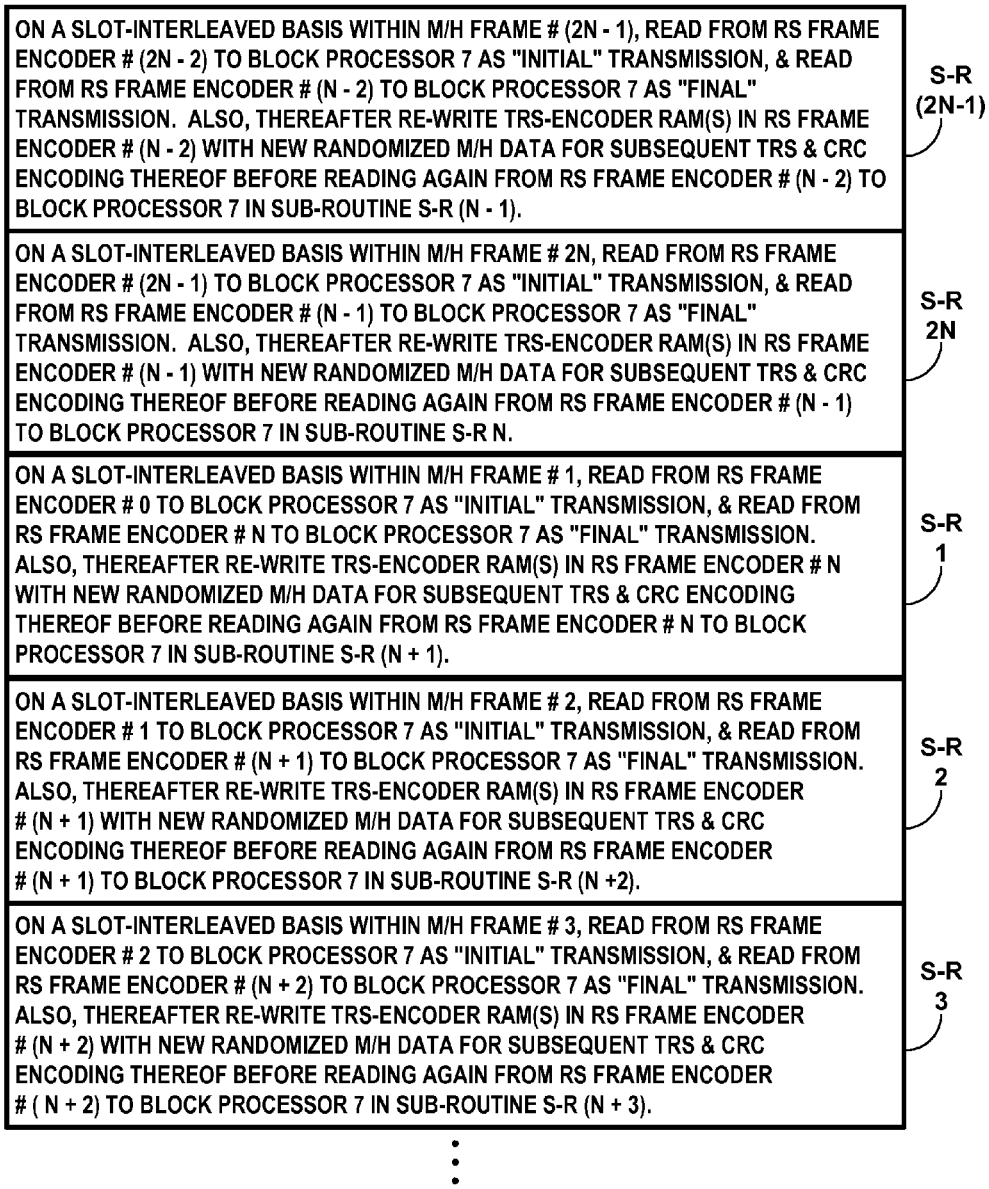

FIGS. 9A and 9B show selected portions of a flow diagram of the continuous, cyclical operation of a portion of the FIG. 2 M/H Frame encoder. The length of the cycle is presumed to be 2N M/H Frames, with N being an integer equal by way of example to five. Respective sub-routines S-R 1 through S-R 2N are performed in each of these 2N M/H Frame intervals within a cycle.

FIG. 9A shows the portion of the flow diagram extending over the final two M/H Frames of a concluding cycle and the initial three M/H Frames of the next-beginning cycle. In the penultimate sub-routine S-R (2N−1) of the concluding cycle, the TRS-CRC-encoded data for the primary RS Frame are read from the RS Frame encoder # (2N−2) to the block processor 7 as an initial transmission or portion thereof. Concurrently, the TRS-CRC-encoded data for the primary RS Frame are read from the RS Frame encoder # (N−2) to the block processor 7 as a final transmission or a portion thereof. If a secondary RS Frame is used, the TRS-CRC-encoded data for the secondary RS Frame are read from the RS Frame encoder # (2N−2) to the block processor 7 as a further portion of the initial transmission. Concurrently, the TRS-CRC-encoded data for the secondary RS Frame are read from the RS Frame encoder # (N−2) to the block processor 7 as a further portion of the final transmission. After the RAM in the RS Frame encoder # (2N−2) is read, it is re-written with new randomized M/H data. This is done early enough that TRS encoding can be completed before the sub-routine S-R (N−1) is next reached in the cycle.

In the final sub-routine S-R 2N of the concluding cycle, the TRS-CRC-encoded data for the primary RS Frame are read from the RS Frame encoder # (2N−1) to the block processor 7 as an initial transmission or portion thereof. Concurrently, the TRS-CRC-encoded data for the primary RS Frame are read from the RS Frame encoder # (N−1) to the block processor 7 as a final transmission or a portion thereof. If a secondary RS Frame is used, the TRS-CRC-encoded data for the secondary RS Frame are read from the RS Frame encoder # (2N−1) to the block processor 7 as a further portion of the initial transmission. Concurrently, the TRS-CRC-encoded data for the secondary RS Frame are read from the RS Frame encoder # (N−1) to the block processor 7 as a further portion of the final transmission. After the RAM in the RS Frame encoder # (2N−1) is read, it is re-written with new randomized M/H data. This is done early enough that TRS encoding can be completed before the sub-routine S-R N is next reached in the cycle.

In the initial sub-routine S-R 1 of the next-beginning cycle, the TRS-CRC-encoded data for the primary RS Frame are read from the RS Frame encoder # 0 to the block processor 7 as an initial transmission or portion thereof. Concurrently, the TRS-CRC-encoded data for the primary RS Frame are read from the RS Frame encoder # N to the block processor 7 as a final transmission or portion thereof. If a secondary RS Frame is used, the TRS-CRC-encoded data for the secondary RS Frame are read from the RS Frame encoder # 0 to the block processor 7 as a further portion of the initial transmission. Concurrently, the TRS-CRC-encoded data for the secondary RS Frame are read from the RS Frame encoder # N to the block processor 7 as a further portion of the final transmission. After the RAM in the RS Frame encoder # N is read, it is re-written with new randomized M/H data. This is done early enough that TRS encoding can be completed before the sub-routine S-R (N+1) is next reached in the cycle.

In the second sub-routine S-R 2 of the next-beginning cycle, the TRS-CRC-encoded data for the primary RS Frame are read from the RS Frame encoder # 1 to the block processor 7 as an initial transmission or portion thereof. Concurrently, the TRS-CRC-encoded data for the primary RS Frame are read from the RS Frame encoder # (N+1) to the block processor 7 as a final transmission or portion thereof. If a secondary RS Frame is used, the TRS-CRC-encoded data for the secondary RS Frame are read from the RS Frame encoder # (M+1) to the block processor 7 as a further portion of the initial transmission. Concurrently, the TRS-CRC-encoded data for the secondary RS Frame are read from the RS Frame encoder # (N+1) to the block processor 7 as a further portion of the final transmission. After the RAM in the RS Frame encoder # (N+1) is read, it is re-written with new randomized M/H data. This is done early enough that TRS encoding can be completed before the sub-routine S-R (N+2) is next reached in the cycle.

In the third sub-routine S-R 3 of the next-beginning cycle, the TRS-CRC-encoded data for the primary RS Frame are read from the RS Frame encoder # 2 to the block processor 7 as an initial transmission or portion thereof. Concurrently, the TRS-CRC-encoded data for the primary RS Frame are read from the RS Frame encoder # (N+2) to the block processor 7 as a final transmission or portion thereof. If a secondary RS Frame is used, the TRS-CRC-encoded data for the secondary RS Frame are read from the RS Frame encoder # 2 to the block processor 7 as a further portion of the initial transmission. Concurrently, the TRS-CRC-encoded data for the secondary RS Frame are read from the RS Frame encoder # (N+2) to the block processor 7 as a further portion of the final transmission. After the RAM in the RS Frame encoder # (N+2) is read, it is re-written with new randomized M/H data. This is done early enough that TRS encoding can be completed before the sub-routine S-R (N+3) is next reached in the cycle. After the sub-routine S-R 3 cyclical operation continues until the sub-routine S-R (N−2) shown in FIG. 9B is reached.

FIG. 9B shows the portion of the flow diagram extending over the middle M/H Frames of a cycle. In a sub-routine S-R (N−2) of the cycle, the TRS-CRC-encoded data for the primary RS Frame are read from the RS Frame encoder # (N−3) to the block processor 7 as an initial transmission or portion thereof. Concurrently, the TRS-CRC-encoded data for the primary RS Frame are read from the RS Frame encoder #

(2N−3) to the block processor 7 as a final transmission or a portion thereof. If a secondary RS Frame is used, the TRS-CRC-encoded data for the secondary RS Frame are read from the RS Frame encoder # (N−3) to the block processor 7 as a further portion of the initial transmission. Concurrently, the TRS-CRC-encoded data for the secondary RS Frame are read from the RS Frame encoder # (2N−3) to the block processor 7 as a further portion of the final transmission. After the RAM in the RS Frame encoder # (2N−3) is read, it is re-written with new randomized M/H data. This is done early enough that TRS encoding can be completed before the sub-routine S-R (2N−2) is next reached in the cycle.

In the next sub-routine S-R (N−1) of the cycle, the TRS-CRC-encoded data for the primary RS Frame are read from the RS Frame encoder # (N−2) to the block processor 7 as an initial transmission or portion thereof. Concurrently, the TRS-CRC-encoded data for the primary RS Frame are read from the RS Frame encoder # (2N−2) to the block processor 7 as an initial transmission or a portion thereof. If a secondary RS Frame is used, the TRS-CRC-encoded data for the secondary RS Frame are read from the RS Frame encoder # (N−2) to the block processor 7 as a further portion of the initial transmission. Concurrently, the TRS-CRC-encoded data for the secondary RS Frame are read from the RS Frame encoder # (2N−2) to the block processor 7 as a further portion of the initial transmission. After the RAM in the RS Frame encoder # (2N−2) is read, it is re-written with new randomized M/H data. This is done early enough that TRS encoding can be completed before the sub-routine S-R (2N−1) is next reached in the cycle.

In the next sub-routine S-R N of the cycle, the TRS-CRC-encoded data for the primary RS Frame are read from the RS Frame encoder # (N−1) to the block processor 7 as an initial transmission or portion thereof. Concurrently, the TRS-CRC-encoded data for the primary RS Frame are read from the RS Frame encoder # (2N−1) to the block processor 7 as a final transmission or portion thereof. If a secondary RS Frame is used, the TRS-CRC-encoded data for the secondary RS Frame are read from the RS Frame encoder # (M+N−1) to the block processor 7 as a further portion of the initial transmission. Concurrently, the TRS-CRC-encoded data for the secondary RS Frame are read from the RS Frame encoder # (2N−1) to the block processor 7 as a further portion of the final transmission. After the RAM in the RS Frame encoder # (2N−1) is read, it is re-written with new randomized M/H data. This is done early enough that TRS encoding can be completed before the sub-routine S-R 2N is next reached in the cycle.

In the next sub-routine S-R (N+1) of the cycle, the TRS-CRC-encoded data for the primary RS Frame are read from the RS Frame encoder # (M+N) to the block processor 7 as an initial transmission or portion thereof. Concurrently, the TRS-CRC-encoded data for the primary RS Frame are read from the RS Frame encoder # M to the block processor 7 as a final transmission or portion thereof. If a secondary RS Frame is used, the TRS-CRC-encoded data for the secondary RS Frame are read from the RS Frame encoder # (M+N) to the block processor 7 as a further portion of the initial transmission. Concurrently, the TRS-CRC-encoded data for the secondary RS Frame are read from the RS Frame encoder # M to the block processor 7 as a further portion of the final transmission. After the RAM in the RS Frame encoder # 2N is read, it is re-written with new randomized M/H data. This is done early enough that TRS encoding can be completed before the sub-routine S-R (2N+1) is next reached in the cycle.

In the next sub-routine S-R (N+2) of the cycle, the TRS-CRC-encoded data for the primary RS Frame are read from the RS Frame encoder # (N+1) to the block processor 7 as an initial transmission or portion thereof. Concurrently, the TRS-CRC-encoded data for the primary RS Frame are read from the RS Frame encoder # (2N+1) to the block processor 7 as an initial transmission or portion thereof. If a secondary RS Frame is used, the TRS-CRC-encoded data for the secondary RS Frame are read from the RS Frame encoder # (N+1) to the block processor 7 as a further portion of the final transmission. Concurrently, the TRS-CRC-encoded data for the secondary RS Frame are read from the RS Frame encoder # (2N+1) to the block processor 7 as a further portion of the initial transmission. After the RAM in the RS Frame encoder # (2N+1) is read, the RAM is re-written with new randomized M/H data. This is done early enough that TRS encoding can be completed before the sub-routine S-R (2N+2) is next reached in the cycle. After the sub-routine S-R (N+2) cyclical operation continues until the sub-routine S-R (2N−1) shown in FIG. 9A is re-visited.

Figure 10:
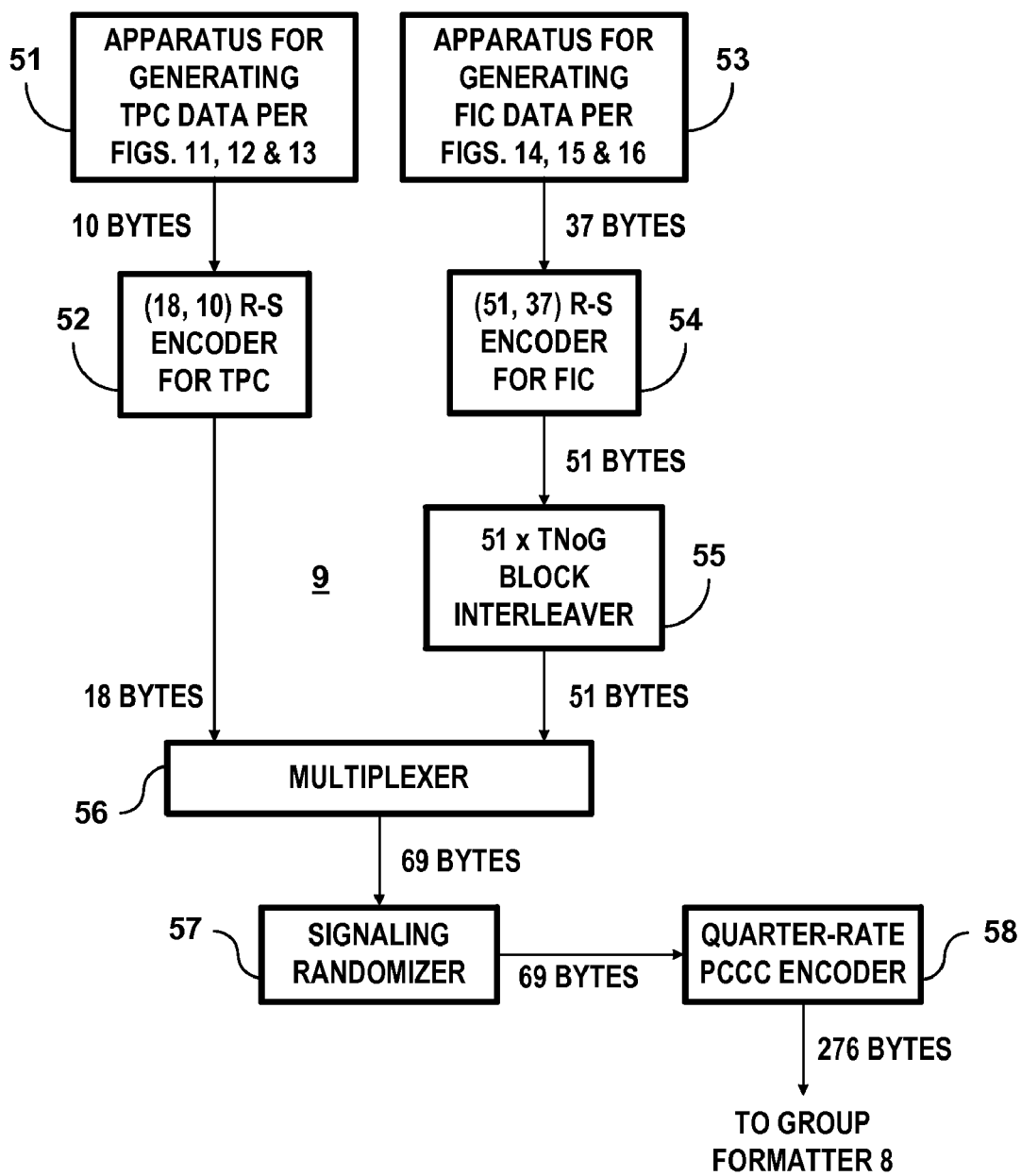
FIG. 10 is a schematic diagram of a representative embodiment of the novel signaling encoder in the FIG. 1 DTV transmitter apparatus.

FIG. 10 is a detailed schematic diagram of a representative embodiment of the signaling encoder 9 in the FIG. 1 DTV transmitter apparatus. Apparatus 51 for generating Transmission Parameter Channel (TPC)data using the bit syntax shown in FIGS. 11 and 12 is connected for supplying that TPC data to an encoder 52 for (18, 10) Reed-Solomon coding bytes of that TPC data. Apparatus 53 for generating Fast Information Channel (FIC) data using the bit syntax shown in FIGS. 13, 14 and 15 is connected for supplying that FIC data to an encoder 54 for (51, 37) Reed-Solomon coding FIC bits. The encoder 54 encodes thirty-seven bits per Group and is connected for supplying the resulting 51 bits of RS-coded FIC to a matrix-type block interleaver 55. A time-division multiplexer 56 is connected for supplying a response that interleaves 51 bytes of block interleaver 55 response as received at a first input port of the multiplexer 56 between each 18-byte RS codeword received from the encoder 52 at a second input of the multiplexer 56. The multiplexer 56 is connected for supplying its response to a signaling randomizer 57. The signaling randomizer 57 is connected for supplying its response as input signal to a quarter-rate PCCC encoder 58, which is in turn connected to supply the quarter-rate PCCC that it generates to the Group formatter 8. The apparatus 51 for generating TPC data using the bit syntax shown in FIGS. 12 and 13 differs from what is prescribed in A/153. The apparatus 53 for generating FIC data using the bit syntax shown in FIGS. 14, 15 and 16 differs from what is prescribed in A/153. The elements 52, 54. 55, 56, 57 and 58 correspond to those described in A/153.

Each of the FIGS. 11 and 12 is a table showing a preferred syntax of bits in the TPC data. The FIG. 11 table specifies the bit syntax for TPC signal transmitted in each M/H Group contained in the initial two Sub-Frames # 0 and # 1 of each M/H Frame. The FIG. 12 table specifies the bit syntax for TPC signal transmitted in each M/H Group contained in the final three Sub-Frames # 2, # 3 and # 4 of each M/H Frame. There are eighty bits in the TPC data transmitted with each Group, and in this specification they are referred to by number according to the order of their transmission within the Group. The bits 1-59 and 66-80 of the TPC bit syntax shown in the FIG. 11 and FIG. 12 tables have syntax similar to that specified in A/153.

In both the FIG. 11 and FIG. 12 tables the bits 1-3 specifying sub_Frame_number the bits 4-7 specifying Slot_number and the bits 8-14 specifying the Parade_ID always apply to the M/H Group being currently received, as well as to the corresponding M/H Group in the next M/H Frame in the Parade repetition cycle (PRC). The Parade_repetition_cycle_minus_one number appearing in bits 22-24 of the TPC bit syntax ranges from zero to seven. It applies to the M/H Group being currently received and signals the number of M/H Frames skipped over from one M/H Frame containing parts of a Parade to the next Frame containing parts of the Parade. The bits 41-45 specify FIC_version as a modulo-32 number that is the same as that for the corresponding M/H Group in the previous M/H Frame except when an FIC-Chunk in the current M/H Frame that describes the next M/H Frame differs from a previous FIC-Chunk of like $FIC_{13}$ chunk_major_protocol_version that described the current M/H Frame. The bits 44-47 specify Parade_continuity_counter count as a modulo-32 number that increments by one every M/H Frame in the Parade Repetition Cycle. (Specification of a zero count or a one count, rather than an expected consecutive count, can be used to signal the beginning of a new Parade.)

Decisions were made in the ATSC to use the last five bits of the TPC data to signal the version of that data that was being used. Bits 76 and 77 signal major changes in the TPC data used in the M/H Standard. These major changes cause the TPC data to be indecipherable to receivers designed for receiving transmissions made in accordance with earlier versions of the M/H Standard. Bits 78, 79 and 80 signal minor changes in the TPC data used in the M/H Standard. These minor changes leave parts of the TPC data decipherable to receivers designed for receiving transmissions made in accordance with earlier versions of the M/H Standard. In A/153 all the bits 78, 79 and 80 in TPC are ONEs, and each of them shall be rolled to ZERO when the first change in TPC version is adopted by the ATSC. In A/153 the bits 76 and 77 in TPC are both ONEs, and each of them shall be rolled to ZERO when the initial major change in TPC version is adopted by the ATSC.

In the FIG. 11 TPC syntax table, bits 15-18 specify the current_starting_Group_number, bits 19-21 specify the current_number_of Groups_minus_one, bits 25-40 describe forward-error-correction (FEC) coding for the M/H Frame that is currently received, and bits 50-54 specify the current-_TNoG. The current_starting_Group_number is the Slot number of the initial M/H Group beginning or resuming the Parade identified by bits 8-14 in each sub-frame of the M/H Frame that is currently received. The current_number_of_Groups_minus_one is one less than the number of M/H Groups assigned to the Parade identified by bits 8-14 in each sub-frame of the M/H Frame that is currently received. The current_TNoG specifies the total number of M/H Groups in each sub-frame of the M/H Frame that is currently received. The bits 55-59 are reserved. In the FIG. 12 TPC syntax table bits 15-18 specify the next_starting_Group_number, bits 19-21 specify the next-_number_of_Groups_minus_one, and bits 25 - 40 describe FEC coding for the M/H Frame to be received next. The bits 55-59 specify the current_starting_Group_number. The next_starting_Group_number is the Slot number of the initial M/H Group beginning or resuming the Parade identified by bits 8-14 in each sub-frame of the M/H Frame that will be received next. The next_number_of_Groups_minus_one is one less than the number of M/H Groups assigned to the Parade identified by bits 8-14 in each sub-frame of the M/H Frame that will be received next. The bits 15-18 specifying a starting Group number and the bits 25-40 prescribing forward-error-correction coding constitute "normally continuing" TPC information. This "normally continuing" TPC information not only stays the same for each Slot of the same number in the Sub-Frames of one M/H Frame, but also usually will be the same for each Slot of the same number in the Sub-Frames of the next M/H Frame in the PRC.

The FIG. 11 TPC syntax table shows bits 25 and 26 specifying current_RS_frame_mode, bits 27 and 28 specifying current_RS_code_mode_primary, and bits 29 and 30 specifying current_RS_code_mode_secondary, which corresponds to the prescription of A/153 for TPC bit syntax in M/H Sub-Frames #0 and #1. The FIG. 12 table shows bits 31 and 32 specifying current_CCC_block_mode, bits 33 and 34 specifying current_CCC_outer_code_mode_a, bits 35 and 36 specifying current_CCC_outer_code_mode_b, bits 37 and 38 specifying current_CCC_outer_code_mode_c, and bits 39 and 40 specifying current_CCC_outer_code_mode_d.

The FIG. 12 TPC syntax table shows bits 25 and 26 specifying next_RS_frame_mode, bits 27 and 28 specifying next_RS_code_mode_primary, and bits 29 and 30 specifying next_RS_code_mode_secondary, which corresponds to the prescription of A/153 for TPC bit syntax in M/H Sub-Frames #2, #3 and #4. The FIG. 13 table shows bits 31 and 32 specifying next_CCC_block_mode, bits 33 and 34 specifying next_CCC_outer_code_mode_a, bits 35 and 36 specifying next_CCC_outer_code_mode_b, bits 37 and 38 specifying next_CCC_outer_code_mode_c, and bits 39 and 40 specifying next_CCC_outer_code_mode_d. The specification of CCC coding conditions encompass PCCC coding conditions, as well as the SCCC coding conditions specified in A/153.

A/153 specifies the TPC bits 60-75 as being reserved, but the tables in FIGS. 11 and 12 show only bits 66-75 of this sequence of bits to be reserved. M/H signals may be transmitted using iterative diversity in which earlier and later transmissions of the same data are designed to be combined during turbo decoding procedures. When such transmissions are received by an M/H receiver capable of combining earlier and later transmissions of the same data during turbo decoding procedures, the M/H receiver needs to know whether the currently received Group belongs to the earlier transmission or to the later transmission. If the currently received Group belongs to the earlier transmission, it is diverted to a digital delay line. The digital delay line is usually implemented as a first-in/first-out memory and delays the earlier transmission so its turbo decoding takes place concurrently with the turbo decoding of the later transmission of the same data. The TPC bit syntax in A/153 does not specifically provide for signaling iterative-diversity transmissions.

The FIG. 11 and FIG. 12 TPC syntax tables each show the bits 60 and 61 being used as an iterative_diversity_mode datum. The iterative_diversity_mode being '11' signals that the Group is one not being iteratively transmitted. Other values of the iterative_diversity_mode datum signal whether the Group currently being received is an initial one or a final one of a pair of iteratively transmitted Groups. The following other values of the iterative_diversity_mode datum signals are suggested by way of example. The iterative_diversity_mode datum being '01' signals that the Group currently being received is an initial one of a pair of iteratively transmitted Groups designed for being combined during turbo decoding procedures. The iterative_diversity_mode datum being '10' signals that the Group currently being received is an initial one of a pair of iteratively transmitted Groups designed for their respective data being combined later on in the receiver using procedures that combine transport stream packets. The iterative_diversity_mode datum being '00' signals that the Group currently being received is a final one of a pair of iteratively transmitted Groups.

The FIG. 11 and FIG. 12 tables show the bits 62-64 specifying iterative_diversity_delay. The iterative_diversity_delay being '000' should signal that the delay is only the duration of one-half of an 8VSB data field. The following other values of iterative_diversity_delay are suggested by way of example. The iterative_diversity_delay being '001' signals that the delay is the duration of one-half of an 8VSB data field plus one M/H Sub-Frame. The iterative_diversity_delay being '010', '011', '100' and '101' signals that the delay is the duration of one-half of an 8VSB data field plus two, three, four and five M/H Sub-Frames, respectively. The iterative-_diversity_delay being '110' signals that the delay is the duration of one-half of an 8VSB data field plus six M/H Frames. The iterative_diversity_delay being '111' signals that the delay is the duration of one-half of an 8VSB data field plus twelve M/H Frames.

The FIG. 11 and FIG. 12 TPC syntax tables show the bit 65 being used to transmit a Z-sub-2_bits_in_M/H_data_pre-coded? datum. If the bit 65 is a '1', the FIG. 10 pre-coder is enabled for precoding for Z-sub-2 bits in M/H data, or another pre-coder pre-codes Z-sub-2 bits in M/H data. If the bit 65 is a '0', the FIG. 13 pre-coder is precluded from pre-coding Z-sub-2 bits in M/H data, or pre-coding of Z-sub-2 bits in M/H data is discontinued in some other way.

FIG. 13 is a table showing a preferred syntax of the pair of bits in the CCC_outer_code_mode for a M/H Frame that is either currently received or is next to be received. The FIG. 12 TPC syntax table includes a current_CCC_outer_code_mode for a M/H Frame that is being currently received, and the FIG. 13 TPC syntax table includes a next_CCC_outer_code_mode for a M/H Frame that is next to be received. The bit syntax specified by the FIG. 14 table is applicable both to current_C-CC_outer_code_mode and to next_CCC_outer_code_mode. A value of '00' signals that the outer convolutional coding has a code rate of ½ and its bit pairs are coded in the CCC block so as to give rise to SCCC response after ⅔ trellis coding. A value of '01' signals that the outer convolutional coding has a code rate of ¼ and its bit pairs are coded in the CCC block so as to give rise to SCCC response after ⅔ trellis coding. A value of '10' signals that the outer convolutional coding has a code rate of ½ and that its bit pairs are complemented before being coded in the CCC block so as to give rise to PCCC response after ⅔ trellis coding. A value of '11' signals that the outer convolutional coding has a code rate of ½ and that its bit pairs are not complemented before being coded in the CCC block so as to give rise to PCCC response after ⅔ trellis coding.

FIG. 14 is a table showing the syntax of the bits in the FIC-Chunk header as specified and described in detail in A/153. The 8-bit field num_ensembles in bits 33-40 of the FIC-Chunk header specifies the number of M/H Ensembles transmitted in the RF channel currently tuned to, including those Ensembles that have a Parade Repetition Count greater than zero and have no M/H Groups in the M/H Frame to which the FIC Chunk refers.

FIG. 15 is a table showing the syntax of the bits in the FIC-Chunk payload, which with two exceptions is as specified and described in detail in A/153. One exception is that the reserved third bit of the third byte of the respective payload for each Ensemble is replaced by a bit indicating whether or not the Ensemble provides the final_transmission_of_this_M/H_data. This bit is a ONE for an Ensemble that is part of a single-time tansmissionor that is in the final one of two component transmissions of a complete iterative-diversity transmission. This bit is a ZERO for an Ensemble that is in the initial one of two component transmissions of a complete iterative-diversity transmission. The other exception is that the reserved '11' state of the 2-bit field multi_ensemble_service is utilized in the signaling of iterative-diversity transmissions.

FIG. 16 is a table showing a preferred syntax of the pair of bits in the 2-bit field multi_ensemble_service. A value of '00' signals continues to indicate that this M/H Ensemble delivers all the IP streams forming this M/H Service. A value of '01' continues to indicate that this M/H Ensemble delivers only part of the IP streams forming this M/H Service, but delivers IP streams sufficient to support a portion of this M/H Service that is meaningful in and of itself. The value '01' will be associated with final-component transmission of a complete iterative-diversity transmission. A value of '10' continues to indicate that this M/H Ensemble delivers only part of the IP streams forming this M/H Service, but delivers IP streams insufficient to support a portion of this M/H Service that is meaningful in and of itself. A value of '11' indicates that this M/H Ensemble delivers complementary IP Streams to those forming this M/H Service, sent as an initial-component transmission of a complete iterative-diversity transmission.

Figure 17B:
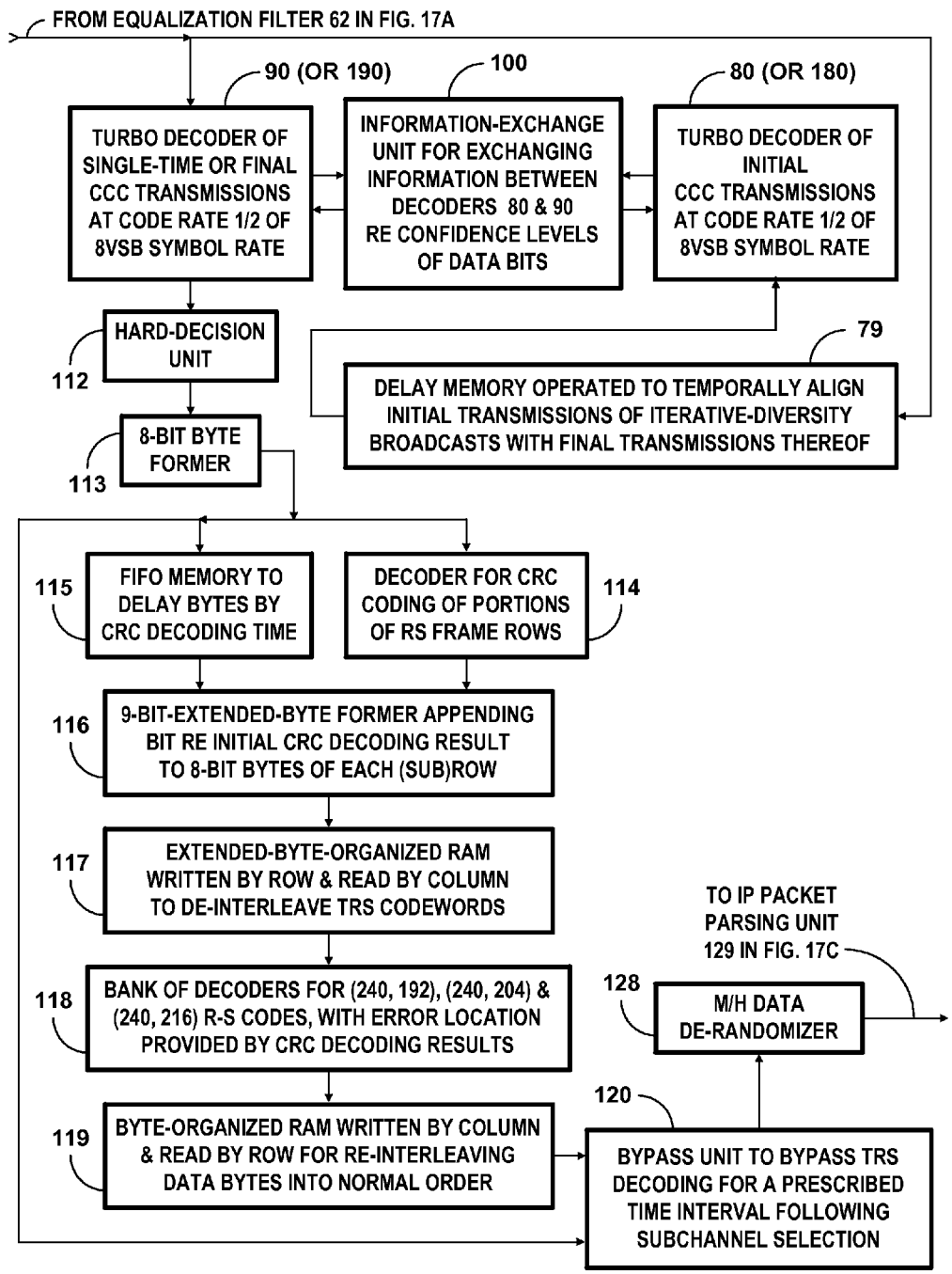
FIG. 17 is an assembly drawing that shows how FIGS. 17A, 17B and 17C combine to provide a schematic diagram of a receiver apparatus for receiving M/H transmissions sent over the air from the FIG. 1 DTV transmitter apparatus, which receiver apparatus is novel and embodies aspects of the invention.
Figure 17C:
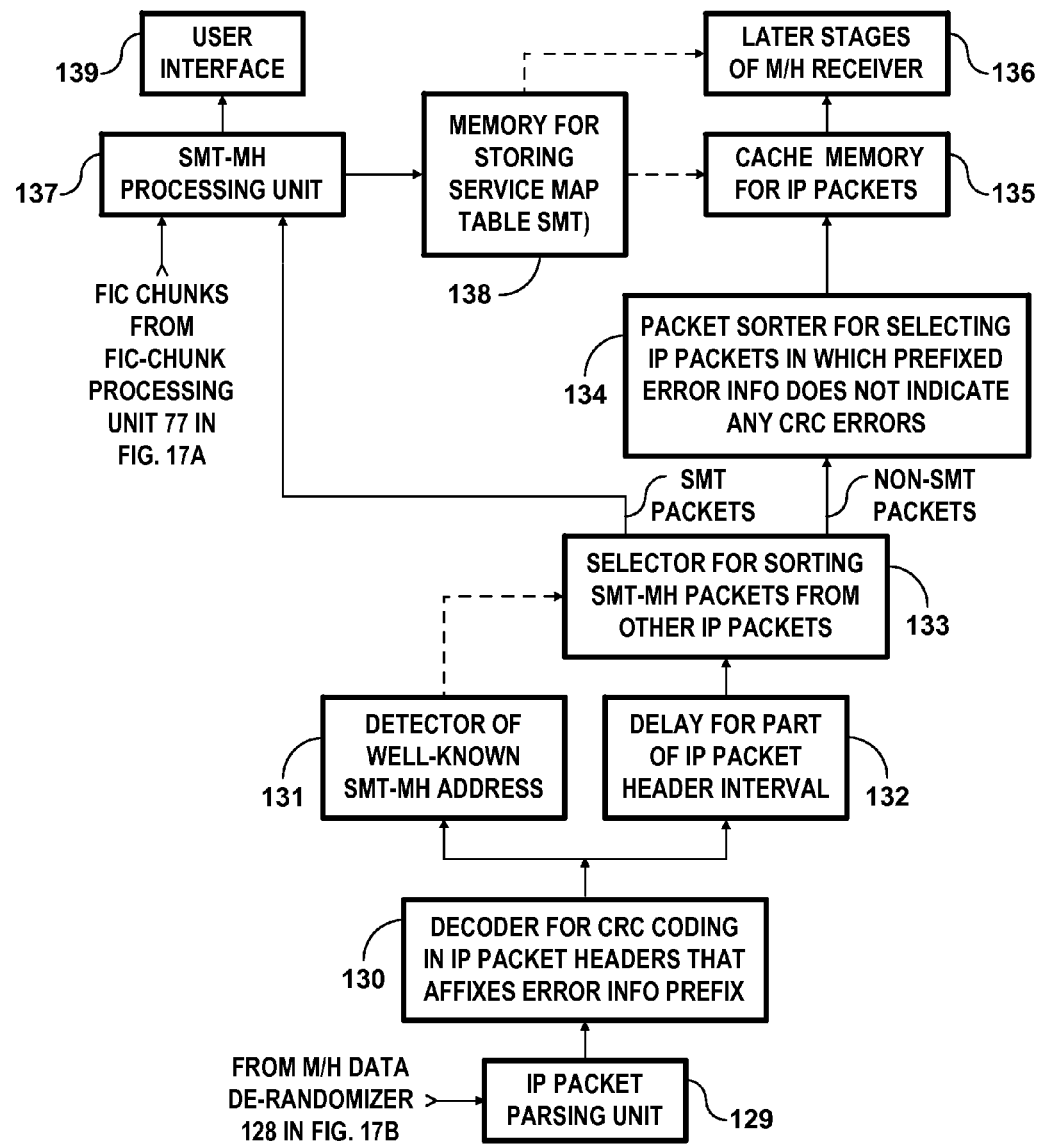

FIG. 17 is an assembly drawing that shows how FIGS. 17A, 17B and 17C combine to provide a detailed schematic diagram of a DTV receiver apparatus for receiving M/H transmissions sent over the air from the FIG. 1 DTV transmitter apparatus. The FIG. 17A portion of the DTV receiver apparatus includes a vestigial-sideband amplitude-modulation (VSB AM) DTV receiver front-end 59 for selecting a radio-frequency DTV signal for reception, converting the selected RF DTV signal to an intermediate-frequency DTV signal, and for amplifying the IF DTV signal. An analog-to-digital converter 60 is connected for digitizing the amplified IF DTV signal supplied from the DTV receiver front-end 59. A demodulator 61 is connected for demodulating the digitized VSB AM IF DTV signal to generate a digitized baseband DTV signal. The receiver front-end 59, the ADC converter 60, and the VSB AM demodulator 61 combine to provide conversion apparatus for receiving a selected 8VSB signal as transmitted in 8VSB modulation of a radio-frequency carrier wave within a respective frequency channel and converting it to digital samples of a baseband signal. (Equivalent circuitry that digitizes baseband signal after analog demodulation of VSB AM signal is used in alternative embodiments of the DTV receiver apparatus.) The VSB AM demodulator 61 is connected to supply digital samples of a baseband signal to digital filter 62 for equalization of channel response. Synchronization signals extraction circuitry 63 is connected for receiving the digital filter 62 response. Responsive to data-field-synchronization (DFS) signals, the sync extraction circuitry 63 detects the beginnings of data frames and fields. Responsive to data-segment-synchronization (DSS) signals, the sync extraction circuitry 63 detects the beginnings of data segments. The FIG. 17 DTV receiver apparatus uses the DSS and DFS signals for controlling its operations similarly to the way this is conventionally done in DTV receivers. None of FIGS. 17A, 17B and 17C explicitly shows the circuitry for effecting these operations.

A decoder 64 for detecting the type of ancillary transmission responds to 8-bit sequences contained in final portions of the reserved portions of DFS signals separated by the sync extraction circuitry 63. The decoder 64 is connected for indicating the type of ancillary transmission to a decoding control unit 65 that controls turbo decoding of CCC and plural-dimensional decoding of RS Frames in the FIG. 17 DTV receiver apparatus. The type of ancillary transmission that the decoder 64 detects may be one that conditions the decoder 64 to extract further information concerning the ancillary transmission from the initial portions of the reserved portions of DFS signals separated by the sync extraction circuitry 63. The decoder 64 is connected for supplying such further information to the decoding control unit 65. Most of the connections of the decoding control unit 65 to the elements involved in turbo decoding of CCC and in plural-dimensional decoding of RS Frames are not explicitly shown in FIGS. 17A, 17B and 17C, so as to keep those figures from being too cluttered to be understood readily.

FIG. 17A shows a 12-phase trellis decoder 110 connected for receiving the digital filtering 62 response. The 12-phase trellis decoder 110 is connected for supplying trellis-decoding results to a PCCC gate 66 connected for extracting the PCCC'd signaling within each Group and reproducing the PCCC'd signaling for application as input signal to a decoder 67 for quarter-rate PCCC. The decoder 67 reproduces randomized signaling decoded (possibly with some errors) from the quarter-rate PCCC supplied thereto and is connected for supplying that randomized signaling as input signal to a signaling de-randomizer 68. The signaling de-randomizer 68 is connected for supplying de-randomized signaling to an 8-bit byte former 69. A TPC code gate 70 is connected for extracting bytes of TPC code from bytes of the de-randomized signaling supplied by the byte former 69 and supplying those extracted bytes of TPC code as input signal to a decoder 71 for (18, 10) Reed-Solomon coding. The decoder 71 recovers TPC information and is connected for supplying the TPC information to the decoding control unit 65 and to other elements of the receiver apparatus. The decoding control unit 65 is able to respond to the TPC information to control selection of the type of outer convolutional decoding to be used on CCC portions of each M/H Group.

FIG. 17A shows an FIC code gate 72 connected for extracting byte-interleaved FIC code bytes from the bytes of de-randomized signaling supplied by the byte former 69 and reproducing those extracted bytes for application as input signal to a block de-interleaver 73. The block de-interleaver 73 is of matrix type and complements the block interleaving done by the block interleaver 55 described supra with reference to FIG. 10. In this specification (over)writing refers both to memory writing procedures in which storage locations are empty of content when written by new content and to memory writing procedures in which storage locations have their original contents overwritten by new content. The block de-interleaver 73 is essentially a byte-organized random access memory (RAM) with byte-storage locations arrayed in rows and columns to be (over)written and read in accordance with addressing and read/write control signals supplied from a block de-interleaver memory read/write control unit 74. The byte-storage locations are arrayed in 51-byte rows for being (over)written by R-S coded FIC data from respective Groups within each M/H subFrame. The memory read/write control unit 74 needs to know the total number of Groups, TNoG, within each M/H subFrame in order to know the number of these 51-byte rows. The memory read/write control unit 74 uses this knowledge to control the addressing of successive columns of TNoG byte-storage locations when writing to them. An extractor 75 is connected to extract TNoG for the current M/H subFrame (current_TNoG) from the response of the decoder 71 of the (18, 10) Reed-Solomon coded TPC data. The value of current_TNoG appears NoG times in the TPC data recovered by the decoder 71 from the previous M/H Sub-Frame. The extractor 75 selects from the TPC data those bit sequences descriptive of current_TNoG estimates and decides the value of current_TNoG based on the majority of concurring estimates. The extractor 75 is connected to supply that value of current_TNoG to the memory read/write control unit 74.

After the final Group of each M/H subFrame concludes, the memory read/write control unit 74 generates read addresses for reading rows of 35×TNoG bytes from the RAM in the block de-interleaver 73. The reading is completed before the initial Group of the next M/H Sub-Frame begins and the contents of the memory in the block de-interleaver 73 will be overwritten. The block de-interleaver 73 is connected for supplying its de-interleaved FIC code response as input signal to a decoder 76 for (51, 37) Reed-Solomon coding. The decoder 76 recovers FIC information and is connected for supplying that FIC information to an FIC processing unit 77 together with a respective FIC Transport Error Indication (TEI) bit concerning each (51, 37) Reed-Solomon codeword. The FIC TEI bit generated by the decoder 76 is a ONE whenever byte error(s) that cannot be corrected are detected within a (51, 37) Reed-Solomon codeword, but is a ZERO if such byte error(s) are not detected. An FIC TEI bit is likely to be generated if there is a momentary fade in received radio-frequency signal strength, for example.

An extractor 78 extracts the current M/H Sub-Frame number from the response of the decoder 71 of the (18, 10) Reed-Solomon coded TPC data and supplies that M/H Sub-Frame number to the FIC-Chunk processing unit 77. The current M/H subFrame number appears NoG times in the TPC data recovered by the decoder 71 from the current M/H Sub-Frame. The extractor 78 selects from the TPC data those bit sequences descriptive of current M/H subFrame number estimates and decides the value of current M/H Sub-Frame number based on the majority of concurring estimates. The current M/H Sub-Frame number aids the FIC-Chunk processing unit 77 in its parsing of FIC Chunks, particularly the extended FIC Chunks, that the decoder 76 for (51, 37) Reed-Solomon coding supplies. The FIC-Chunk processing unit 77 is connected for supplying processed FIC Chunks to the decoding control unit 65. (FIG. 17A shows processed FIC Chunks from the FIC-Chunk processing unit 77 being supplied to an SMT-MH processing unit 137 shown in FIG. 17C, there to be integrated with SMT-MH information during the generation of Service Map Data written to a memory 138 for temporary storage therewithin.)

FIG. 17B shows a generic construction of the turbo decoding circuitry for iterative-diversity reception of CCC transmissions made at one-half the code rate of the ⅔ trellis coding of ordinary VSB. The fundamental approach that the FIG. 17B turbo decoding circuitry uses for iterative-diversity reception is to delay the initial transmissions so that they can be decoded contemporaneously with the final transmissions. This facilitates the exchange of information between the decoding apparatus for initial transmissions and the decoding apparatus for final transmissions. First-in/first-out delay memory 79 is written with the initial component transmissions of iteratively-transmitted CCC that appear in the response of the digital filter 62 for channel equalization. Each of these initial component transmissions is temporarily stored in the FIFO delay memory 79 until the corresponding final component transmission of the same CCC appears in the response of the digital filter 62.

Paired turbo decoders 80 and 90 are used for decoding iteratively-transmitted PCCC sent at a code rate one-half the 8-VSB symbol rate. Each initial transmission of data as delayed to be concurrent with the final transmission of the same data is read from the FIFO delay memory 79 to provide input signal to the decoder 80 for the initial-component transmissions of PCCC. The corresponding final component transmission of that data in the response of the digital filter 62 is contemporaneously applied as input signal to the turbo decoder 90 of the final-component transmissions of PCCC sent at a code rate one-half the 8-VSB symbol rate. The turbo decoders 80 and 90 are similar in the way their respective turbo loops are constructed, and those decoders decode the initial and final component transmissions of an iterative-diversity transmission contemporaneously. An information-exchange unit 100 is connected for exchanging information between the turbo decoding loops when the initial and final component transmissions of an iterative-diversity transmission are being decoded. The exchanged information relates to the respective confidence levels the turbo decoders 80 and 90 determine for each data bit. The information-exchange unit 100 couples the turbo decoders 80 and 90 together for detecting iterative transmissions that combine to provide a powerful PCCC transmission made at one-quarter the code rate of the ⅔ trellis coding of ordinary VSB. When PCCC'd M/H data are sent a single time, rather than twice for implementing iterative-diversity transmission, the decoder 80 is inactivated and the decoder 90 decodes the single-time transmissions of PCCC'd M/H data.

Alternatively, paired turbo decoders 180 and 190 are used for decoding iteratively-transmitted SCCC sent at a code rate one-half the 8-VSB symbol rate. Each initial transmission of data as delayed to be concurrent with the final transmission of the same data is read from the FIFO delay memory 79 to provide input signal to the decoder 180 for the initial-component transmissions of SCCC. The corresponding final component transmission of that data in the response of the digital filter 62 is contemporaneously applied as input signal to a turbo decoder 190 of the final-component transmissions of SCCC sent at a code rate one-half the 8-VSB symbol rate. The turbo decoders 180 and 190 are similar in the way their respective turbo loops are constructed, and those decoders decode the initial and final component transmissions of an iterative-diversity transmission contemporaneously. The information-exchange unit 100 is connected for exchanging information between the turbo decoding loops when the initial and final component transmissions of an iterative-diversity transmission are being decoded. The exchanged information relates to the respective confidence levels the turbo decoders 180 and 190 determine for each data bit. The information-exchange unit 100 couples the turbo decoders 180 and 190 together for detecting iterative transmissions that combine to provide a powerful SCCC transmission made at one-quarter the code rate of the ⅔ trellis coding of ordinary VSB. When SCCC'd M/H data are sent a single time, rather than twice for implementing iterative-diversity transmission, the decoder 180 is inactivated and the decoder 190 decodes the single-time transmissions of SCCC'd M/H data.

A hard-decision unit 112 has an input port connected for receiving soft data bits from the output port of the turbo decoder 90 or 190. The hard-decision unit 112 has an output port connected for supplying an 8-bit-byte former 113 with hard decisions generated with respect to the soft data bits. In its response the 8-bit-byte former 113 forms the hard-decision bits received from the hard-decision unit 112 into eight-bit bytes.

Portions of the rows of these 8-bit bytes that will be used for reproducing RS Frames are supplied to a decoder 114 for cyclic-redundancy-check (CRC) coding and to a byte-organized first-in, first-out memory 115. Each row of bytes in the RS Frame is divided into NoG portions that this specification refers to as "sub-rows". At the conclusion of each sub-row of 8-bit bytes the decoder 114 generates a bit indicating whether or not it found that sub-row probably to contain error. The FIFO memory 115 reproduces each sub-row of 8-bit bytes it receives as delayed by a sub-row interval and supplies those 8-bit bytes to a nine-bit-extended-byte former 116. The extended-byte former 116 appends to each of the 8-bit bytes the bit indicating whether or not the decoder 114 found the row probably to contain error.

Successive sub-rows of the resulting 9-bit extended bytes are written row after row into respective rows of extended-byte storage locations in a random-access memory 117 operated to perform the matrix-type block de-interleaving procedure that is a first step of the TRS decoding routine. The RAM 117 is subsequently read one column of 9-bit extended bytes at a time to a selected one of a bank 118 of decoders for (240, 192), (240, 204) and (240, 216) Reed-Solomon codes, respectively. The appropriate decoder is selected by the decoding control unit 81 responsive to information extracted from the TPC. The extension bits accompanying the 8-bit bytes of the TRS code are used to help locate byte errors for the TRS code. This permits the use of a Reed-Solomon algorithm capable of correcting more byte errors than an algorithm that must locate byte errors as well as correct them. The 8-bit data bytes that have been corrected insofar as possible by the selected one of the RS decoders in the bank 118 of them are written, column by column, into respective columns of byte-storage locations of a random-access memory 119. The RAM 119 is operated to perform the matrix-type block re-interleaving procedure for data in further steps of the TRS decoding routine. In a final step of the TRS decoding routine, the byte-storage locations in the RAM 119 are read from row by row to circuitry 120, which is used to by-pass TRS decoding for a prescribed time interval after subchannel selection. During that prescribed time interval, bytes read directly from the 8-bit-byte former 113 are reproduced by the circuitry 120 for application as input signal to an M/H data de-randomizer 128. After that prescribed time interval, bytes read from the RAM 119 are reproduced by the circuitry 120 for application as input signal to the M/H data de-randomizer 128. The M/H data de-randomizer 128 de-randomizes the contents of the data bytes by exclusive-ORing the bits therein with the prescribed PRBS. The exclusive-ORing is customarily done after a byte-to-bit conversion and is followed by a bit-to-byte conversion. The output port of the M/H data de-randomizer 128 is connected for supplying its response to the input port of an IP packet parsing unit 129 shown in FIG. 17C.

Referring now to FIG. 17C, the M/H data de-randomizer 128 supplies the de-randomized bytes of M/H data and their accompanying extension bits to IP packet parsing unit 129 for parsing the data stream into internet-protocol (IP) packets. The IP-packet parsing circuitry 129 performs this parsing responsive to two-byte row headers respectively transmitted at the beginning of each row of IP data in the RS Frame. This row header indicates where the earliest start of an IP packet occurs within the row of IP data bytes within the RS Frame. If a short IP packet is completely contained within a row of the RS Frame, the IP-packet parsing circuitry 129 calculates the start of a later IP packet proceeding from the packet length information contained in the earlier IP packet within that same row of the RS Frame.

The IP-packet parsing circuitry 129 is connected for supplying IP packets to a decoder 130 for cyclic-redundancy-check coding in IP packets. Each IP packet contains a two-byte, 16-bit checksum for CRC coding that IP packet. The decoder 130 is constructed to preface each IP packet that it reproduces with a prefix bit indicating whether or not error has been detected in that IP packet. The decoder 130 is connected to supply these IP packets as so prefaced to a detector 131 of a "well-known" SMT-MH address and to delay circuitry 132. The delay circuitry 132 delays the IP packets supplied to selector circuitry 133 for sorting SMT-MH packets from other IP packets. The delay circuitry 132 provides delay of a part of an IP packet header interval, which delay is long enough for the detector 131 to ascertain whether or not the "well-known" SMT-MH address is detected.

If the detector 131 does not detect the "well-known" SMT-MH address in the IP packet, the detector 131 output response conditions the selector circuitry 133 to reproduce the IP packet for application to a packet sorter 134 as input signal thereto. The packet sorter 134 sorts out those IP packets in which the preface provides no indication of CRC coding error for writing to a cache memory 135 for IP packets. The prefatory prefix bit before each of the IP packets that indicates whether there is CRC code error in its respective bytes is omitted when writing the cache memory 135. The cache memory 135 temporarily stores at least those IP packets not determined to contain CRC code error for possible future reading to the later stages 136 of the receiver.

If the detector 131 does detect the "well-known" SMT-MH address in the IP packet, establishing it as an SMT-MH packet, the detector 131 output response conditions the selector circuitry 133 to reproduce the SMT-MH packet for application to SMT-MH processing circuitry 137, which includes circuitry for generating control signals for the later stages 136 of the M/H receiver. FIG. 17C shows the SMT-MH processing circuitry 137 connected for receiving FIC information from the FIC-Chunk processing circuitry 77 in FIG. 17A. The SMT-MH processing circuitry 137 integrates this FIC information with information from SMT-MH packets during the generation of Service Map Data. The Service Map Data generated by the SMT-MH processing circuitry 137 is written into memory 138 for temporary storage therewithin and subsequent application to the later stages 136 of the M/H receiver. The SMT-MH processing circuitry 137 relays those SMT-MH packets that have bit prefixes that do not indicate error in the packets to a user interface 139, which includes an Electronic Service Guide (ESG) and apparatus for selectively displaying the ESG on the viewing screen of the M/H receiver.

U.S. patent application Ser. No. 12/555,248 filed Sep. 8, 2009 for A. L. R. Limberg, published Mar. 11, 2010 as U.S. 2010/0061465 A1 and titled "Sub-channel Acquisition in a Digital Television Receiver Designed to Receive Mobile/Handheld Signals" provides more detailed descriptions of the operations of the portion of an M/H receiver as shown in FIG. 17C. The description with reference to the drawing FIGS. 12, 13 and 14 of that application describes operations relying on the SMT-MH tables available in A/153. That description and the drawings it refers to are incorporated herein by reference.

In variants of the FIG. 17 receiver, indications of byte error from the TRS decoding may be forwarded with the IP packets routed to the cache memory 135. These indications can be used to salvage data from certain types of IP packets that CRC decoding indicates contain error. This may be possible with certain types of IP packets encoding audio signals, for example.

Figure 18:
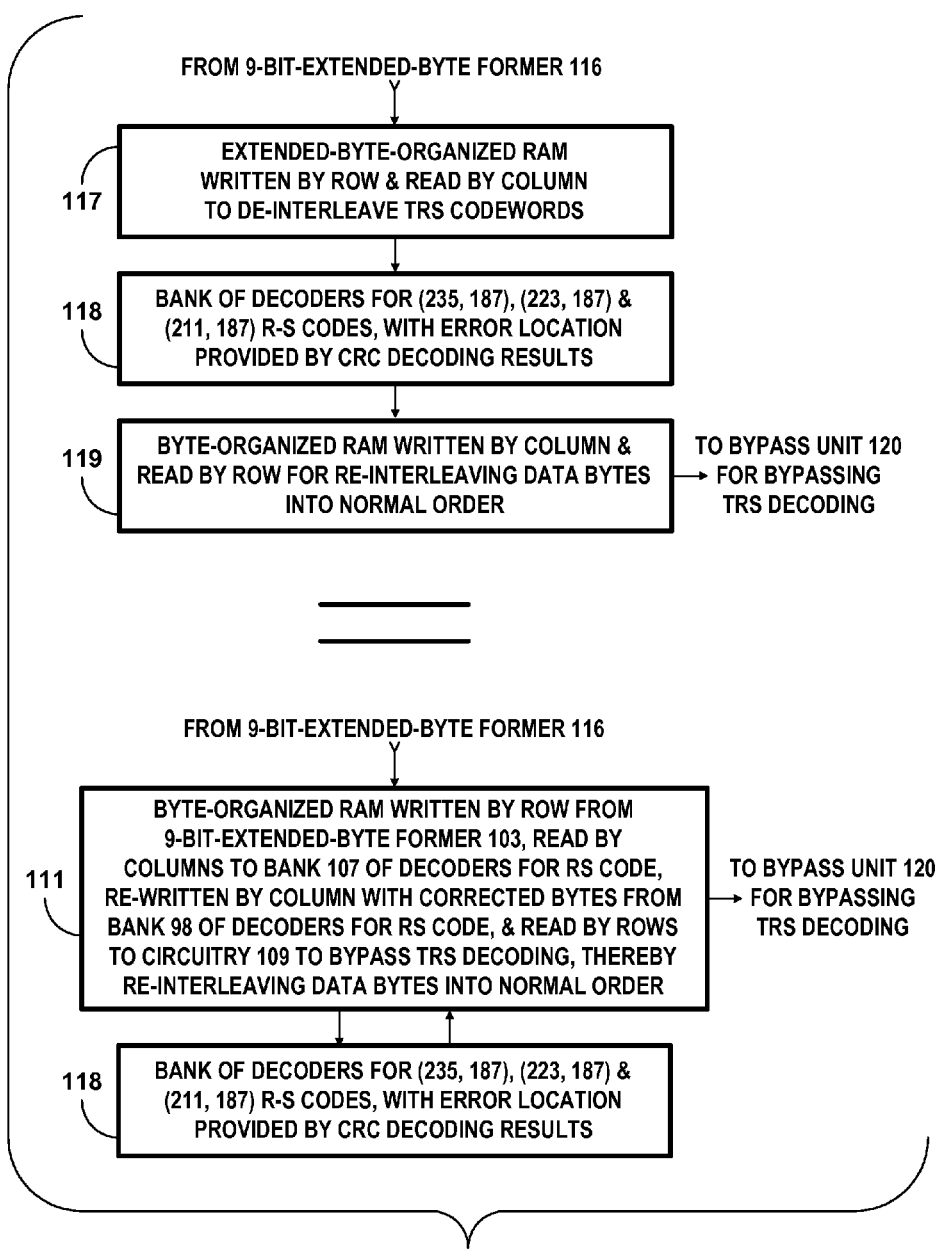
FIG. 18 is a diagram showing how, in a modification of the FIG. 17B portion of the FIG. 17 receiver apparatus, a single random-access memory can replace a pair of random-access memories for performing matrix-type block de-interleaving and matrix-type block re-interleaving.

FIG. 18 shows that the RAM 117 and the RAM 119 both shown in FIG. 17B can be replaced by a single random-access memory 111. The 9-bit extended bytes from the nine-bit-extended-byte former 116 are written row by row into respective rows of extended-byte storage locations in the RAM 111. The RAM 111 is subsequently read one column of 9-bit extended bytes at a time to a selected one of the bank 118 of decoders for RS codes to perform the matrix-type block de-interleaving procedure that is a first step of the TRS decoding routine. The extension bits accompanying the 8-bit bytes of the TRS code are used to help locate byte errors for TRS decoding by the selected one of the bank 118 of decoders for RS codes. The 8-bit data bytes that have been corrected inso- far as possible by the selected one of the RS decoders in the bank 118 are re-written, column by column, into respective columns of the byte-storage locations of the RAM 111, overwriting previous data-byte content. In a final step of the TRS decoding routine, the byte-storage locations in the RAM 111 are read from row by row to complete a matrix-type block re-interleaving procedure for data supplied to the bypass unit 120 for selectively bypassing TRS decoding.

Figure 19:
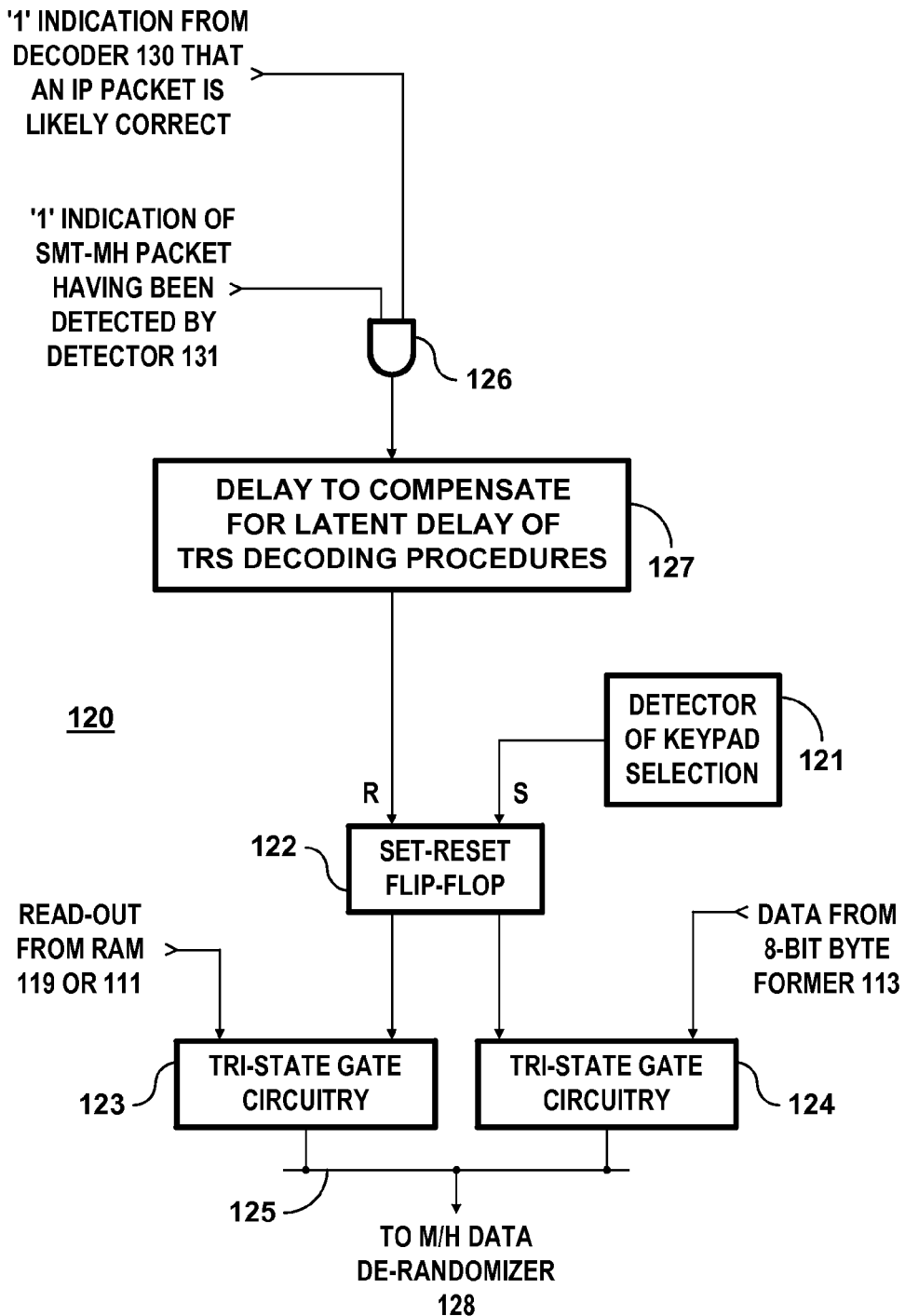
FIG. 19 is a detailed schematic diagram of a representative embodiment of the by-pass unit that the FIG. 17B portion of the FIG. 17 receiver apparatus uses to bypass TRS decoding for a time after a subchannel is newly selected.

FIG. 19 shows a representative embodiment of the circuitry 120 in more detail. A detector 121 of keypad selection of a subchannel generates a SET signal for a set-reset flip-flop 122, which flip-flop 122 responds to supply a logic ZERO to tri-state buffer 123 and to supply a logic ONE to tri-state buffer 124. The respective output ports of the tri-state buffer 123 and the tri-state buffer 124 each connect to a common bus 125 for supplying the input port of the M/H data de-randomizer 128. The logic ZERO that the flip-flop 122 supplies to the tri-state buffer 123 conditions it to reproduce from a relatively high source impedance the data read to it from the RAM 119 or 111. The logic ONE that the flip-flop 122 supplies to the tri-state buffer 124 conditions it to reproduce from a relatively low source impedance the data that it receives as input signal from the byte former 113. This establishes that data as the input signal supplied via the common bus 125 to the input port of the M/H data de-randomizer 128 until such time as the flip-flop 122 is reset.

The flip-flop 122 is reset at a time when a valid SMT packet would be expected to be read from the RAM 119 or 111 to the tri-state gate circuitry 123. Resetting is controlled by the decoder 130 for CRC in IP packets and the detector 131 of SMT-MH packets shown in FIG. 17C. FIG. 19 shows that one input of a two-input AND gate 126 receives a logic ONE indication from the decoder 130 when it finds an IP packet to be correct; otherwise a logic ZERO indication is supplied from the decoder 130 to this input of the AND gate 126. FIG. 19 shows that the other input of the AND gate 126 receives a logic ONE indication from the detector 131 when an IP packet is an SMT-MH packet; otherwise a logic ZERO indication is supplied from the detector 131 to this other input of the AND gate 126. The response of the AND gate 126 being a logic ONE indicates that a correct, or valid, SMT-MH packet has been received. The logic ONE response of the AND gate 126 is delayed by delay circuitry 127 to compensate for the latent delay of the decoding procedures in elements 114-119, and the delayed logic ONE response of the AND gate 126 is applied as RESET signal to the set-reset flip-flop 122.

Figure 20:
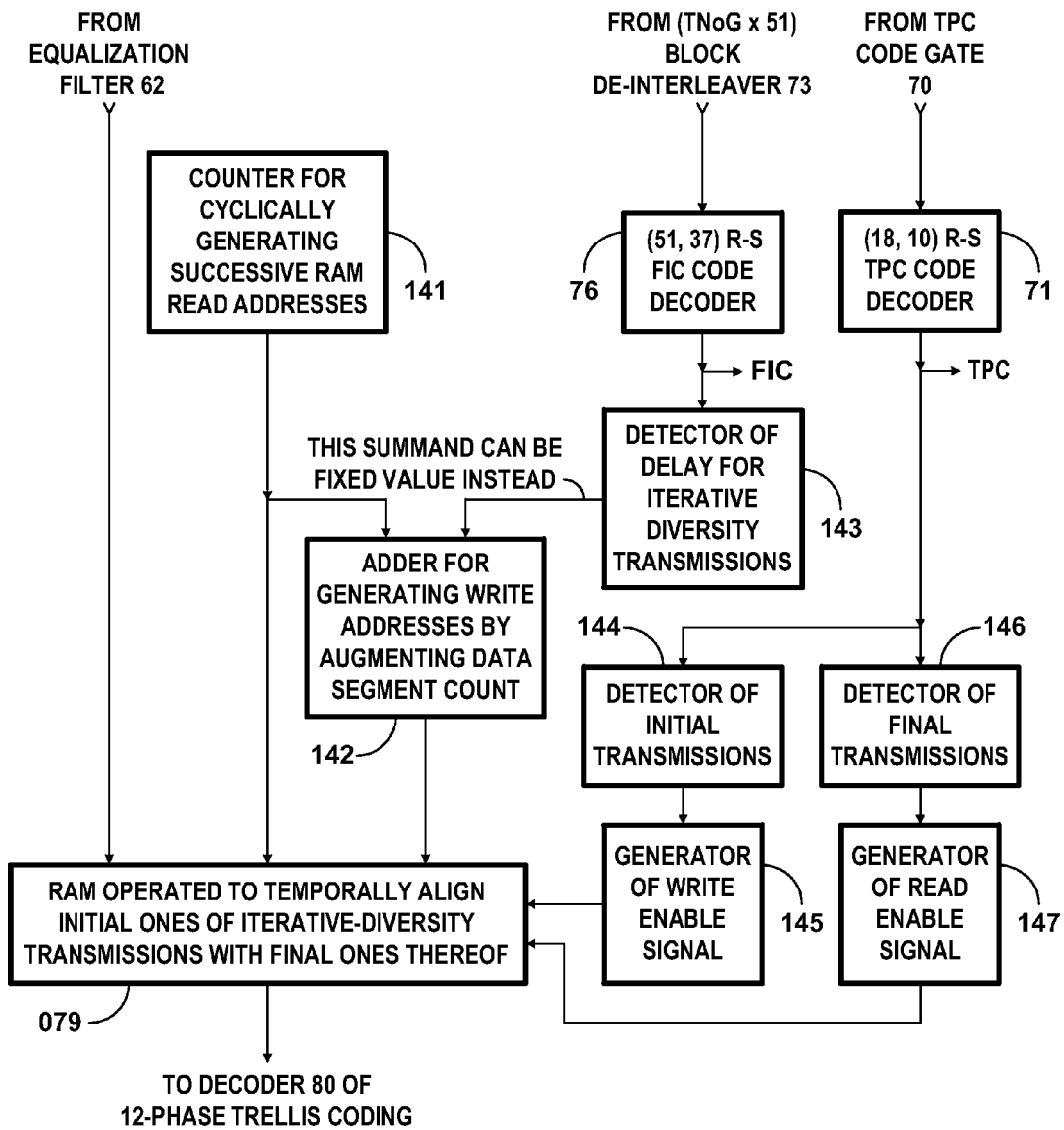
FIG. 20 is a diagram of a representative embodiment of the delay memory used in the FIG. 17B portion of the FIG. 17 receiver apparatus for delaying initial transmissions of M/H data to align them in time with final transmissions of the same M/H data, when iterative-diversity transmissions are being received.

FIG. 20 shows more particularly a random-access memory 079 being used as the basis of the delay memory 79 employed in the turbo decoding circuitry for iterative-diversity reception shown in FIG. 17B. FIG. 20 also shows, in detail, the circuitry used to support the operation of the RAM 079. FIG. 20 shows a counter 141 connected for cyclically generating successive write addresses for the RAM 079. The output count from the counter 141 is partitioned into a data segment count and an 8VSB symbol count. The counts are reset to appropriate values responsive to information in the data field synchronizing (DFS) signals at the beginning of 8VSB data fields. The RAM 079 accepts a full range of data segment count that is an integer multiple M times 312 in number, as partial addresses both for writing and for reading. However, the RAM 079 need not have actual storage locations for symbols associated with all the full addresses that contain these partial addresses. The full addresses that have partial addresses related to data segments that do not include M/H data do not need actual storage locations for symbols associated with them. This reduces the number of actual storage locations for symbols required in the RAM 079 by the rather small factor of 156/150. The number of actual storage locations for symbols required in the RAM 079 can be more substantially reduced if a standardized scheme for allocating Slots is adopted that invariably restricts initial transmissions just to even Slots or that invariably restricts initial transmissions just to odd Slots. Such restriction reduces the number of actual storage locations for symbols required in the RAM 079 by a further factor of 2.

A digital adder 142 is connected for generating read addresses for the RAM 079 by augmenting the data segment count portions of the successive write addresses for the RAM 079 generated by the counter 141. The augmentation can be a fixed value, for offsetting the read addresses from the write addresses that they respectively augment by a specified odd multiple of 156, which multiple is typically 156 times either 81 or 79.

FIG. 20 shows a more sophisticated way of determining the offset between write addresses and read addresses for the RAM 079. The offset is determined responsive to an indication supplied by bits in the FIC signal from the decoder 76 of the FIC coding. A detector 143 of the delay for iterative-diversity transmission responds to these bits to generate the offset between the data segment count portions of the write and read addresses to be supplied to the RAM 079. This offset is supplied as the summand input signal to the digital adder 142 that augments the data segment count portions of the successive write addresses generated by the counter 141, thus to generate read addresses for the RAM 079. Programming the offset between write addresses and read addresses for the RAM 079 responsive to bits of the FIC signal, allows receivers to be made with different amounts of storage capability for bytes of iterative diversity signals. As memory becomes cheaper more receivers can be built with longer delays for overcoming momentary drop-outs in received signal strength. More importantly perhaps, such programming offers the broadcaster some trade-off in the way the RAM 079 is used in the receiver. If fewer Slots are used for iterative-diversity transmissions, the excess storage capacity of the RAM 079 can be utilized to provide longer delay for overcoming momentary drop-outs in received signal strength.

A detector 144 for detecting initial transmissions is connected for receiving TPC signal from the TPC code decoder 71. The TPC signal presumably includes an iterative_diversity_mode datum. The detector 144 responds to that iterative_diversity_mode datum indicating an initial transmission being currently made to condition a generator 145 of write-enable signal to begin generating a write- enable signal for application to the RAM 079. Generation of the write-enable signal continues until the current Slot concludes. The RAM 079 is conditioned by the write-enable signal to write the equalization filter 62 response to symbol storage locations specified by the write addressing received from the digital adder 142. These symbol storage locations will not be reached for reading until a second or so later.

A detector 146 for detecting final transmissions is connected for receiving TPC signal from the TPC code decoder 71. The detector responds to the iterative_diversity_mode datum indicating an final transmission being currently made to condition a generator 147 of read-enable signal to begin generating a read-enable signal for application to the RAM 079. Generation of the read-enable signal continues until the current Slot concludes. The RAM 079 is conditioned by the read-enable signal to read delayed equalization filter 62 response from symbol storage locations specified by the read addressing received from the counter 141. The delayed equalization filter 62 response is read from the RAM 079 to the decoder 80 for ⅔ trellis coding of the initial ones of iterative-diversity transmissions. FIG. 17B shows the decoder 80.

The iterative-diversity transmissions received by the FIG. 17 receiver will be made either using component PCCC transmissions at code rate one-third 8VSB symbol rate or using component SCCC transmissions at code rate one-third 8VSB symbol rate. The threshold of visibility (TOV) for iterative-diversity transmissions employing PCCC will occur at a 0.5 dB or so lower signal-to-noise rate (SNR) than the TOV for iterative-diversity transmissions employing SCCC, all other things being equal. However, iterative-diversity transmissions employing SCCC may be accepted as standard, in order to provide backward compatibility with A/153. Receiver designs for iterative-diversity transmissions employing PCCC are somewhat more straightforward than receiver designs for iterative-diversity transmissions employing SCCC. So, this specification and its accompanying drawings treat receiver designs for iterative-diversity transmissions employing PCCC before treating receiver designs for iterative-diversity transmissions employing SCCC.

Figure 21:
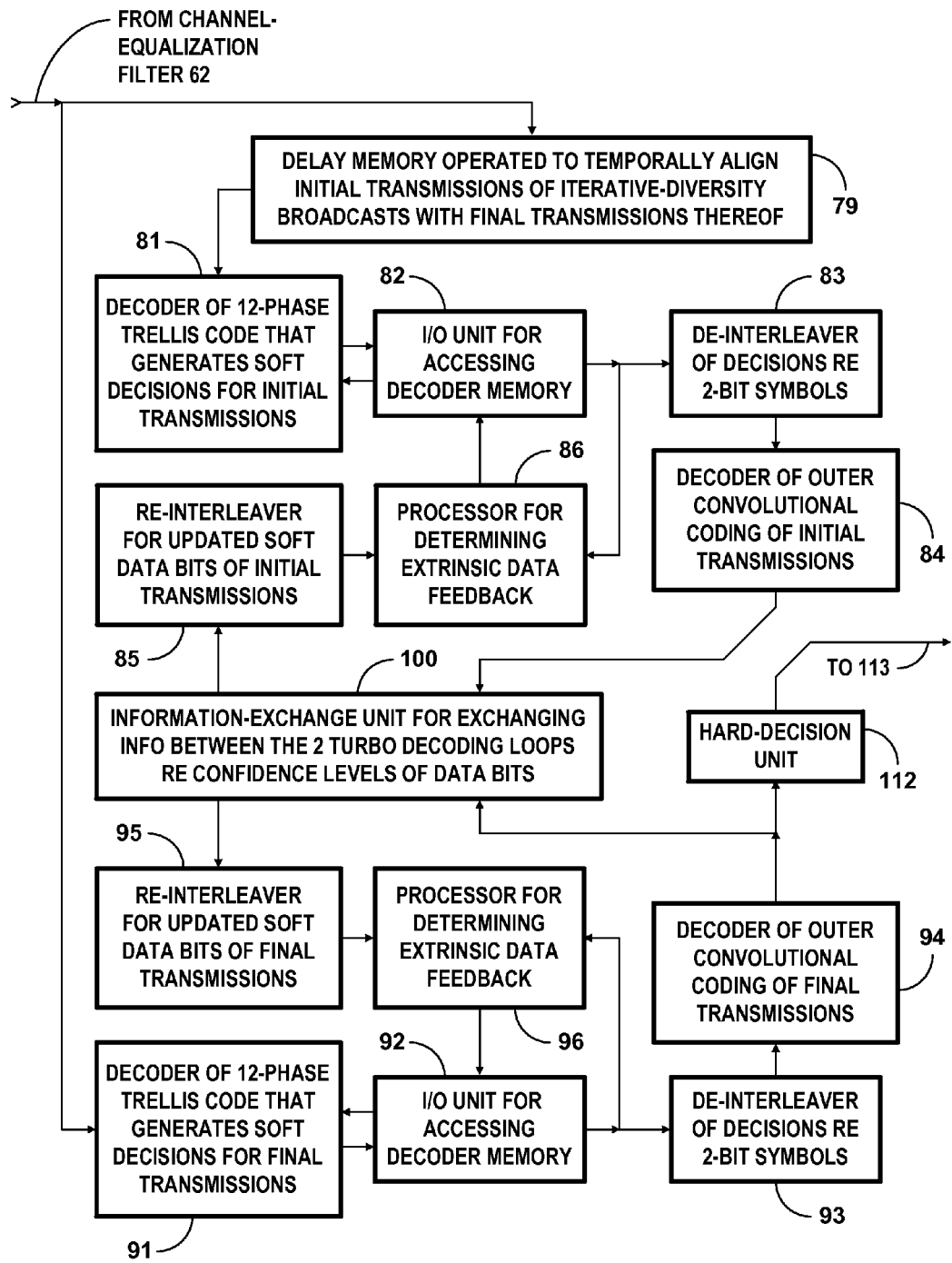
FIG. 21 is a schematic diagram of a first arrangement of the elements of paired turbo decoders shown in the FIG. 17B portion of the FIG. 17 receiver apparatus, which turbo decoders decode PCCC iterative-diversity transmissions.

FIG. 21 shows in some detail a first generic way to construct the FIG. 17B turbo decoders 80 and 90 for decoding iterative-diversity signals comprising component PCCC transmissions at respective code rates each one-third 8VSB symbol rate. The fundamental approach used in the turbo decoding circuitry for iterative-diversity reception is to delay the initial-component transmissions so that they can be decoded contemporaneously with the final-component transmissions. This facilitates the exchange of information between the decoder 80 for initial-component transmissions and the decoder 90 for final-component transmissions. First-in/first-out delay memory 79 is written with the initial-component transmissions of iteratively transmitted data that appear in the response of the channel-equalization filter 62, temporarily storing each of them until the corresponding final-component transmission of that data appears in the response of the channel-equalization filter 62. Each initial-component transmission of data is then read to provide input signal to a decoder 81 for 12-phase trellis coding that is contemporaneous with the corresponding final-component transmission of that data being applied as input signal to another decoder 91 for 12-phase trellis coding. Insofar as turbo decoding procedures are concerned, the decoders 81 and 91 are similar soft-input, soft-output (SISO) decoders for inner convolutional coding.

The decoder 81 for 12-phase trellis coding decodes the inner convolutional coding of the initial transmissions for iterative-diversity reception and has an input/output unit 82 for communicating with memory within the decoder 81. The decoder 81 supplies soft decisions concerning the interleaved outer convolutional coding of the initial transmissions via its input/output unit 82 to the input port of a symbol de-interleaver 83. The output port of the symbol de-interleaver 83 is connected for supplying de-interleaved soft decisions concerning the initial-component transmissions to a decoder 84 for the one-half-rate outer convolutional coding.

The decoder 91 for 12-phase trellis coding decodes the inner convolutional coding of the final transmissions for iterative-diversity reception and has an input/output unit 92 for communicating with memory within the decoder 91. The decoder 91 supplies soft decisions concerning the interleaved outer convolutional coding of the final transmissions via its input/output unit 92 to the input port of a symbol de-interleaver 93. The output port of the symbol de-interleaver 93 is connected for supplying de-interleaved soft decisions concerning the final-component transmissions to a decoder 94 for the one-half-rate outer convolutional coding.

The decoders 84 and 94 for outer convolutional coding are similar soft-input, soft-output (SISO) decoders. Referring back to FIG. 5, the outer convolutional coding for component PCCC transmissions at respective code rates each one-third 8VSB symbol rate is transmitted with a respective parity bit preceding a respective data bit in each 2-bit symbol supplied for ⅔ trellis coding. The decoders 84 and 94 have respective input ports each connected for receiving de-interleaved soft decisions accordingly. The decoder 84 is connected for receiving soft symbols of outer convolutional coding from the decoder 81 after their de-interleaving by the symbol de-interleaver 83. The soft data bits in these de-interleaved symbols were directly involved in the trellis decoding procedures within the decoder 81. However, the soft parity bits in these de-interleaved symbols were affected by the trellis decoding procedures within the decoder 81 only owing to their being included with the soft data bits in 2-bit symbols relating to initial data-slicing procedures within the decoder 81. The decoder 94 is connected for receiving soft symbols of outer convolutional coding from the decoder 91 after their de-interleaving by the symbol de-interleaver 93. The soft data bits in these de-interleaved symbols were directly involved in the trellis decoding procedures within the decoder 91. However, the soft parity bits in these de-interleaved symbols were affected by the trellis decoding procedures within the decoder 91 only owing to their being included with the soft data bits in 2-bit symbols relating to initial data-slicing procedures within the decoder 91. The decoders 81, 91, 84 and 94 may be of types that use SOVA for evaluating code trellises, but preferably are of types that use the log-MAP algorithm for such evaluations.

The decoders 84 and 94 have respective output ports connected to feed back their respective soft decisions concerning data bits to the information-exchange unit 100. The information-exchange unit 100 exchanges information regarding soft data bits between the turbo decoders 80 and 90. Then, based on the exchanged information, the information-exchange unit 100 adjusts those soft data bits before forwarding them to the input ports of re-interleavers 85 and 95. The re-interleaver 85 re-interleaves the soft data bits from the information-exchange unit 100 to provide re-interleaved turbo feedback signal to be used in iterated operation of the turbo decoder 80. The re-interleaver 95 re-interleaves the soft data bits from the information-exchange unit 100 to provide re-interleaved turbo feedback signal to be used in iterated operation of the turbo decoder 80.

A processor 86 for determining extrinsic data feed back to the input/output unit 82 of the trellis decoder 81 is connected for receiving re-interleaved soft data bits from the output port of the re-interleaver 85. The processor 86 is further connected for receiving the original soft decisions of the trellis decoder 81 regarding those data bits as extracted from memory in the decoder 81 via its input/output unit 82. The processor 86 calculates the extrinsic data as the difference between these soft data bits in these input signals. The processor 86 is connected for supplying the extrinsic data to the input/output unit 82 to be relayed back to the memory within the trellis decoder 81 that temporarily stores input data samples.

A processor 96 for determining extrinsic data feed back to the input/output unit 92 of the trellis decoder 91 is connected for receiving re-interleaved soft data bits from the output port of the re-interleaver 95. The processor 96 is further connected for receiving the original soft decisions of the trellis decoder 91 regarding those data bits as extracted from memory in the decoder 91 via its input/output unit 92. The processor 96 calculates the extrinsic data from these input signals and is connected for supplying the extrinsic data to the input/output unit 92 to be relayed back to the memory within the trellis decoder 91 that temporarily stores input data samples.

Hard-decision unit 112 has an input port connected for receiving soft decisions from the output port of the decoder 94 for the outer convolutional coding of the final ones of iterative transmissions of data. The hard-decision unit 112 has an output port connected for supplying the 8-bit byte former 113 shown in FIG. 17B with hard decisions generated in respect to data bits.

Figure 22:
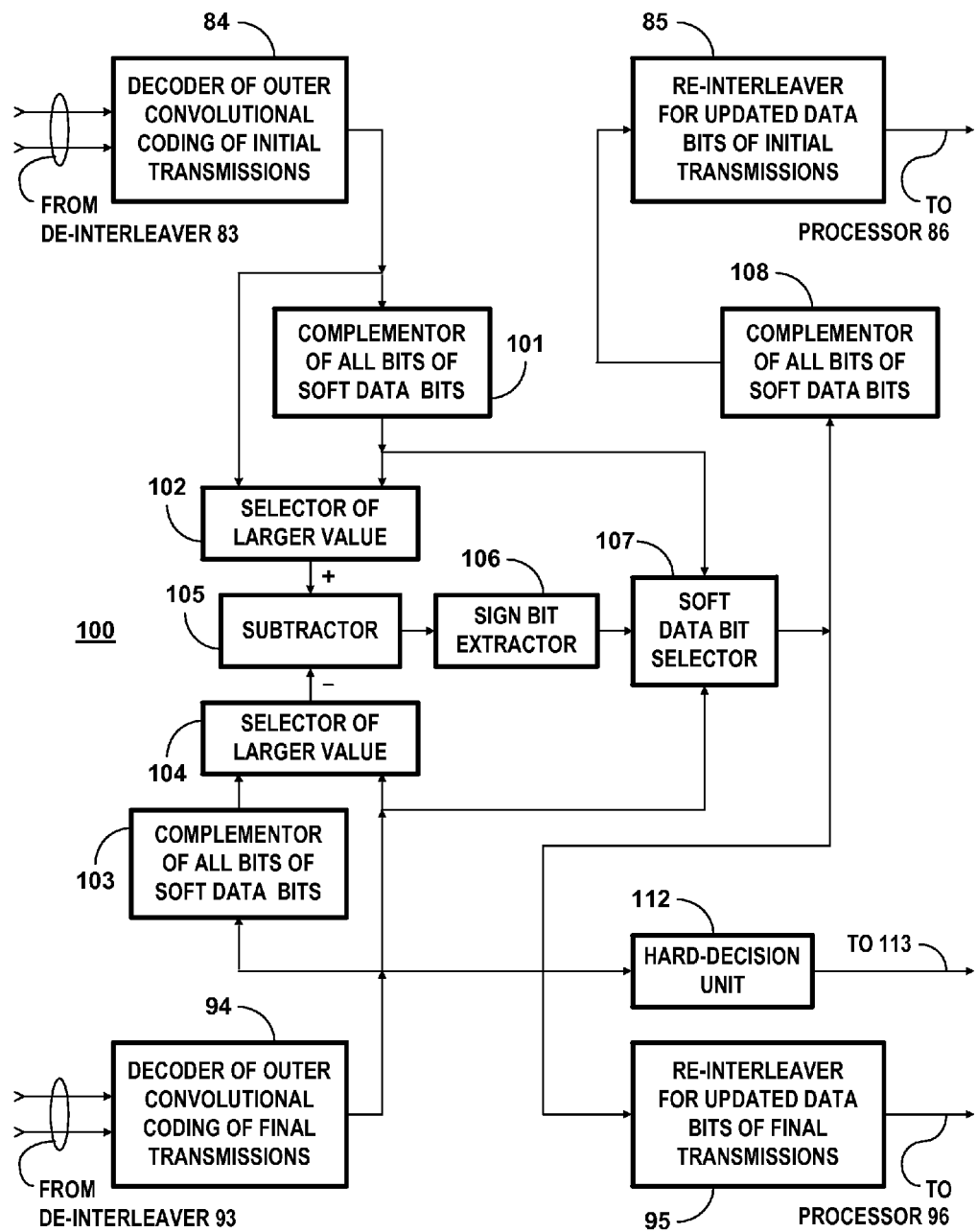
FIGS. 22 and 23 are detailed schematic diagrams of alternative specific embodiments of the portions of the FIG. 21 paired turbo decoders used for exchanging information between them concerning confidence levels of soft data bits.

FIG. 22 shows in more detail a more specific embodiment of the FIG. 21 information-exchange unit 100 for exchanging information regarding data bits between the turbo decoders 80 and 90. The information-exchange unit 100 shown in FIGS. 22, 25, 18, 31, 41, 44, 47 and 50 comprises elements 101, 102, 103, 104, 105, 106, 107 and 108. The information-exchange unit 100 shown in FIG. 22 compares each soft data bit from the turbo coding loop for initial transmissions with the corresponding soft data bit from the turbo coding loop for final transmissions. The FIG. 22 information-exchange unit 100 then selects the soft data bit with the better confidence level as the basis for turbo feedback signals supplied to re-interleavers 85 and 95 for soft data bits. The structure and operation of the FIG. 22 information-exchange unit 100 are described in further detail following.

The output port of the decoder 84 of the outer convolutional coding of the initial-component transmissions is connected for supplying successive soft data bits to a complementor 101 of all of the bits in each successive soft bit. A selector 102 is connected for reproducing in its response the larger of each soft data bit supplied from the output port of the decoder 84 and the complementary soft data bit supplied from the complementor 101. The confidence level bits reproduced by the selector 102 in its response are an absolute-value indication of the level of confidence that the soft data bit supplied from the output port of the decoder 84 is correct.

The output port of the decoder 94 of the outer convolutional coding of the initial-component transmissions is connected for supplying successive soft data bits to a complementor 103 of all of the bits in each successive soft bit. A selector 104 is connected for reproducing in its response the larger of each soft data bit supplied from the output port of the decoder 94 and the complementary soft data bit supplied from the complementor 103. The confidence level bits reproduced by the selector 104 in its response are an absolute-value indication of the level of confidence that the soft data bit supplied from the output port of the decoder 94 is correct.

A digital subtractor 105 is connected for receiving the responses of the selectors 102 and 104 as its minuend input signal and as its subtrahend input signal, respectively. The subtractor 105 is connected for supplying its difference output signal to a sign-bit extractor 106. In practice, the sign-bit extractor 106 is realized simply by discarding all bits save the sign bit. The sign-bit from the sign-bit extractor 106 is applied as control signal to a soft-data-bit selector 107. The soft-data-bit selector 107 is connected to receive, as one of its two input signals, the responses of the complementor 101 to the successive soft data bits from the output port of the decoder 84. The soft-data-bit selector 107 is connected to receive, as the other of its two input signals, the successive soft data bits from the output port of the decoder 94. The soft-data-bit selector 107 is connected to supply successively selected soft data bits to a complementor 108 of all of the bits in each successive soft bit, and the complementor 108 is connected to supply the complementary soft data bit reproduced therefrom to the input port of the re-interleaver 85. The soft-data-bit selector 107 is connected to supply successively selected soft data bits to the input port of the re-interleaver 95 also.

If the sign bit extracted by the sign-bit extractor 106 is positive, this indicates that the confidence level as to the correctness of the soft data bit from the output port of the decoder 84 is better than the confidence level as to the correctness of the soft data bit from the output port of the decoder 94. Responsive to this indication received as control signal, the soft-data-bit selector 107 is conditioned to reproduce from its output port the complementary soft data bit from the output port of the decoder 84 as complemented by the complementor 101. The soft data bit that the soft-data-bit selector 107 reproduces is supplied as input signal to the re-interleaver 95 and to the complementor 108 for being complemented before being supplied as input signal to the re-interleaver 85.

If the sign bit extracted by the sign-bit extractor 106 is negative, this indicates that the confidence level as to the correctness of the soft data bit from the output port of the decoder 94 is better than the confidence level as to the correctness of the soft data bit from the output port of the decoder 84. Responsive to this indication received as control signal, the soft-data-bit selector 107 is conditioned to reproduce from its output port the soft data bit from the output port of the decoder 94. The soft data bit that the soft-data-bit selector 107 reproduces is supplied as input signal to the re-interleaver 95 and to the complementor 108 for being complemented before being supplied as input signal to the re-interleaver 85.

FIG. 22 shows two re-interleavers 85 and 95 for respective inclusion in the turbo decoders 80 and 90, principally to make it easier for the reader to relate FIG. 22 as a detail to the more inclusive structure of FIG. 21. In actual practice, since the two re-interleavers 85 and 95 process the same input signal to supply two identical output signals in an embodiment of the FIG. 21 structure for the turbo decoders 80 and 90, an efficient design will replace the two re-interleavers 85 and 95 with a single re-interleaver similar to each of them.

Figure 23:
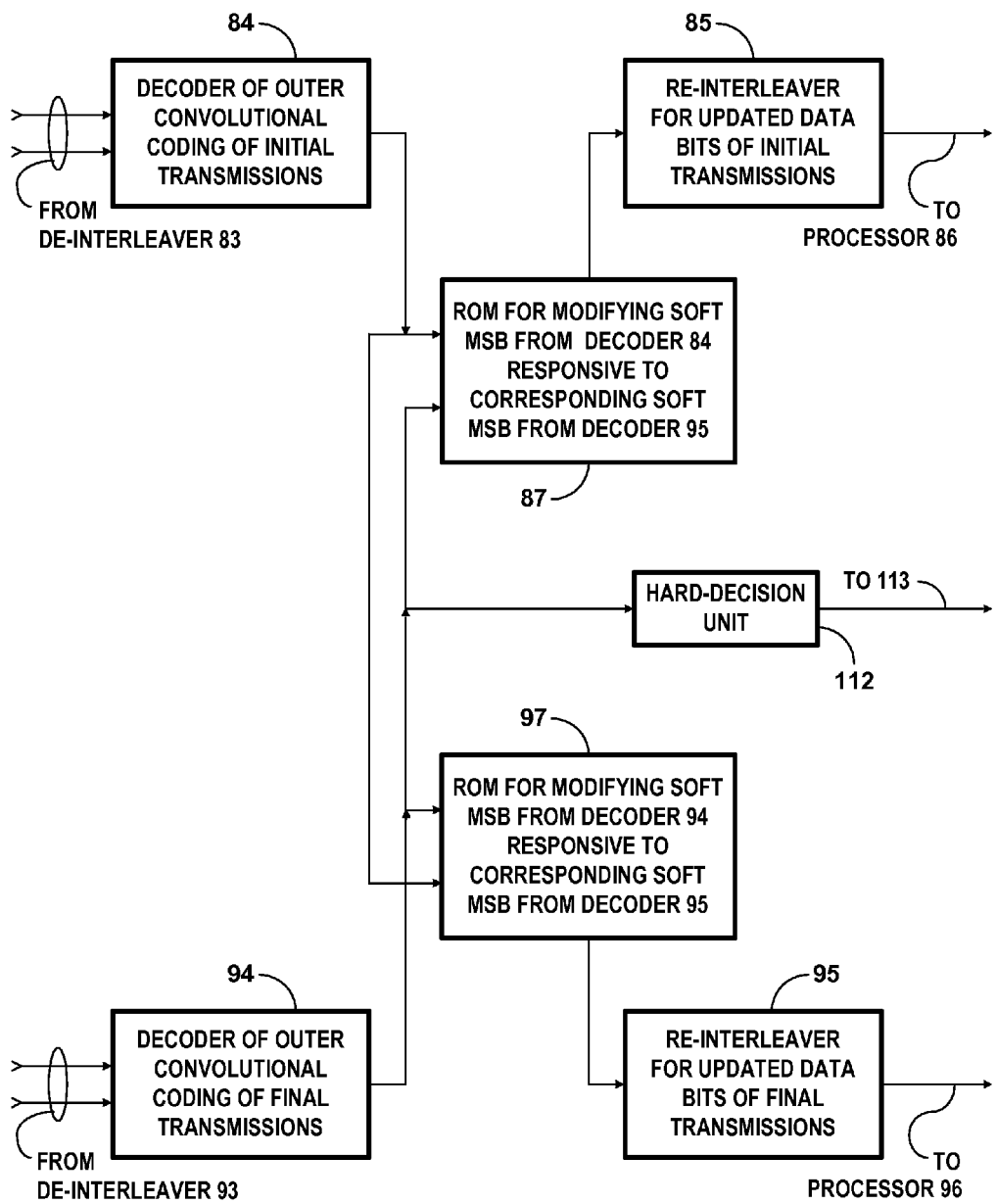

FIG. 23 shows an information-exchange unit that replaces the FIG. 22 information-exchange unit 100 for exchanging information regarding soft data bits between the two turbo decoders 80 and 90 in another specific embodiment of them arranged as shown in FIG. 21. This replacement circuitry comprises read-only memories 87 and 97. The decoder 84 for outer convolutional coding of initial transmissions is connected to supply soft bits of data to each of the ROMs 87 and 97 as a first half of its input addressing. The decoder 94 for outer convolutional coding of final transmissions is connected to supply soft bits of data to each of the ROMs 87 and 97 as a second half of its input addressing. The ROM 87 is connected to supply the soft data bits of its output response to the input port of the re-interleaver 85 as the input signal thereto. The output response of the ROM 87 modifies the decoder 84 response received as the first half of its input address, the modification responding to the decoder 94 response received as the second half of its input address. The ROM 97 is connected to supply the soft data bits of its output response to the input port of the re-interleaver 95 as the input signal thereto. The output response of the ROM 97 modifies the decoder 94 response received as the second half of its input address, the modification responding to the decoder 84 response received as the first half of its input address.

Suppose one of the hard-decision portions of the two soft bits contemporaneously supplied by the decoders 84 and 94 as input addressing for the read-only memories 87 and 97 is a ONE and the other is a ZERO. Each of the two soft bits supports increased likelihood that itself and the other bit are correct. If the chance of one of the bits being in error is 1/n, the chance of both being in error is $(1/n) \times (1/n) = 1/n^2$. So, the chance of both being correct is $1-(1/n^2)=(n^2-1)/n^2$. That is, the chance of both bits being correct is $(n^2-1)$ times as likely as both being erroneous. Accordingly the output response of the ROM 87 modifies the decoder 84 response by (if possible) increasing the log-likelihood ratio of the soft bit supplied to the re-interleaver 85 being correct to be somewhat higher than that of the soft bit supplied from the decoder 84. The hard-decision portion of the soft bit supplied to the re-interleaver 85 is kept the same as that of the soft bit supplied from the decoder 84. Furthermore, the output response of the ROM 97 modifies the decoder 94 response by (if possible) increasing the log-likelihood ratio of the soft bit supplied to the re-interleaver 95 being correct to be somewhat higher than that of the soft bit supplied from the decoder 94. The hard-decision portion of the soft bit supplied to the re-interleaver 95 is kept the same as that of the soft bit supplied from the decoder 94.

Suppose that the hard-decision portions of the two soft bits contemporaneously supplied by the decoders 84 and 94 as first and second halves of the input addressing for the ROM 87 are the same, rather than being different. This means that the hard-decision portion of one of the two soft bits is in error. If the log-likelihood ratios of both of the soft bits are fairly similar, the output response of the ROM 87 modifies the decoder 84 response as follows. The log-likelihood ratio of the soft bit supplied to the re-interleaver 85 being correct is (if possible) decreased to be somewhat lower than that of the soft bit supplied from the decoder 84. The hard-decision portion of the soft bit supplied to the re-interleaver 85 is kept the same as that of the soft bit supplied from the decoder 84. Furthermore, the output response of the ROM 97 modifies the decoder 94 response as follows. The log-likelihood ratio of the soft bit supplied to the re-interleaver 95 being correct is (if possible) decreased to be somewhat lower than that of the soft bit supplied from the decoder 94. The hard-decision portion of the soft bit supplied to the re-interleaver 95 is kept the same as that of the soft bit supplied from the decoder 94.

Suppose that the hard-decision portions of the two soft bits contemporaneously supplied by the decoders 84 and 94 are the same, rather than being different, but the log-likelihood ratio of the soft bit supplied by the decoder 84 is much higher than the log-likelihood ratio of the soft bit supplied by the decoder 94. This indicates increased likelihood that the soft bit supplied by the decoder 84 is correct and decreased likelihood that the soft bit supplied by the decoder 94 is correct. Accordingly, the output response of the ROM 87 modifies the decoder 84 response by (if possible) increasing the log-likelihood ratio of the soft bit supplied to the re-interleaver 85 being correct to be somewhat higher than that of the soft bit supplied from the decoder 84. The hard-decision portion of the soft bit supplied to the re-interleaver 85 is kept the same as that of the soft bit supplied from the decoder 84. Furthermore, the output response of the ROM 97 modifies the decoder 94 response by (if possible) decreasing the log-likelihood ratio of the soft bit supplied to the re-interleaver 95 being correct to be somewhat lower than that of the soft bit supplied from the decoder 94. The hard-decision portion of the soft bit supplied to the re-interleaver 95 is kept the same as that of the soft bit supplied from the decoder 94 if the difference between the log-likelihood ratios of the bits contemporaneously supplied by the decoders 84 and 94 is not too great. If the difference is very great because the log-likelihood ratio of the soft bit supplied from the decoder 94 is very low, turbo decoding may progress faster if the hard-decision portion of the soft bit supplied to the re-interleaver 95 is changed to ones' complement that of the soft bit supplied from the decoder 94.

Suppose that the hard-decision portions of the two soft bits contemporaneously supplied by the decoders 84 and 94 are the same, rather than being different, but the log-likelihood ratio of the soft bit supplied by the decoder 94 is much higher than the log-likelihood ratio of the soft bit supplied by the decoder 84. This indicates increased likelihood that the soft bit supplied by the decoder 94 is correct and decreased likelihood that the soft bit supplied by the decoder 84 is correct. Accordingly, the output response of the ROM 97 modifies the decoder 94 response by (if possible) increasing the log-likelihood ratio of the soft bit supplied to the re-interleaver 95 being correct to be somewhat higher than that of the soft bit supplied from the decoder 94. The hard-decision portion of the soft bit supplied to the re-interleaver 95 is kept the same as that of the soft bit supplied from the decoder 94. Furthermore, the output response of the ROM 87 modifies the decoder 84 response by (if possible) decreasing the log-likelihood ratio of the soft bit supplied to the re-interleaver 85 being correct to be somewhat lower than that of the soft bit supplied from the decoder 84. The hard-decision portion of the soft bit supplied to the re-interleaver 85 is kept the same as that of the soft bit supplied from the decoder 84 if the difference between the log-likelihood ratios of the bits contemporaneously supplied by the decoders 84 and 94 is not too great. If the difference is very great because the log-likelihood ratio of the soft bit supplied from the decoder 84 is very low, turbo decoding may progress faster if the hard-decision portion of the soft bit supplied to the re-interleaver 85 is changed to ones' complement of that of the soft bit supplied from the decoder 84.

Figure 24:
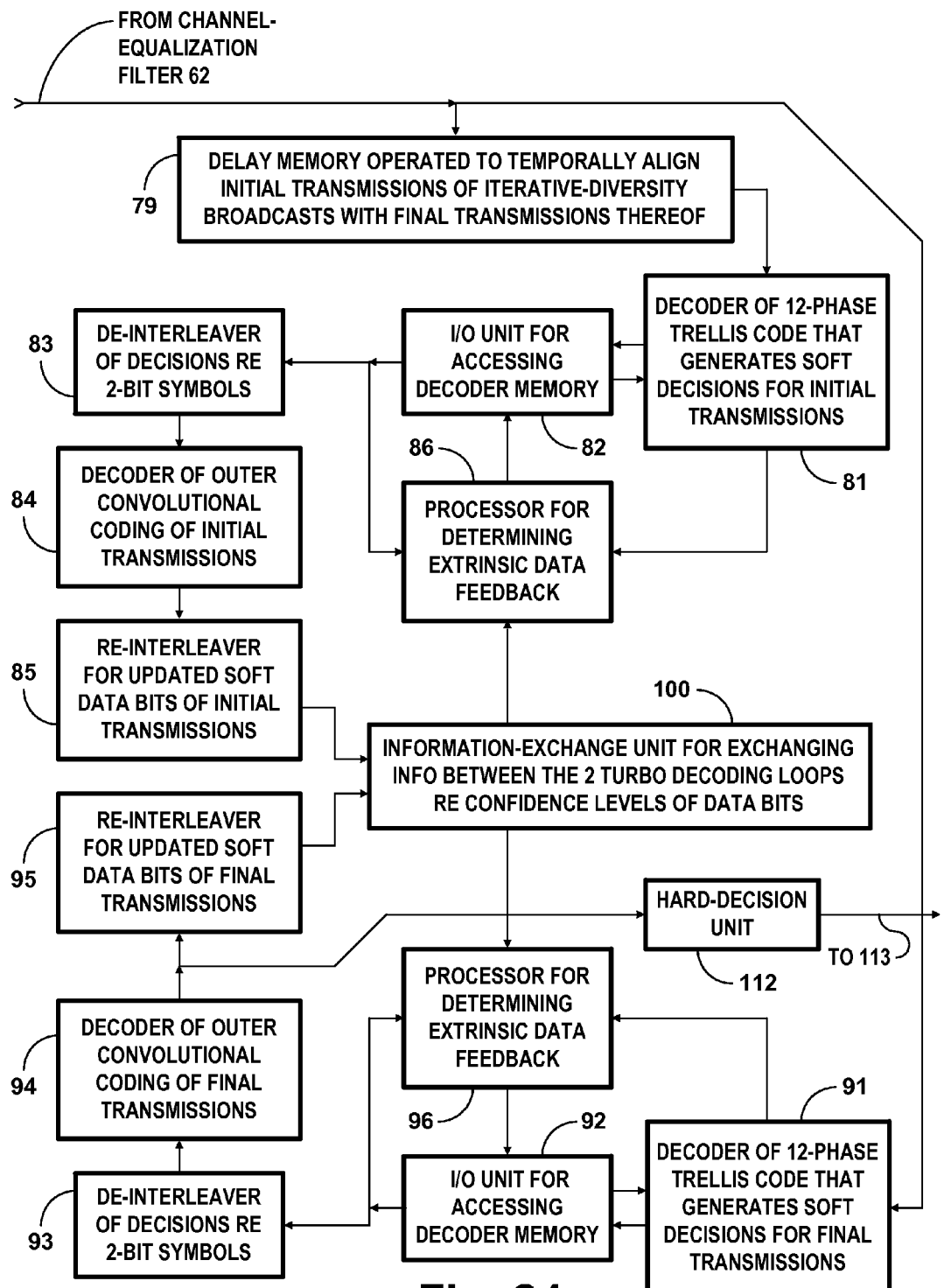
FIG. 24 is a schematic diagram of a second arrangement of the elements of paired turbo decoders shown in the FIG. 17B portion of the FIG. 17 receiver apparatus, which turbo decoders decode PCCC iterative-diversity transmissions.

FIG. 24 shows in some detail a second generic way to construct the FIG. 17B turbo decoders 80 and 90 for decoding iterative-diversity signals comprising component PCCC transmissions at respective code rates each one-third 8VSB symbol rate. The construction shown in FIG. 24 differs from that shown in FIG. 21 with regard to the positioning of the information-exchange unit 100 for exchanging information regarding data bits between the paired turbo decoding loops. The output port of the decoder 84 is connected for supplying updated soft decisions regarding data bits of the initial transmissions to the input port of the re-interleaver 85. The output port of the decoder 94 is connected for supplying soft decisions regarding data bits of the final transmissions to the input port of the re-interleaver 95. The output ports of the re-interleavers 85 and 95 are connected to feed back their respective re-interleaved soft decisions concerning data bits to the information-exchange unit 100 for exchanging information regarding soft data bits between the turbo decoders 80 and 90. Based on the exchanged information, the information-exchange unit 100 adjusts those soft data bits before forwarding adjusted soft data bits to the processors 86 and 96 for determining extrinsic data.

Figure 25:
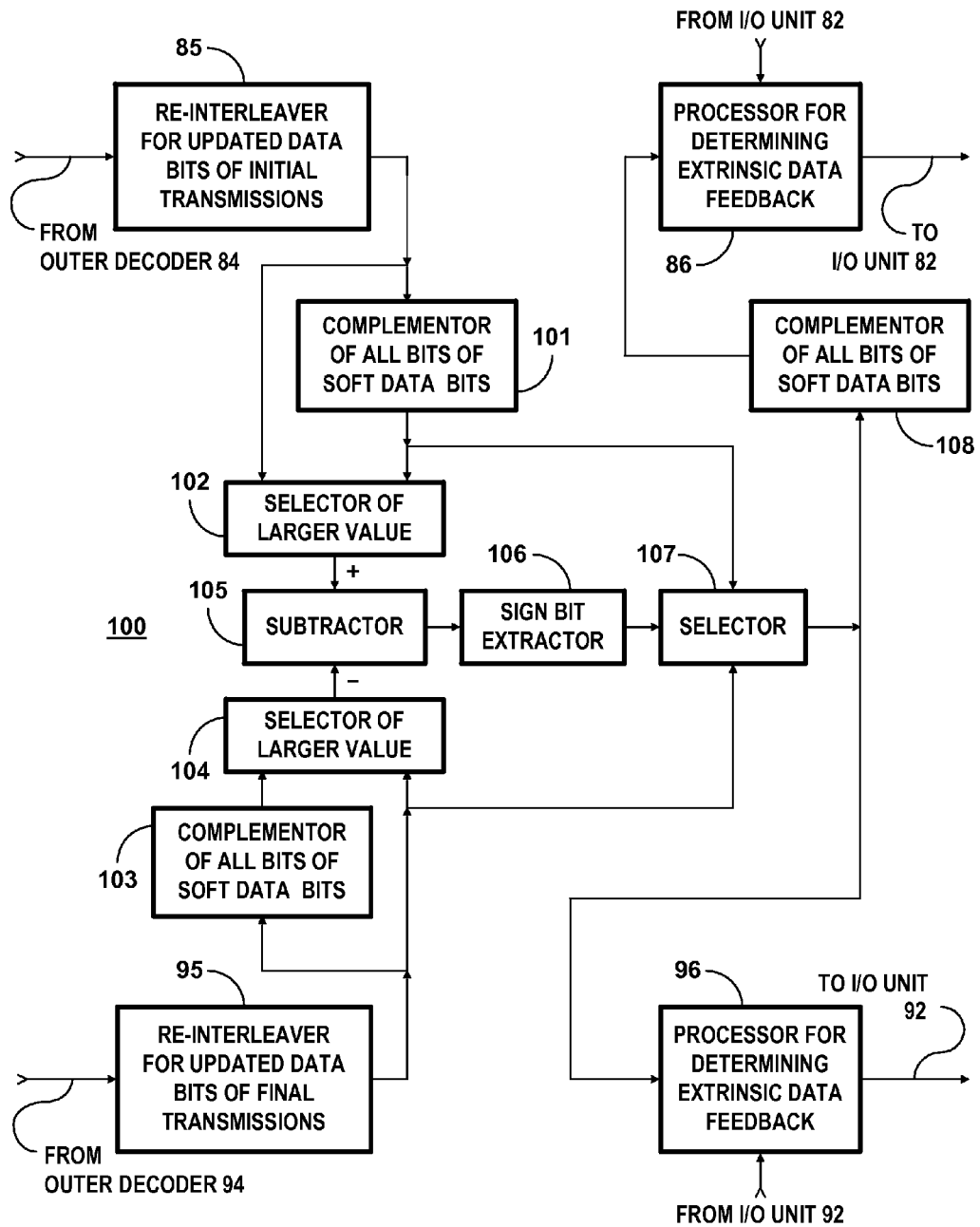
FIGS. 25 and 26 are detailed schematic diagrams of alternative specific embodiments of the portions of the FIG. 24 paired turbo decoders used for exchanging information between them concerning confidence levels of soft data bits.

FIG. 25 shows in more detail the FIG. 24 information-exchange unit 100 for exchanging information regarding data bits between the paired turbo decoding loops. The FIG. 25 information-exchange unit 100 is similar to the FIG. 22 information-exchange unit 100 except for being placed after, rather than before, the re-interleavers 85 and 86 in the paired turbo decoding loops.

FIG. 25 shows the output port of the re-interleaver 85 connected for supplying successive soft data bits to the complementor 101 of all of the bits in each successive soft bit. The selector 102 is connected for reproducing in its response the larger of each soft data bit supplied from the output port of the re-interleaver 85 and the complementary soft data bit supplied from the complementor 101. The confidence level bits reproduced by the selector 102 in its response are an absolute-value indication of the level of confidence that the soft data bit supplied from the output port of the re-interleaver 85 is correct.

FIG. 25 shows the output port of the re-interleaver 95 connected for supplying successive soft data bits to the complementor 103 of all of the bits in each successive soft bit. The selector 104 is connected for reproducing in its response the larger of each soft data bit supplied from the output port of the re-interleaver 95 and the complementary soft data bit supplied from the complementor 103. The confidence level bits reproduced by the selector 104 in its response are an absolute-value indication of the level of confidence that the soft data bit supplied from the output port of the re-interleaver 95 is correct.

The digital subtractor 105 is connected for receiving the responses of the selectors 102 and 103 as its minuend input signal and as its subtrahend input signal, respectively. The subtractor 105 is connected for supplying its difference output signal to the sign-bit extractor 106, and the sign-bit from the sign-bit extractor 106 is applied as control signal to the soft-data-bit selector 107. The soft-data-bit selector 107 is connected to receive, as one of its two input signals, the responses of the complementor 101 to the successive soft data bits from the output port of the re-interleaver 85. The soft-data-bit selector 107 is connected to receive, as the other of its two input signals, the successive soft data bits from the output port of the re-interleaver 95. The soft-data-bit selector 107 is connected to supply successively selected soft data bits to the complementor 108 of all of the bits in each successive soft bit. The complementor 108 is connected to supply the complementary soft data bit reproduced therefrom to one of the input ports of the processor 86 for determining extrinsic data feedback. The soft-data-bit selector 107 is connected to supply successively selected soft data bits to the input port of the processor 96 for determining extrinsic data feedback.

If the sign bit extracted by the sign-bit extractor 106 is positive, this indicates that the confidence level as to the correctness of the soft data bit from the output port of the re-interleaver 85 is better than the confidence level as to the correctness of the soft data bit from the output port of the re-interleaver 95. Responsive to this indication received as control signal, the soft-data-bit selector 107 is conditioned to reproduce from its output port the complementary soft data bit from the output port of the re-interleaver 85 as complemented by the complementor 101.

If the sign bit extracted by the sign-bit extractor 106 is negative, this indicates that the confidence level as to the correctness of the soft data bit from the output port of the re-interleaver 95 is better than the confidence level as to the correctness of the soft data bit from the output port of the re-interleaver 85. Responsive to this indication received as control signal, the soft-data-bit selector 107 is conditioned to reproduce from its output port the soft data bit from the output port of the re-interleaver 95.

Figure 26:
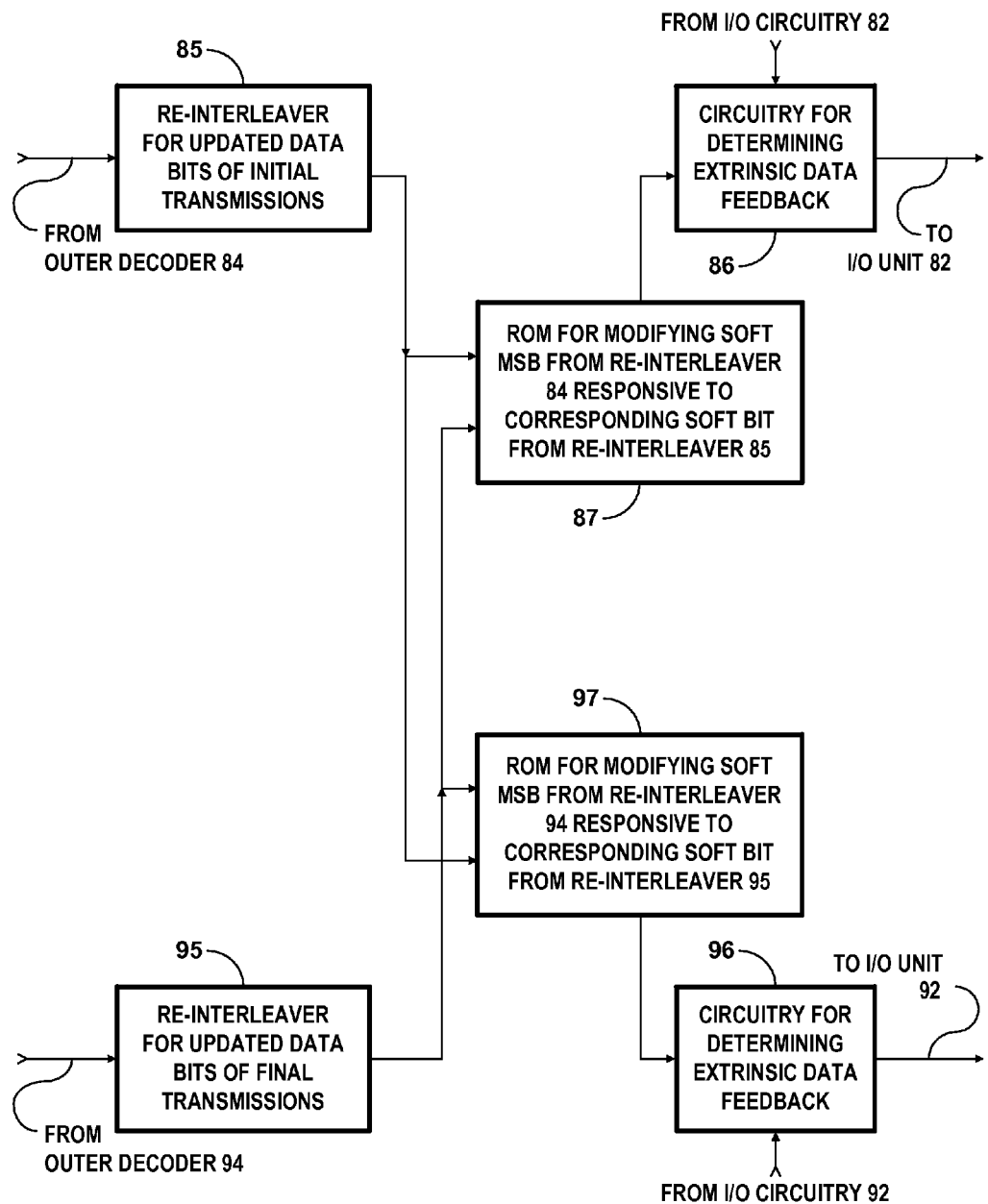

FIG. 26 shows an information-exchange unit that replaces the FIG. 25 information-exchange unit 100 for exchanging information regarding soft data bits between the two turbo decoders 80 and 90 in another specific embodiment of them arranged as shown in FIG. 24. This replacement circuitry comprises the read-only memories 87 and 97. The re-interleaver 85 is connected to supply soft bits of data to each of the ROMs 87 and 97 as a first half of its input addressing. The re-interleaver 95 is connected to supply soft bits of data to each of the ROMs 87 and 97 as a second half of its input addressing. The ROM 87 is connected to supply the soft data bits of its output response to the processor 86 for determining extrinsic data feedback. The output response of the ROM 87 modifies the re-interleaver 85 response received as the first half of its input address, the modification responding to the re-interleaver 95 response received as the second half of its input address. The ROM 97 is connected to supply the soft data bits of its output response to the processor 96 for determining extrinsic data feedback. The output response of the ROM 97 modifies the re-interleaver 95 response received as the second half of its input address, the modification responding to the re-interleaver 85 response received as the first half of its input address.

Figure 27:
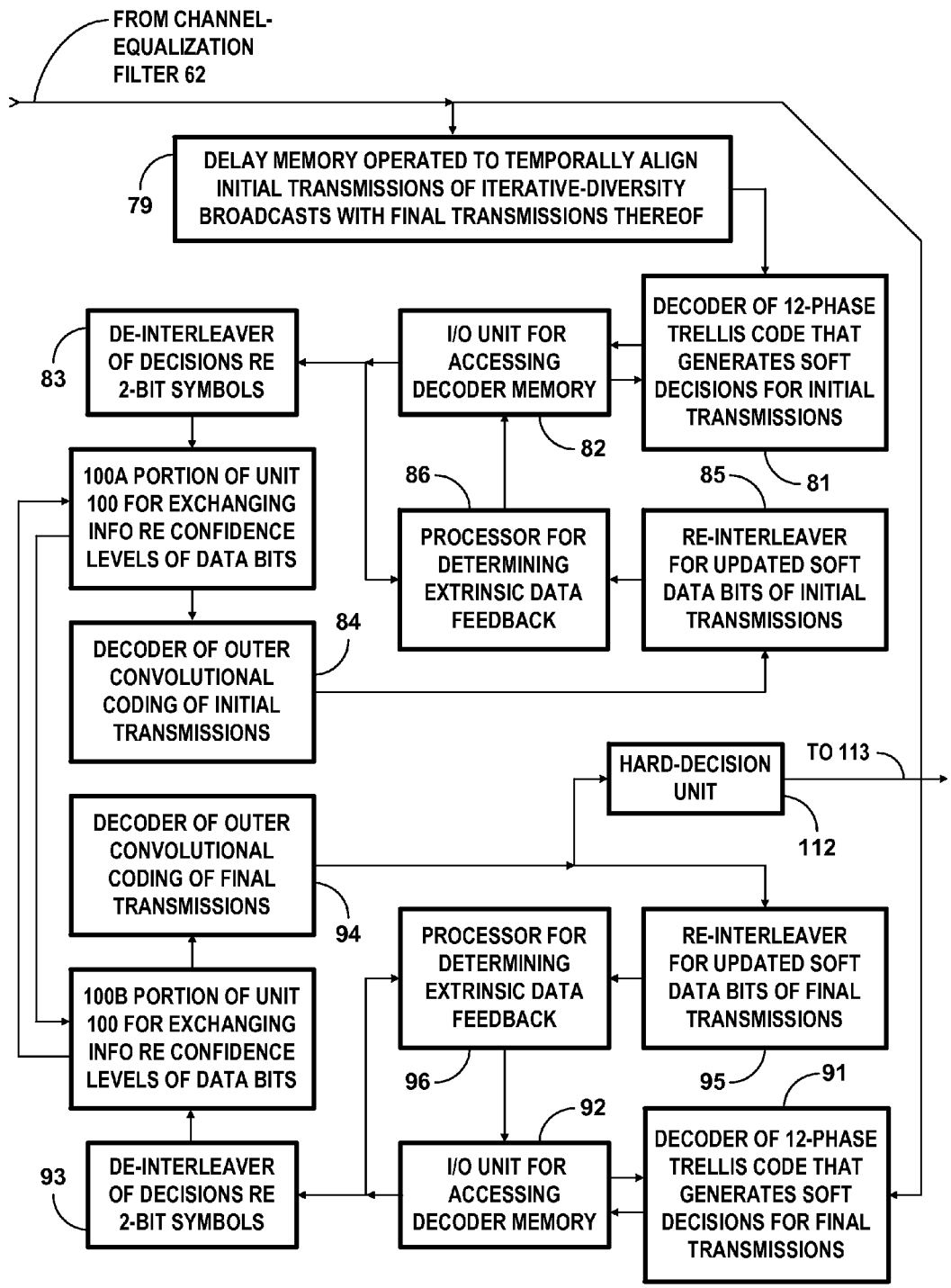
FIG. 27 is a schematic diagram of a third arrangement of the elements of paired turbo decoders shown in the FIG. 17B portion of the FIG. 17 receiver apparatus, which turbo decoders decode PCCC iterative-diversity transmissions.

FIG. 27 shows in some detail a third generic way to construct the FIG. 17B turbo decoders 80 and 90 for decoding iterative-diversity signals comprising component PCCC transmissions at respective code rates each one-third 8VSB symbol rate. The construction shown in FIG. 27 differs from that shown in FIG. 21 and from that shown in FIG. 24 with regard to the positioning of the information-exchange unit 100 within the paired turbo decoding loops. The information-exchange unit 100 is not connected within the turbo loop connections from the decoders 84 and 94 for outer convolutional coding back to the decoders 81 and 91 for inner convolutional coding. The output port of the decoder 84 is connected for supplying soft decisions regarding data bits to the input port of the re-interleaver 85. The output port of the decoder 94 is connected for supplying soft decisions regarding data bits to the input port of the re-interleaver 95. The output port of the re-interleaver 85 is connected to the feedback input port of the circuitry 86 for determining extrinsic data feed back to the input/output unit 82 of the trellis decoder 81. The output port of the re-interleaver 95 is connected to the feedback input port of the circuitry 96 for determining extrinsic data feed back to the input/output unit 82 of the trellis decoder 81.

FIG. 27 shows the output port of the de-interleaver 83 connected to supply 2-bit symbols concerning the initial ones of iterative-diversity transmissions to a portion 100A of the information-exchange unit 100 for exchanging information regarding data bits between the paired decoders 80 and 90 for turbo decoding the iterative transmissions. FIG. 27 shows the output port of the de-interleaver 93 connected to supply 2-bit symbols concerning the final ones of iterative-diversity transmissions to a portion 100B of the information-exchange unit 100. FIG. 27 shows the input port of the outer decoder 84 connected for receiving 2-bit symbols concerning the initial ones of iterative-diversity transmissions from the portion 100A of the information-exchange unit 100, as possibly modified in response to data bits from the final ones of iterative-diversity transmissions. FIG. 27 shows the input port of the outer decoder 94 connected for receiving 2-bit symbols concerning the final ones of iterative-diversity transmissions from the portion 100B of the information-exchange unit 100, as possibly modified in response to data bits from the initial ones of iterative-diversity transmissions.

Figure 28:
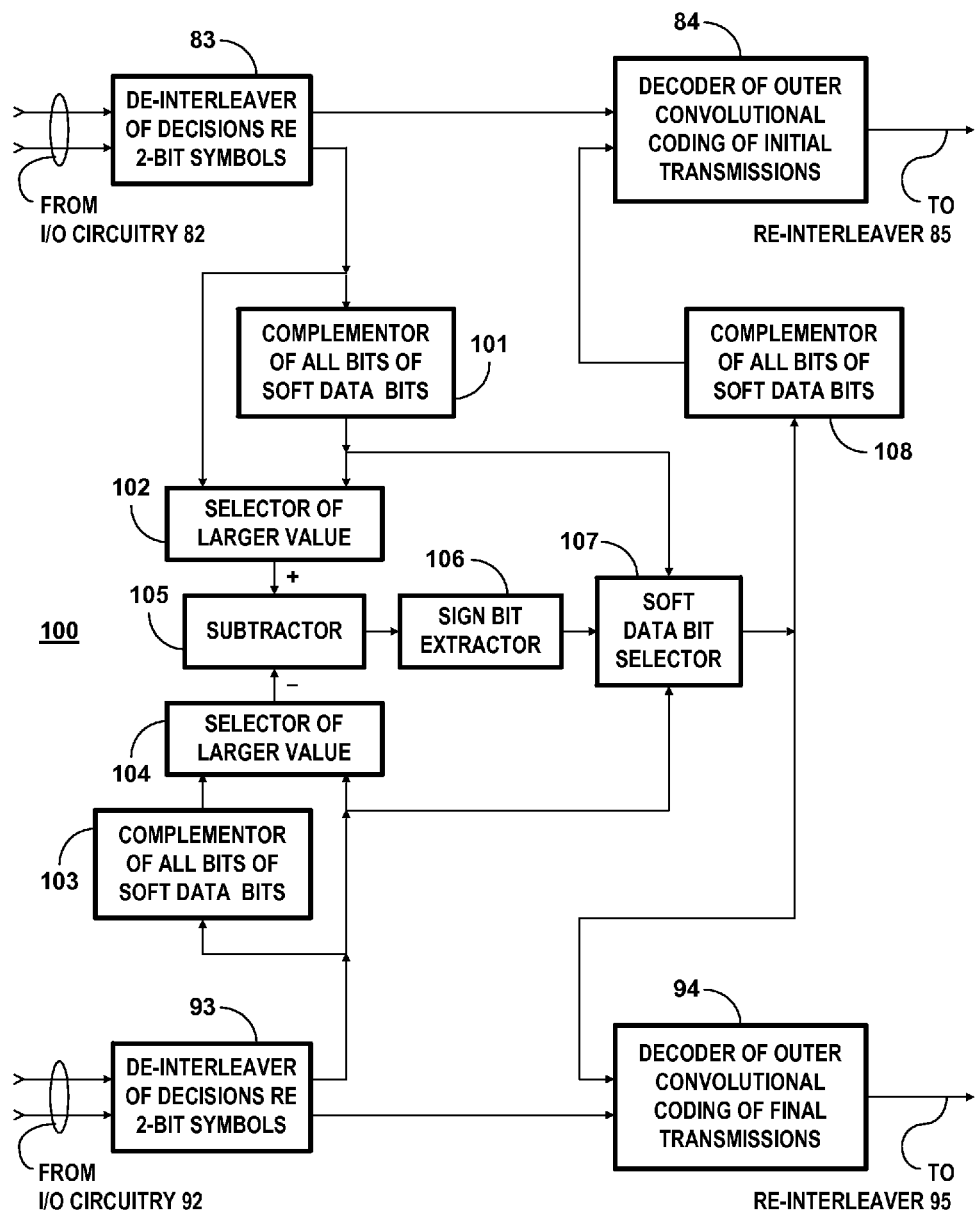
FIGS. 28 and 29 are detailed schematic diagrams of alternative specific embodiments of the portions of the FIG. 27 paired turbo decoders used for exchanging information between them concerning confidence levels of soft data bits.

FIG. 28 shows in more detail the FIG. 27 information-exchange unit 100 for exchanging information regarding data bits between the paired turbo loops of the turbo decoders 80 and 90. The FIG. 28 information-exchange unit 100 is similar to the FIG. 22 information-exchange unit 100 and to the FIG. 25 information-exchange unit 100 except for its placement within the paired turbo decoding loops.

FIG. 28 shows the output port of the de-interleaver 83 connected for supplying successive soft data bits to the complementor 101 of all of the bits in each successive soft bit. The selector 102 is connected for reproducing in its response the larger of each soft data bit supplied from the output port of the de-interleaver 83 and the complementary soft data bit supplied from the complementor 101. The confidence level bits reproduced by the selector 102 in its response are an absolute-value indication of the level of confidence that the soft data bit supplied from the output port of the de-interleaver 83 is correct.

FIG. 28 shows the output port of the de-interleaver 93 connected for supplying successive soft data bits to the complementor 103 of all of the bits in each successive soft bit. The selector 104 is connected for reproducing in its response the larger of each soft data bit supplied from the output port of the de-interleaver 93 and the complementary soft data bit supplied from the complementor 103. The confidence level bits reproduced by the selector 104 in its response are an absolute-value indication of the level of confidence that the soft data bit supplied from the output port of the de-interleaver 93 is correct.

The digital subtractor 105 is connected for receiving the responses of the selectors 102 and 103 as its minuend input signal and as its subtrahend input signal, respectively. The subtractor 105 is connected for supplying its difference output signal to the sign-bit extractor 106, and the sign-bit from the sign-bit extractor 106 is applied as control signal to the soft-data-bit selector 107. The soft-data-bit selector 107 is connected to receive, as one of its two input signals, the responses of the complementor 101 to the successive soft data bits from the output port of the de-interleaver 83. The soft-data-bit selector 107 is connected to receive, as the other of its two input signals, the successive soft data bits from the output port of the de-interleaver 93. The soft-data-bit selector 107 is connected to supply successively selected soft data bits to the complementor 108 of all of the bits in each successive soft bit. The complementor 108 is connected to supply the complementary soft data bit reproduced therefrom to one of the input ports of the decoder 84 for outer convolutional coding of initial-component transmissions for iterative diversity. The soft-data-bit selector 107 is connected to supply successively selected soft data bits to the input port of the decoder 94 for outer convolutional coding of single-time transmissions or of final-component transmissions for iterative diversity.

If the sign bit extracted by the sign-bit extractor 106 is positive, this indicates that the confidence level as to the correctness of the soft data bit from the output port of the de-interleaver 83 is better than the confidence level as to the correctness of the soft data bit from the output port of the de-interleaver 93. Responsive to this indication received as control signal, the soft-data-bit selector 107 is conditioned to reproduce from its output port the complementary soft data bit from the output port of the de-interleaver 83 as complemented by the complementor 101.

If the sign bit extracted by the sign-bit extractor 106 is negative, this indicates that the confidence level as to the correctness of the soft data bit from the output port of the de-interleaver 93 is better than the confidence level as to the correctness of the soft data bit from the output port of the de-interleaver 83. Responsive to this indication received as control signal, the soft-data-bit selector 107 is conditioned to reproduce from its output port the soft data bit from the output port of the de-interleaver 93.

The soft data bit that the soft-data-bit selector 107 reproduces is supplied as input signal to the decoder 94 for outer convolutional coding of single-time transmissions or of final-component transmissions for iterative diversity. The soft data bit that the soft-data-bit selector 107 reproduces is also supplied as input signal to the complementor 108 for being complemented before being supplied as input signal to the decoder 84 for outer convolutional coding of initial-component transmissions for iterative diversity.

Figure 29:
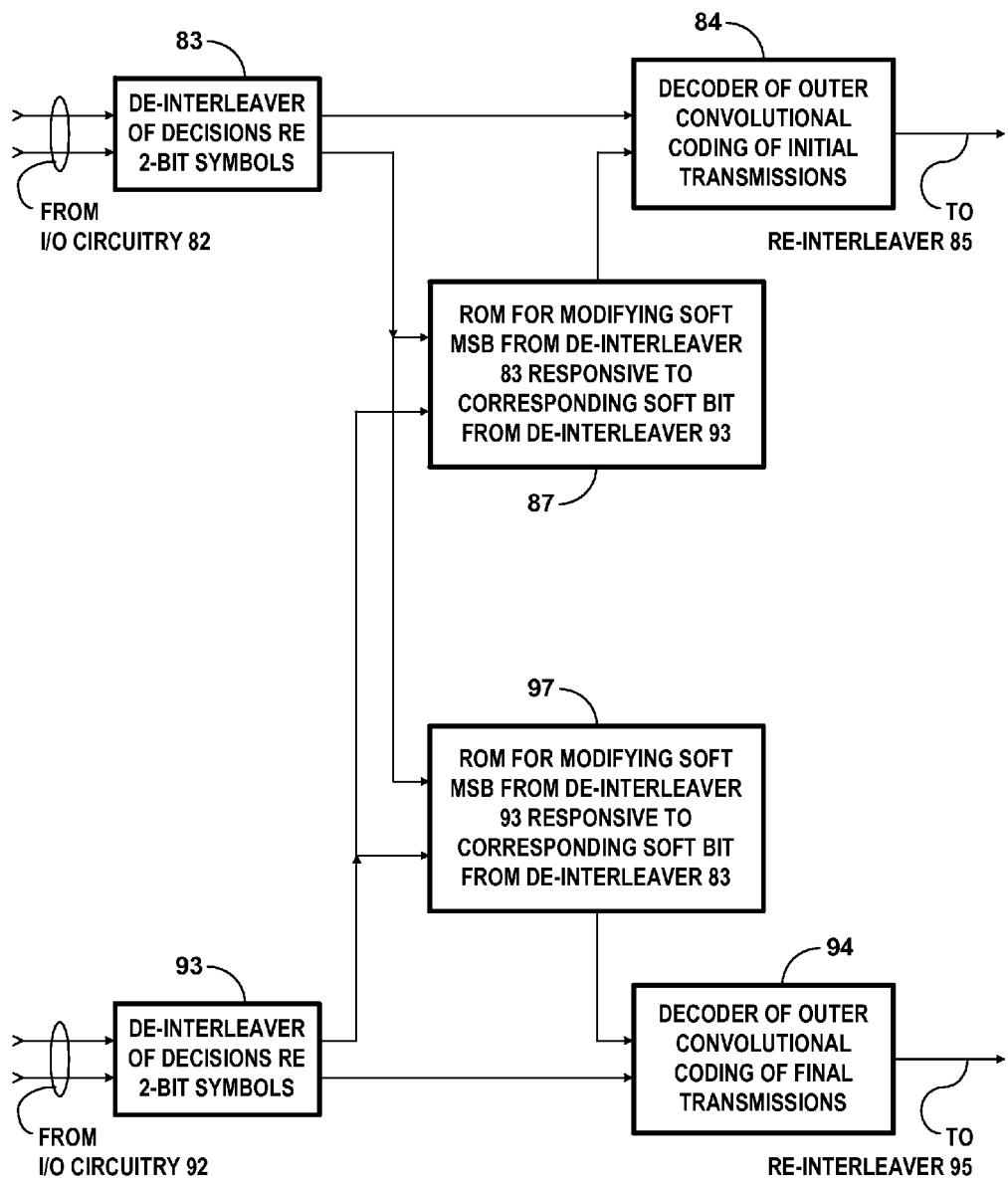

FIG. 29 shows an information-exchange unit that replaces the FIG. 28 information-exchange unit 100 for exchanging information regarding soft data bits between the two turbo decoders 80 and 90 in another specific embodiment of them arranged as shown in FIG. 27. This replacement circuitry comprises the read-only memories 87 and 97. The de-interleaver 83 is connected to supply soft bits of data to each of the ROMs 87 and 97 as a first half of its input addressing. The de-interleaver 93 is connected to supply soft bits of data to each of the ROMs 87 and 97 as a second half of its input addressing. The ROM 87 is connected to supply the soft data bits of its output response to the input port of the decoder 84 for outer convolutional coding of initial-component transmissions for iterative diversity. The output response of the ROM 87 modifies the de-interleaver 83 response received as the first half of its input address, the modification responding to the de-interleaver 93 response received as the second half of its input address. The ROM 97 is connected to supply the soft data bits of its output response to the input port of the decoder 94 for outer convolutional coding of single-time transmissions or of final-component transmissions for iterative diversity.

Figure 30:
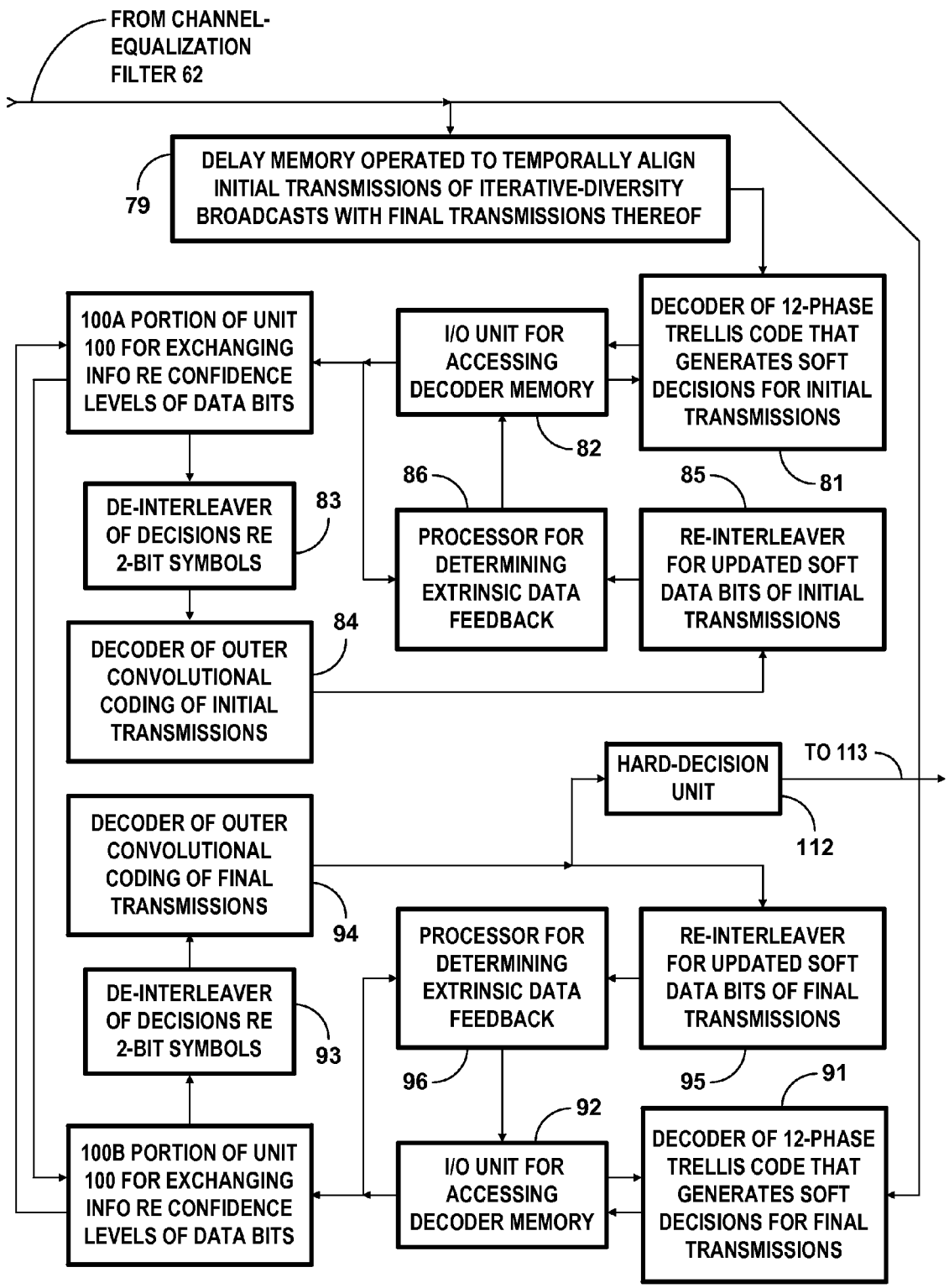
FIG. 30 is a schematic diagram of a fourth arrangement of the elements of paired turbo decoders shown in the FIG. 17B portion of the FIG. 17 receiver apparatus, which turbo decoders decode PCCC iterative-diversity transmissions.

FIG. 30 shows in some detail a fourth generic way to construct the FIG. 17B turbo decoders 80 and 90 for decoding iterative-diversity signals comprising component PCCC transmissions at respective code rates each one-third 8VSB symbol rate. The construction shown in FIG. 30 differs from that shown in FIG. 21, in FIG. 24 and in FIG. 27 with regard to the positioning of the information-exchange unit 100 for exchanging information regarding data bits between the paired turbo decoders 80 and 90. The output port of the de-interleaver 83 is connected for supplying 2-bit symbols of the outer convolutional coding of the initial transmissions to the input port of the outer decoder 84. The output port of the de-interleaver 93 is connected for supplying 2-bit symbols of the outer convolutional coding of the final transmissions to the input port of the outer decoder 94. The output port of the decoder 84 is connected for supplying soft decisions regarding 2-bit symbols of the outer convolutional coding of the initial transmissions to the input port of the re-interleaver 85. The output port of the decoder 94 is connected for supplying soft decisions regarding 2-bit symbols of the outer convolutional coding of the initial transmissions to the input port of the re-interleaver 95. The output port of the re-interleaver 85 is connected to the feedback input port of the circuitry 86 for determining extrinsic data feed back to the I/O unit 82 to the memory within the trellis decoder 81. The output port of the re-interleaver 95 is connected to the feedback input port of the circuitry 96 for determining extrinsic data feed back to the I/O unit 92 to the memory within the trellis decoder 91.

FIG. 30 shows the output port of the I/O unit 82 for memory within the trellis decoder 81 connected to supply 2-bit symbols concerning the initial ones of iterative-diversity transmissions to the portion 100A of the information-exchange unit 100 for exchanging information regarding data bits within the two loops for turbo decoding the iterative-diversity transmissions. FIG. 30 shows the output port of the I/O unit 92 for memory within the trellis decoder 91 connected to supply 2-bit symbols concerning the final ones of iterative-diversity transmissions to the portion 100B of the information-exchange unit 100. FIG. 30 shows the input port of the de-interleaver 83 connected for receiving 2-bit symbols concerning the initial ones of ID transmissions from the portion 100A of the information-exchange unit 100, as possibly modified in response to data bits from the final ones of iterative-diversity transmissions. FIG. 30 shows the input port of the de-interleaver 93 connected for receiving 2-bit symbols concerning the final ones of iterative-diversity transmissions from the portion 100B of the information-exchange unit 100, as possibly modified in response to data bits from the initial ones of iterative-diversity transmissions.

Figure 31:
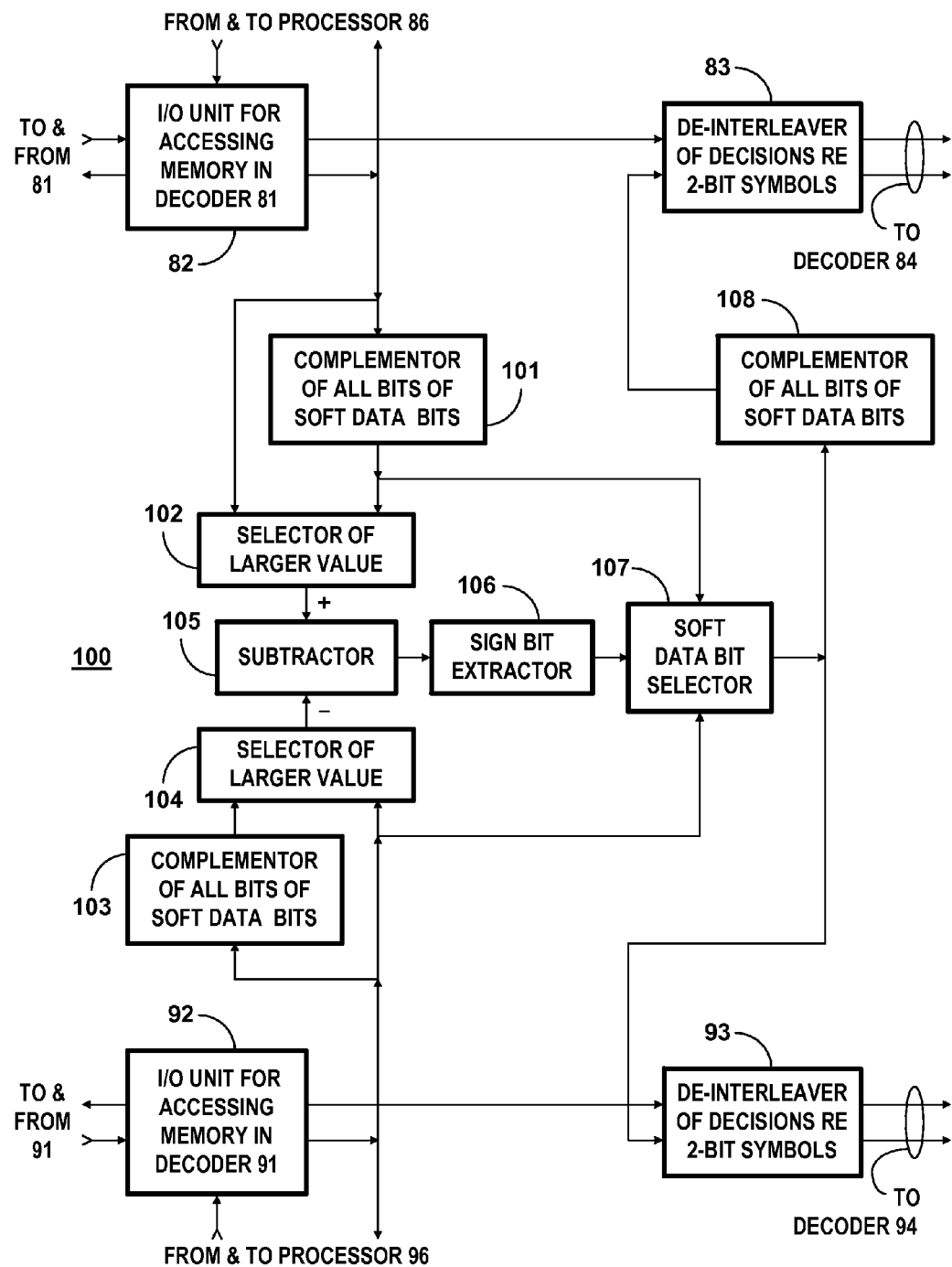
FIGS. 31 and 32 are detailed schematic diagrams of alternative specific embodiments of the portions of the FIG. 27 paired turbo decoders used for exchanging information between them concerning confidence levels of soft data bits.
Figure 32:
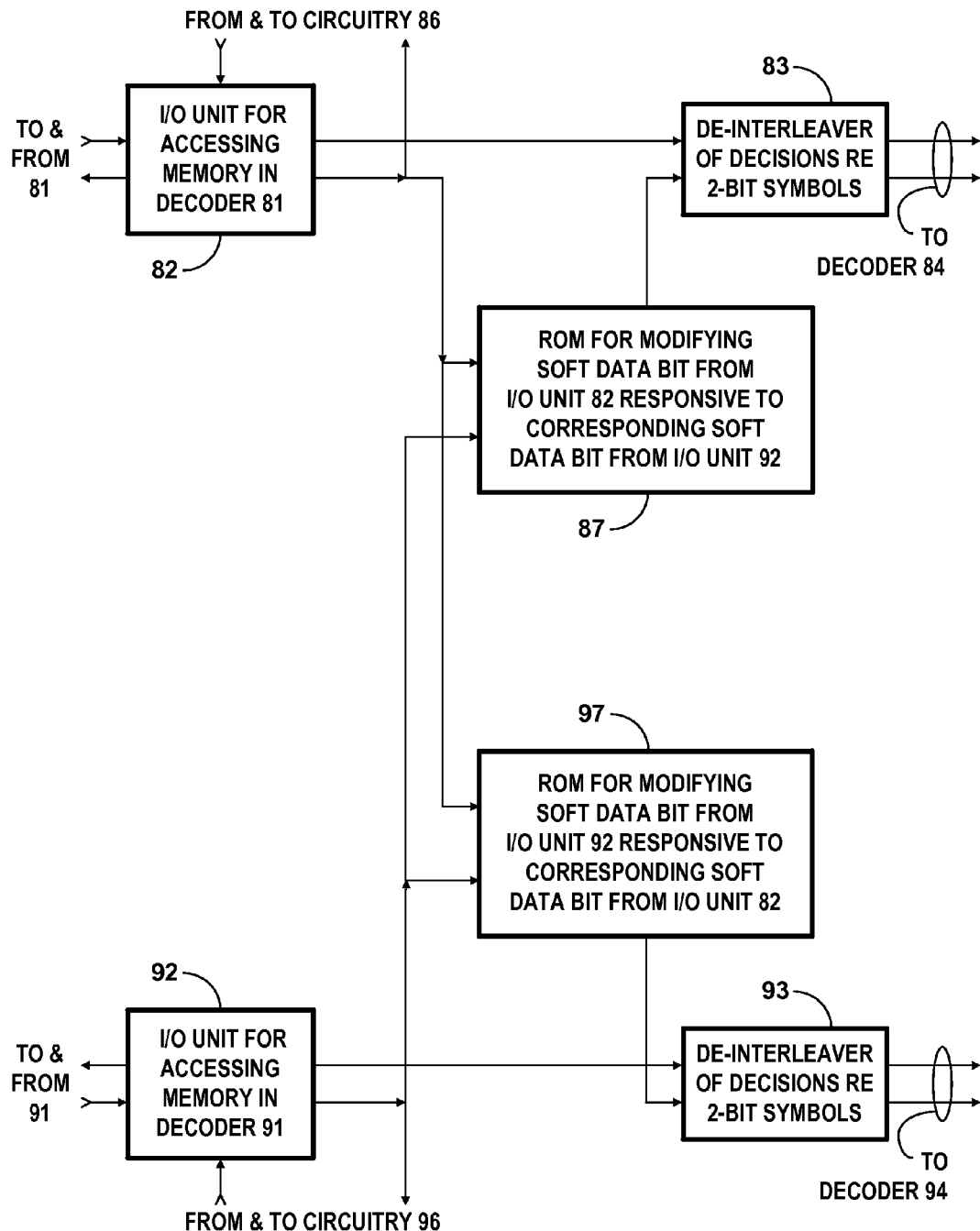

FIG. 31 shows in more detail the FIG. 30 information-exchange unit 100 for exchanging information regarding data bits between the paired turbo decoding loops of the turbo decoders 80 and 90. The FIG. 31 information-exchange unit 100 is similar to the information-exchange units 100 in FIGS. 22, 25 and 28 except for its placement within the paired turbo decoding loops.

During an initial portion of each cycle of turbo decoding, the input/output unit 82 for accessing memory in the decoder 81 supplies soft 2-bit symbols of interleaved outer convolutional coding. FIG. 31 shows the output port of the I/O unit 82 connected for applying the successive soft parity bits of the interleaved outer convolutional coding directly to the input port of the de-interleaver 83. FIG. 31 shows the output port of the I/O unit 82 further connected for supplying the successive soft data bits of the interleaved outer convolutional coding to the complementor 101 of all of the bits in each successive soft bit. The selector 102 is connected for reproducing in its response the larger of each soft data bit supplied from the output port of the I/O unit 82 and the complementary soft data bit supplied from the complementor 101. The confidence level bits reproduced by the selector 102 in its response are an absolute-value indication of the level of confidence that the soft data bit supplied from the output port of the I/O unit 82 is correct.

During an initial portion of each cycle of turbo decoding, the input/output unit 92 for accessing memory in the decoder 91 supplies soft 2-bit symbols of interleaved outer convolutional coding. FIG. 31 shows the output port of the I/O unit 92 connected for applying the successive soft parity bits of the interleaved outer convolutional coding directly to the input port of the de-interleaver 93. FIG. 31 shows the output port of the I/O unit 92 further connected for supplying successive soft data bits to the complementor 103 of all of the bits in each successive soft bit. The selector 104 is connected for reproducing in its response the larger of each soft data bit supplied from the output port of the de-interleaver 93 and the complementary soft data bit supplied from the complementor 103. The confidence level bits reproduced by the selector 104 in its response are an absolute-value indication of the level of confidence that the soft data bit supplied from the output port of the I/O unit 92 is correct.

The digital subtractor 105 is connected for receiving the responses of the selectors 102 and 103 as its minuend input signal and as its subtrahend input signal, respectively. The subtractor 105 is connected for supplying its difference output signal to the sign-bit extractor 106, and the sign-bit from the sign-bit extractor 106 is applied as control signal to the soft-data-bit selector 107. The soft-data-bit selector 107 is connected to receive, as one of its two input signals, the responses of the complementor 101 to the successive soft data bits from the output port of the I/O unit 82. The soft-data-bit selector 107 is connected to receive, as the other of its two input signals, the successive soft data bits from the output port of the I/O unit 92. The soft-data-bit selector 107 is connected to supply successively selected soft data bits to the complementor 108 of all of the bits in each successive soft bit. The complementor 108 is connected to supply the complementary soft data bit reproduced therefrom to the input port of the de-interleaver 83. The soft-data-bit selector 107 is connected to supply successively selected soft data bits to the input port of the de-interleaver 93.

If the sign bit extracted by the sign-bit extractor 106 is positive, this indicates that the confidence level as to the correctness of the soft data bit from the output port of the I/O unit 82 is better than the confidence level as to the correctness of the soft data bit from the output port of the I/O unit 93. Responsive to this indication received as control signal, the soft-data-bit selector 107 is conditioned to reproduce from its output port the complementary soft data bit from the output port of the I/O unit 82 as complemented by the complementor 101.

If the sign bit extracted by the sign-bit extractor 106 is negative, this indicates that the confidence level as to the correctness of the soft data bit from the output port of the I/O unit 92 is better than the confidence level as to the correctness of the soft data bit from the output port of the I/O unit 82. Responsive to this indication received as control signal, the soft-data-bit selector 107 is conditioned to reproduce from its output port the soft data bit from the output port of the I/O unit 92.

The soft data bit that the soft-data-bit selector 107 reproduces is supplied as input signal to the de-interleaver 93. The soft data bit that the soft-data-bit selector 107 reproduces is also supplied as input signal to the complementor 108 for being complemented before being supplied as input signal to the de-interleaver 83.

FIG. 29 shows an information-exchange unit that replaces the FIG. 28 information-exchange unit 100 for exchanging information regarding soft data bits between the two turbo decoders 80 and 90 in another specific embodiment of them arranged as shown in FIG. 30. This replacement circuitry comprises the read-only memories 87 and 97. The output port of the I/O unit 82 for memory within the decoder 81 is connected to supply soft bits of data to each of the ROMs 87 and 97 as a first half of its input addressing. The output port of the I/O unit 92 for memory within the trellis decoder 91 is connected to supply soft bits of data to each of the ROMs 87 and 97 as a second half of its input addressing. The ROM 87 is connected to supply its output response as soft-data-bit signal applied to the input port of the de-interleaver 83. The output response of the ROM 97 modifies the I/O unit 82 response received as the first half of its input address, the modification responding to the I/O unit 92 response received as the second half of its input address. The ROM 97 is connected to supply its output response as a soft-data-bit signal applied to the input port of the de-interleaver 93. The output response of the ROM 97 modifies the input/output unit 92 response received as the second half of its input address, the modification responding to the I/O unit 82 response received as the first half of its input address.

Figure 33:
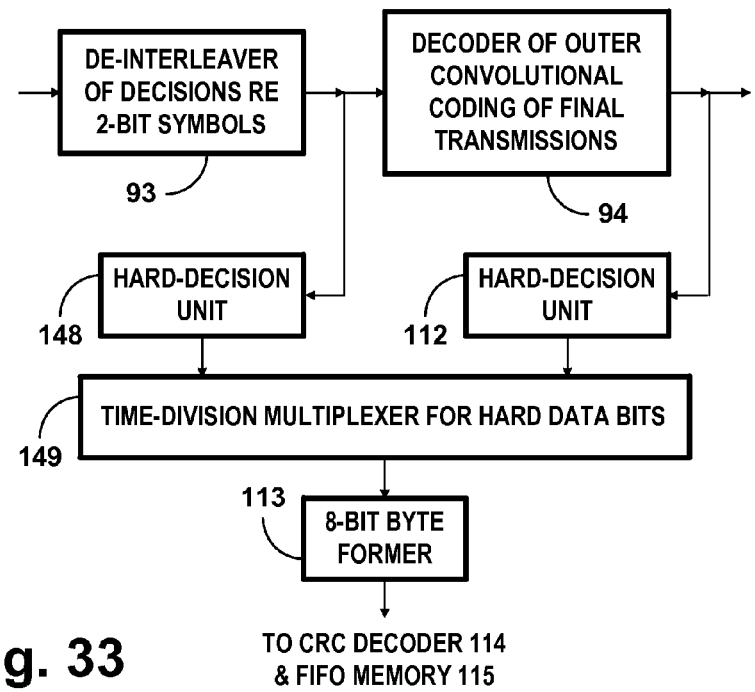
FIG. 33 is a schematic diagram of an alternative arrangement for extracting hard decoding results from the paired turbo decoders in FIGS. 21, 24 and 30

FIG. 33 shows an alternative arrangement for extracting hard decoding results from the paired turbo decoders 80 and 90 in FIGS. 21, 24 and 30. The outer decoders 84 and 94 are operated in parallel during a later portion of each cycle of turbo decoding, following an earlier portion of the cycle during which the inner decoders 81 and 91 are operated in parallel. When the turbo decoder 90 decodes PCCC, the data bits are updated by the inner decoders 81 and 91 during the earlier portion of each cycle of turbo decoding, as well as during the later portion of each cycle. So, the data bits supplied by the inner decoders 81 and 91, as deinterleaved for application to the outer decoders 84 and 94, update any data bits supplied by the outer decoders 84 and 94 during the later portion of an immediately previous cycle. Accordingly, the turbo decoding procedure can be halted midway through a cycle of turbo decoding if bit error rate (BER) is sufficiently reduced. FIG. 33 shows the output port of the de-interleaver 93 connected for supplying de-interleaved soft decisions concerning 2-bit symbols to the input port of a hard-decision unit 148, which connection may in actuality omit the soft parity bits of those soft decisions. A time-division multiplexer 149 is operated for reproducing the hard data stream from a selected one of the hard-decision units 112 and 148 for application to the 8-bit byte former shown in FIG. 17B.

Figure 34:
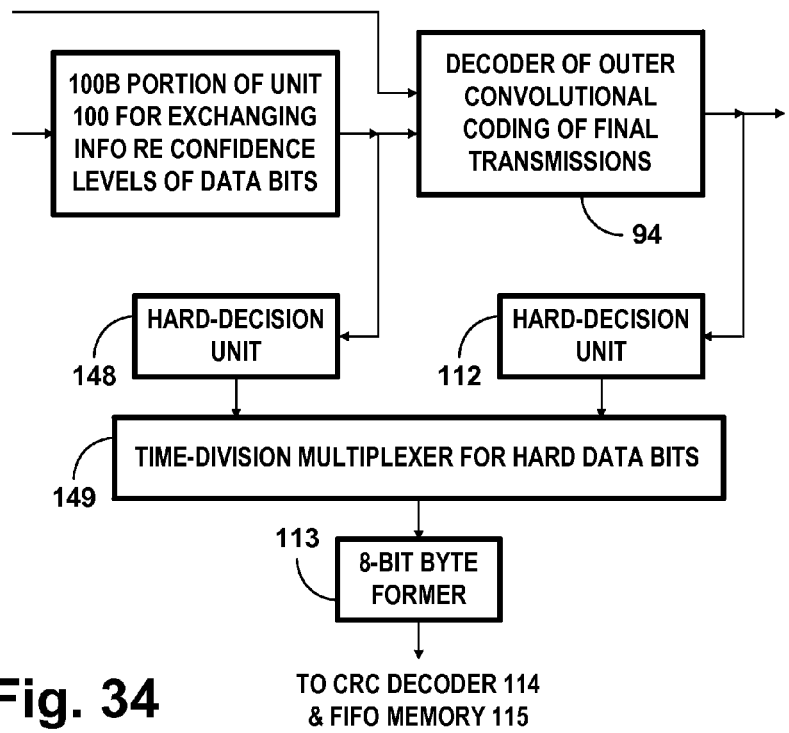
FIG. 34 is a schematic diagram of an alternative arrangement for extracting hard decoding results from the paired turbo decoders in FIG. 27.

FIG. 34 is a schematic diagram of an alternative arrangement for extracting hard decoding results from the paired turbo decoders in FIG. 27. FIG. 34 shows the hard-decision unit 148 connected for receiving soft data bits from the output port of the information-exchange unit 100 that supplies soft data bits to the input port of the outer decoder 94. The time-division multiplexer 149 is operated for reproducing the hard data stream from a selected one of the hard-decision units 112 and 148 for application to the 8-bit byte former shown in FIG. 17B.

Figure 35:
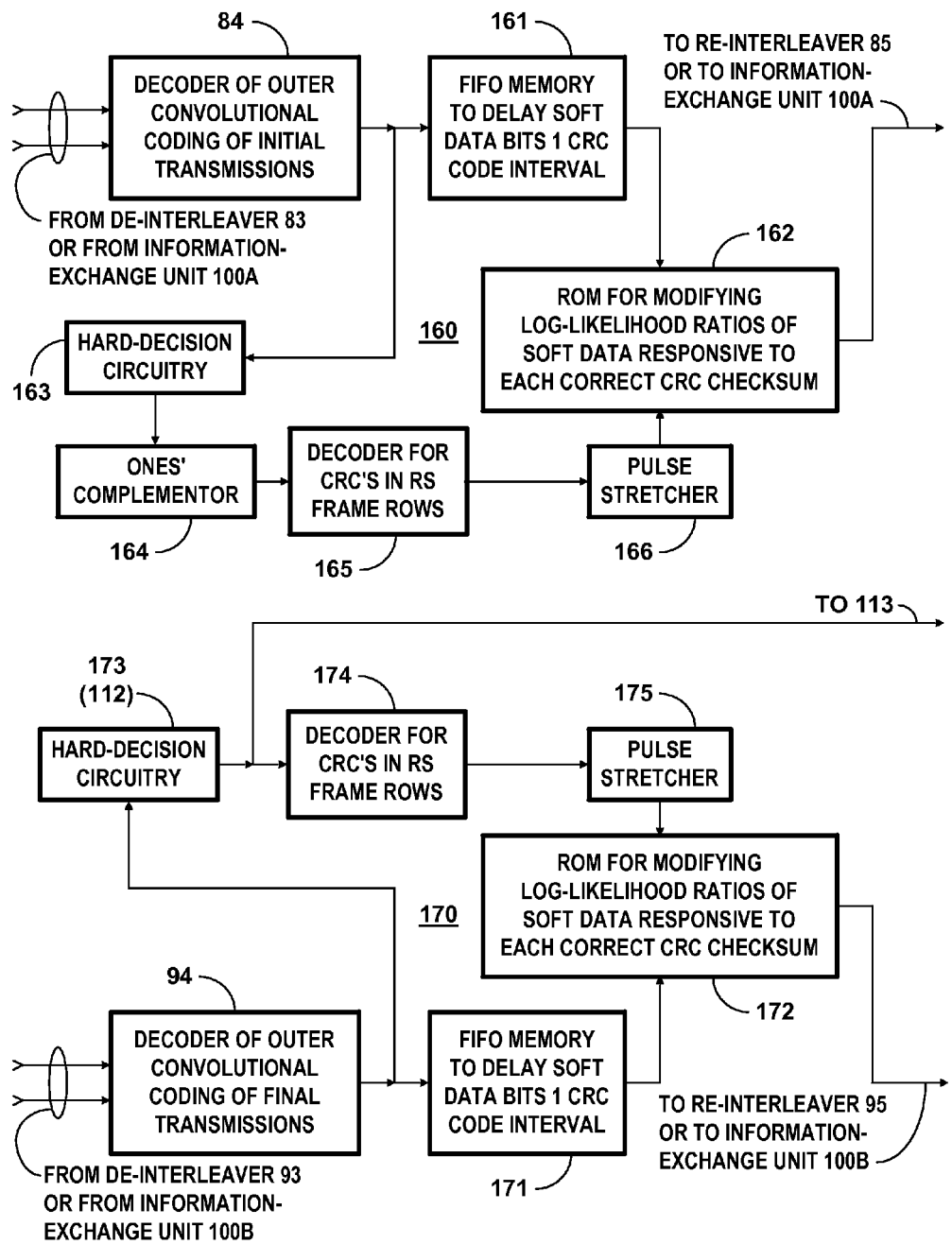
FIGS. 35, 36, 37 and 38 are schematic diagrams of modifications to the paired turbo decoders diagrammed in FIGS. 21, 24, 27 and 30, which modifications provide for updating the confidence levels of soft data bits indicated to be correct in the results of decoding cyclic redundancy check (CRC) coding.

FIG. 35 shows how CRC decoding can be used to modify the confidence levels of soft data bits supplied from the outer decoders 84 and 94 of any of the embodiments of the FIG. 17B portion of receiver apparatus shown in FIG. 21, 24, 27 or 30. Apparatus 160 comprises elements 161, 162, 163, 164, 165 and 166. Apparatus 170 comprises elements 171, 172, 173, 174 and 175. The soft parity bits of 2-bit symbols of outer convolutional coding are not fed back from the outer decoders 84 and 94 to the inner decoders 81 and 91 when turbo decoding PCCC, so FIG. 35 does not show any output connection for these soft parity bits. The outer decoders 84 and 94 feed back soft data bits of outer convolutional coding to the inner decoders 81 and 91, however. The soft data bits of outer convolutional coding from the outer decoder 84 are ones' complements of the soft data bits of outer convolutional coding from the outer decoder 94 and need to be one's complemented in order to decode the CRC coding contained therein.

In FIG. 35 the apparatus 160 modifies the confidence levels of soft (complementary) data bits supplied from the outer decoder 84 responsive to the decoding of CRC codewords contained within the rows of bytes in the RS Frames for the initial-component transmissions for iterative diversity. After a delay as long as the time taken for decoding each of the CRC codewords, a first-in/first-out memory 161 reproduces the soft (complementary) data bits supplied from the outer decoder 84 and supplies them to a read-only memory 162 as partial input addressing thereto. The ROM 162 is used to modify the confidence levels of those soft (complementary) data bits. The soft complemented data bits written to the FIFO memory 161 as input addressing are also applied as input signal to hard-decision unit 163. The hard-decision unit 163 responds to supply (complementary) data bits to a ones' complementor 164. The ones' complementor 164 responds to supply data bits to the input port of a decoder 165 for the cyclic-redundancy-check coding of CRC codewords contained in complemented form within each row of bytes in each successive RS Frame for those initial-component transmissions for iterative diversity. The decoder 165 includes input circuitry therein for converting the data bits received serially from the ones' complementor 164 to 16-parallel-bit format for the CRC decoding procedures. The decoder 165 is connected for supplying the CRC decoding result to a pulse stretcher 166. The pulse stretcher 166 reproduces the CRC decoding result for the duration of a CRC codeword read from the FIFO memory 161 and is connected for applying that reproduced CRC decoding result to the ROM 162 for completing its input addressing. If the decoder 165 does not detect any error in the CRC codeword, the decoder 165 supplies a ONE to the pulse stretcher 166. The stretched-in-time ONE from the pulse stretcher 166 conditions the ROM 162 to increase the confidence levels of the soft (complementary) data bits in the CRC codeword as supplied from the ROM 162 to the re-interleaver 85 or to the information-exchange unit 100A. If the decoder 165 detects error in the CRC codeword, the decoder 165 supplies a ZERO to the pulse stretcher 166. The stretched-in-time ZERO from the pulse stretcher 166 conditions the ROM 162 to leave unaltered the confidence levels of the soft (complementary) data bits in the CRC codeword as supplied from the ROM 162 to the re-interleaver 85 or to the information-exchange unit 100A.

In FIG. 35 the apparatus 170 modifies the confidence levels of soft data bits supplied from the outer decoder 94 responsive to CRC decoding of CRC codewords contained within the rows of bytes in the RS Frames for the final-component transmissions for iterative diversity. After a delay as long as the time taken for decoding each of the CRC codewords, a first-in/first-out memory 171 reproduces the soft data bits supplied from the outer decoder 94 and supplies them to a read-only memory 172 as partial input addressing thereto. The ROM 172 is used to modify the confidence levels of those soft data bits. The soft data bits written to the FIFO memory 171 as input addressing are also applied as input signal to hard-decision unit 173. The hard-decision unit 173 responds to supply data bits as the input signal to the input port of a decoder 174 for the cyclic-redundancy-check coding of CRC codewords contained within each row of bytes in each successive RS Frame for the initial-component transmissions for iterative diversity. The decoder 174 includes input circuitry therein for converting the data bits received serially from the hard-decision unit 173 to 16-parallel-bit format for the CRC decoding procedures. The decoder 174 is connected for supplying the CRC decoding result to a pulse stretcher 175. The pulse stretcher 175 reproduces the CRC decoding result for the duration of a CRC codeword read from the FIFO memory 171 and is connected for applying that reproduced CRC decoding result to the ROM 172 for completing its input addressing. If the decoder 174 does not detect any error in the CRC codeword, the decoder 174 supplies a ONE to the pulse stretcher 175. The stretched-in-time ONE from the pulse stretcher 175 conditions the ROM 172 to increase the confidence levels of the soft data bits in the CRC codeword as supplied from the ROM 172 to the re-interleaver 95 or to the information-exchange unit 100B. If the decoder 174 detects error in the CRC codeword, the decoder 174 supplies a ZERO to the pulse stretcher 175. The stretched-in-time ZERO from the pulse stretcher 175 conditions the ROM 172 to leave unaltered the confidence levels of the soft data bits in the CRC codeword as supplied from the ROM 172 to the re-interleaver 95 or to the information-exchange unit 100B.

Figure 36:
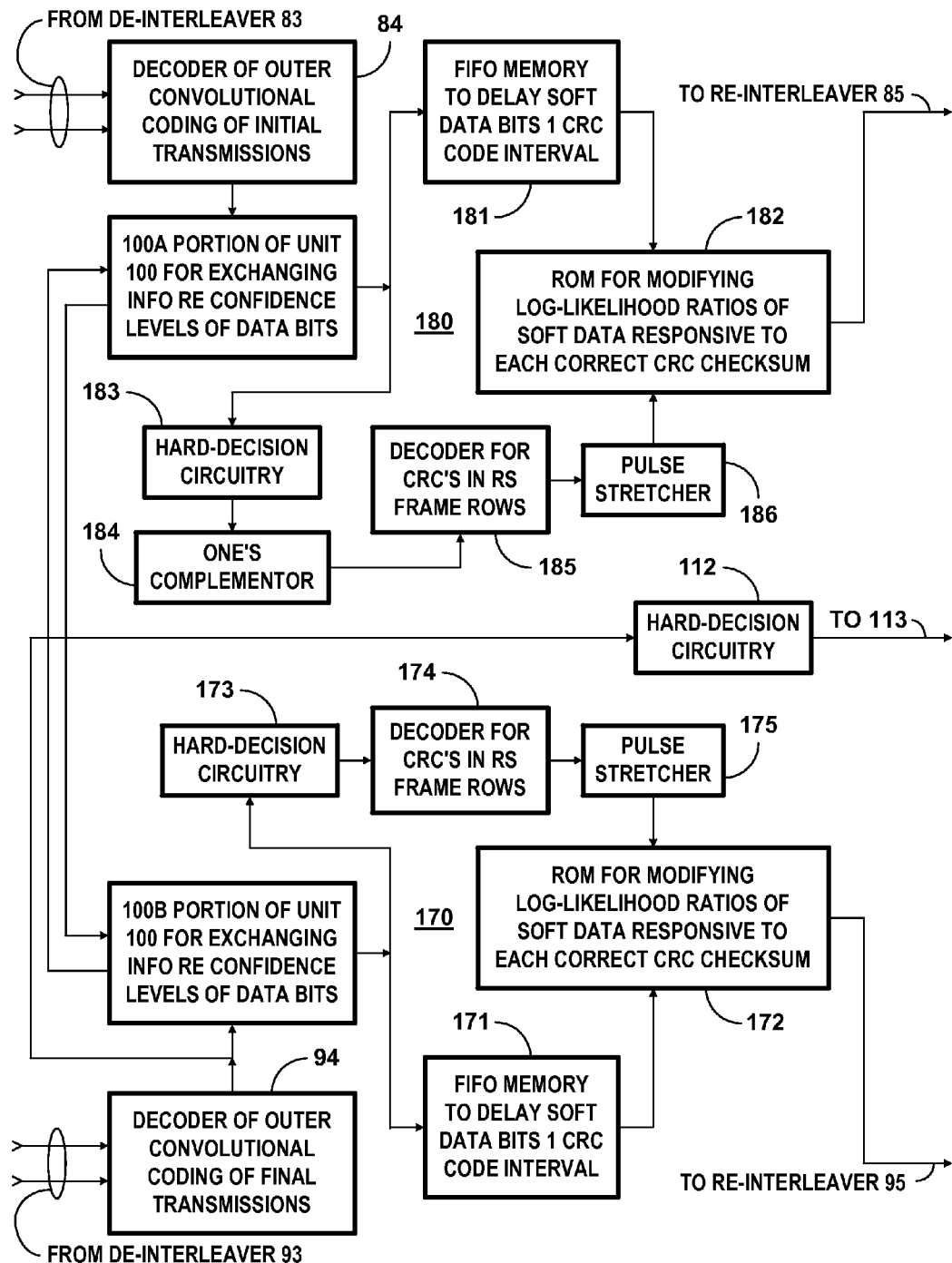

FIG. 36 shows a modification of the FIG. 21 turbo decoding circuitry for iterative-diversity reception, which modification relocates the apparatuses 160 and 170 from what is shown in FIG. 35. FIG. 36 shows the portion 100A of the information-exchange unit 100 for exchanging information between turbo decoding loops being connected for receiving soft data bits from the output port of the outer decoder 84 and for supplying soft data bits with adjusted confidence levels to the apparatus 160. The apparatus 160 is apt to adjust further the confidence levels of the soft data bits it reproduces for application to the input port of the re-interleaver 85, which further adjustments are made responsive to CRC decoding results. FIG. 36 shows the portion 100B of the information-exchange unit 100 for exchanging information between turbo decoding loops being connected for receiving soft data bits from the output port of the outer decoder 94 and for supplying soft data bits with adjusted confidence levels to the apparatus 170. The apparatus 170 is apt to adjust further the confidence levels of the soft data bits it reproduces for application to the input port of the re-interleaver 95, which further adjustments are made responsive to CRC decoding results.

Figure 37:
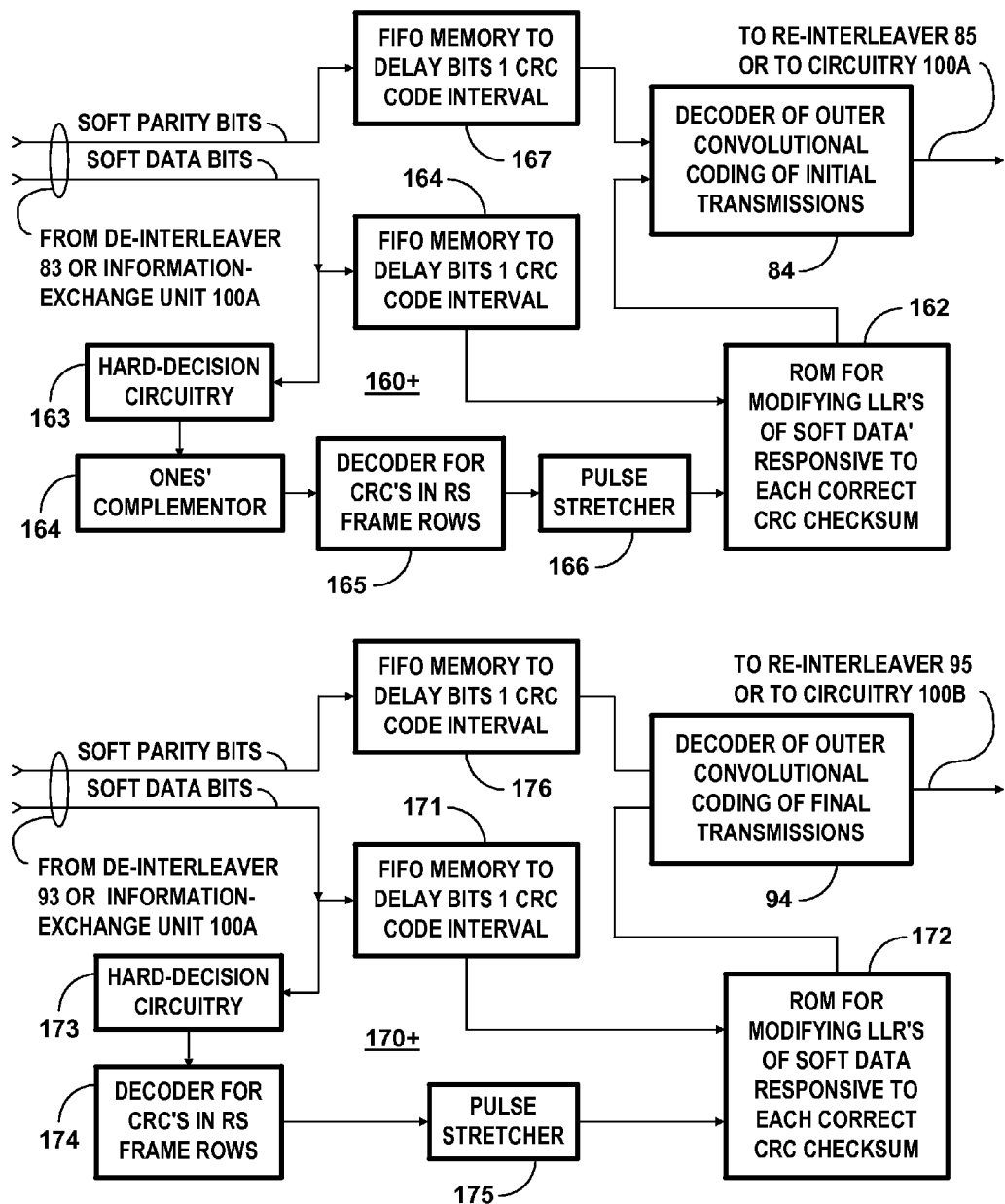

FIG. 37 shows how CRC decoding can be used to modify the confidence levels of soft data bits supplied to the outer decoders 84 and 94 of any of the embodiments of the FIG. 17B portion of receiver apparatus shown in FIG. 21, 24, 27 or 30. The apparatuses 160+ and 170+ for performing these modifications are located before the decoders 84 and 94 of outer convolutional coding, respectively, rather than after them. The apparatus 160+ is similar to the apparatus 160 described supra, but further comprises a FIFO memory 167 for delaying the soft parity bits applied to the input port of the outer decoder 84, either from the output port of the de-interleaver 83 or from the output port of the information-exchange unit 100A. This delay compensates for the latent delay of the soft (complementary) data bits in the path through the FIFO memory 161 and the ROM 162. The apparatus 170+ is similar to the apparatus 170 described supra, but further comprises a FIFO memory 176 for delaying the soft parity bits applied to the input port of the outer decoder 94, either from the output port of the de-interleaver 93 or from the output port of the information-exchange unit 100B. This delay compensates for the latent delay of the soft (complementary) data bits in the path through the FIFO memory 171 and the ROM 172.

In FIG. 37 the apparatus 160+ modifies the confidence levels of soft data bits supplied from the output port of the de-interleaver 83, either directly or via the portion 100A of the information-exchange unit 100 for exchanging information between turbo decoding loops. The modifications are made responsive to decoding of CRC codewords contained within rows of bytes in the RS Frames for the initial components of iterative-diversity transmissions. The FIFO memory 161 delays the soft data bits supplied from the de-interleaver 83 as partial input addressing to the ROM 162 used to modify their confidence levels, the delay being for the duration of a CRC codeword. The soft data bits written to the FIFO memory 161 as input addressing are also applied as input signal to the hard-decision unit 163. The hard-decision unit 163 responds to supply (complementary) data bits to a ones' complementor 164. The ones' complementor 164 responds to supply data bits to the input port of a decoder 165 for the cyclic-redundancy-check coding of CRC codewords contained in complemented form within each row of bytes in each successive RS Frame for those initial-component transmissions for iterative diversity. The decoder 165 includes input circuitry therein for converting the data bits received serially from the ones' complementor 164 to 16-parallel-bit format for the CRC decoding procedures. The decoder 165 is connected for supplying the CRC decoding result to the pulse stretcher 166. The pulse stretcher 166 reproduces the CRC decoding result for the duration of a CRC codeword read from the FIFO memory 161 and is connected for applying that reproduced CRC decoding result to the ROM 162 for completing its input addressing. If the decoder 165 does not detect any error in the CRC codeword, the decoder 165 supplies a ONE to the pulse stretcher 166. The stretched-in-time ONE from the pulse stretcher 166 conditions the ROM 162 to increase the confidence levels of the soft (complementary) data bits in the CRC codeword as supplied from the ROM 162 to the input port of the outer decoder 84. If the decoder 165 detects error in the CRC codeword, the decoder 165 supplies a ZERO to the pulse stretcher 166. The stretched-in-time ZERO from the pulse stretcher 166 conditions the ROM 162 to leave unaltered the confidence levels of the soft (complementary) data bits in the CRC codeword as supplied from the ROM 162 to the input port of the outer decoder 84.

The apparatus 170+ modifies the confidence levels of soft data bits supplied to the outer decoder 94 responsive to CRC decoding of decoding of CRC codewords contained within rows of bytes in the RS Frames for the final-component transmissions for iterative diversity. The FIFO memory 171 delays the soft data bits supplied as partial input addressing to the ROM 172 used to modify their confidence levels, the delay being for the duration of a CRC codeword. The soft data bits written to the FIFO memory 171 as input addressing are also applied as input signal to the hard-decision unit 173. The hard-decision unit 173 responds to supply data bits as the input signal to the input port of the decoder 174 for the CRC coding of parity bytes in each successive RS Frame for the final-component transmissions for iterative diversity. The decoder 174 includes input circuitry therein for converting the data bits received serially from the hard-decision unit 173 to 16-parallel-bit format for the CRC decoding procedures. The decoder 174 is connected for supplying the CRC decoding result to the pulse stretcher 175. The pulse stretcher 175 reproduces the CRC decoding result for the duration of a CRC codeword read from the FIFO memory 171 and is connected for applying that reproduced CRC decoding result to the ROM 172 for completing its input addressing. If the decoder 174 does not detect any error in the CRC codeword, the decoder 174 supplies a ONE to the pulse stretcher 175. The stretched-in-time ONE from the pulse stretcher 175 conditions the ROM 172 to increase the confidence levels of the soft (complementary) data bits in the CRC codeword as supplied from the ROM 172 to the input port of the outer decoder 84. If the decoder 174 detects error in the CRC codeword, the decoder 174 supplies a ZERO to the pulse stretcher 175. The stretched-in-time ZERO from the pulse stretcher 175 conditions the ROM 172 to leave unaltered the confidence levels of the soft (complementary) data bits in the CRC codeword as supplied from the ROM 172 to the input port of the outer decoder 94.

Figure 38:
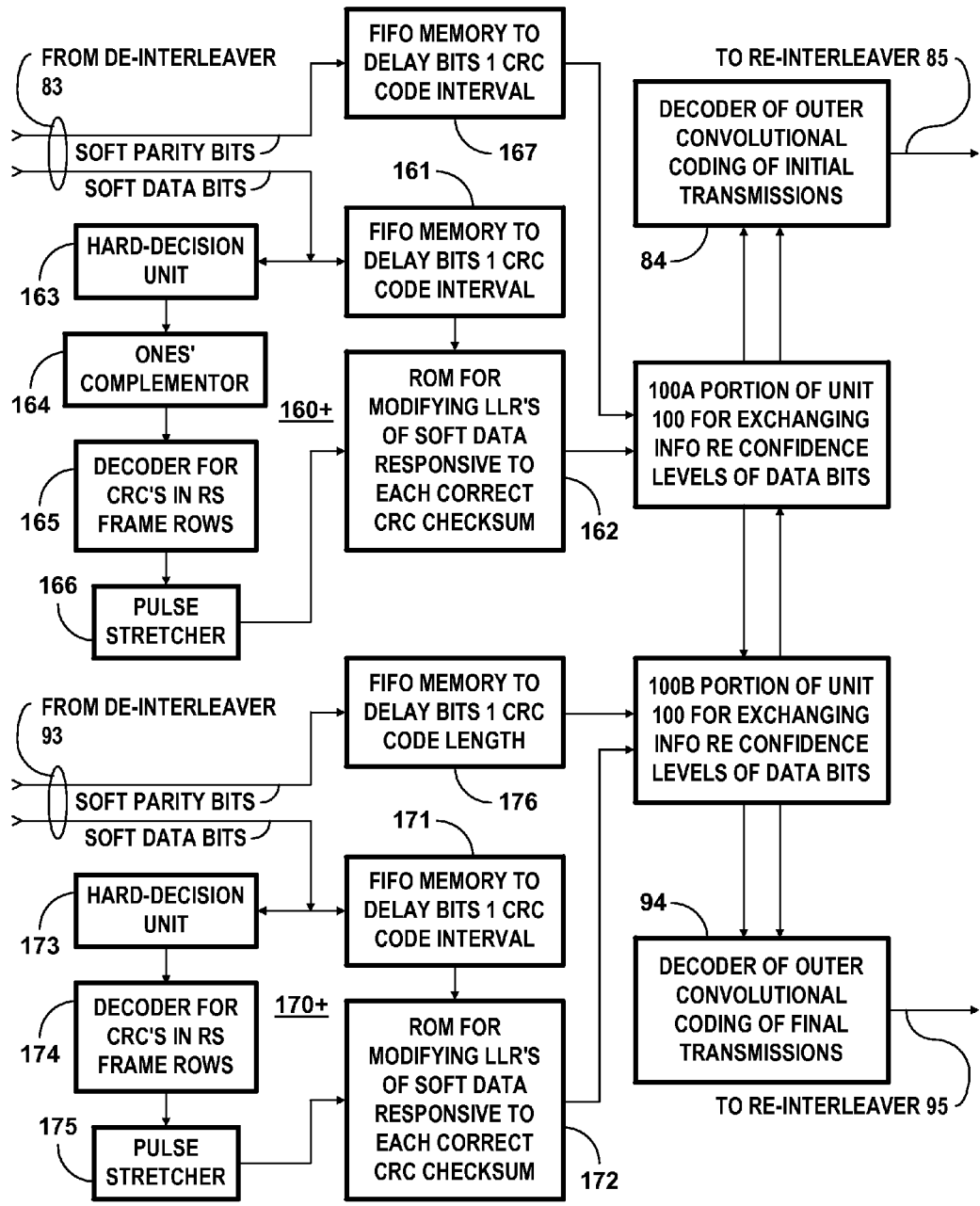

FIG. 38 shows a modification of the FIG. 27 turbo decoding circuitry for iterative diversity reception. This modification relocates the apparatuses 160+ and 170+ from what FIG. 37 shows.

In FIG. 38 the apparatus 160+ reproduces soft data bits supplied to it from the output port of the de-interleaver 83. However, the apparatus 160+ is apt to modify the confidence levels of certain ones of those soft data bits before reproducing them, which modifications are made responsive to decoding of CRC codewords contained in the rows of bytes in the RS Frames for the initial-component transmissions for iterative diversity. In FIG. 38 the apparatus 160+ is connected for supplying the soft data bits of its response to the portion 100A of the information-exchange unit 100 as input signal thereto. FIG. 38 shows the input port of the outer decoder 84 connected for receiving soft bits descriptive of 2-bit symbols of the outer convolutional coding of the initial-component transmissions for iterative diversity from the portion 100A of the information-exchange unit 100 for exchanging information between turbo decoding loops. In FIG. 38 the FIFO memory 167 is re-connected for delaying the soft parity bits applied to the input port of the portion 100A of the information-exchange unit 100. The FIFO memory 167 compensates for the latent delay of the soft data bits in the path through the FIFO memory 161 and the ROM 162.

In FIG. 38 the apparatus 170+ reproduces soft data bits supplied to it from the output port of the de-interleaver 93. However, the apparatus 170 is apt to modify the confidence levels of certain ones of those soft data bits before reproducing them, which modifications are made responsive to CRC decoding of CRC codewords contained in the rows of bytes in the RS Frames for the final-component transmissions for iterative diversity. In FIG. 38 the apparatus 170+ is connected for supplying the soft data bits of its response to the portion 100B of the information-exchange unit 100 as input signal thereto. FIG. 38 shows the input port of the outer decoder 94 connected for receiving soft bits descriptive of 2-bit symbols of the outer convolutional coding of the initial-component transmissions for iterative diversity from the portion 100B of the information-exchange unit 100 for exchanging information between turbo decoding loops. In FIG. 38 the FIFO memory 176 is re-connected for delaying the soft parity bits applied to the input port of the portion 100B of the information-exchange unit 100. The FIFO memory 176 compensates for the latent delay of the soft data bits in the path through the FIFO memory 171 and the ROM 172.

FIGS. 39-52 of the drawing relate to receivers for iterative-diversity transmissions employing SCCC. These receivers employ the information-exchange unit 100 together with paired turbo decoders 180 and 190. The turbo decoder 180 comprises elements 181-186, and the turbo decoder 190 comprises elements 191-196. Some preliminary comments concerning the turbo decoders 180 and 190 will be made before considering their being coupled together by the information-exchange unit 100. The ⅔ trellis coding used in component SCCC transmissions at respective code rates each one-third 8VSB symbol rate is the same as used in component PCCC transmissions at respective code rates each one-third 8VSB symbol rate. Accordingly, the decoders 181 and 191 shown in FIGS. 39, 42, 45 and 48 are similar to the decoders 81 and 91 shown in FIGS. 21, 24, 27 and 30, except for the decoders 181 and 191 having re-interleaved soft decisions with regard to complete 2-bit symbols fed back to them. The soft parity bits of those 2-bit symbols are fed back to the decoders 81 and 91 rather than just the soft data bits from those symbols. FIGS. 39, 42, 45 and 48-50 show input/output units 182 and 192 for accessing the memories of the decoders 181 and 191. To accommodate complete 2-bit symbols being fed back to the decoders 181 and 191, the I/O units 182 and 192 differ slightly from the I/O units 82 and 92 shown in FIGS. 21, 24, 27 and 30-32. FIGS. 39, 42 and 45-50 show symbol de-interleavers 183 and 193 for soft decisions from the decoders 181 and 191, which de-interleavers 183 and 193 can be similar to the symbol de-interleavers 83 and 93 shown in FIGS. 21, 24 and 27-32.

FIGS. 39, 42, 45 and 48 show decoders 184 and 194 for outer convolutional coding that differ, at least in the manner of their connections, from the decoders 84 and 94 shown in FIGS. 21, 24, 27 and 30. The decoders 181, 191, 184 and 194 may be of types that use SOVA for evaluating code trellises, but preferably are of types that use the log-MAP algorithm for such evaluations. Referring back to FIG. 5, the outer convolutional coding for component PCCC transmissions at respective code rates each one-third 8VSB symbol rate is transmitted with a respective parity bit preceding a respective data bit in each 2-bit symbol supplied for ⅔ trellis coding. Referring back to FIG. 4, the outer convolutional coding for component SCCC transmissions at respective code rates each one-third 8VSB symbol rate is instead transmitted with a respective data bit preceding a respective parity bit in each 2-bit symbol supplied for ⅔ trellis coding. The decoders 184 and 194 have respective input ports each connected for receiving de-interleaved soft decisions accordingly. The decoder 184 is connected for receiving soft symbols of outer convolutional coding from the decoder 181 after their de-interleaving by the symbol de-interleaver 183. The soft parity bits in these de-interleaved symbols were directly involved in the trellis decoding procedures within the decoder 181. However, the soft data bits in these de-interleaved symbols were affected by the trellis decoding procedures within the decoder 181 only owing to their being included with the soft parity bits in 2-bit symbols relating to initial data-slicing procedures within the decoder 181. The decoder 194 is connected for receiving soft symbols of outer convolutional coding from the decoder 191 after their de-interleaving by the symbol de-interleaver 193. The soft parity bits in these de-interleaved symbols were directly involved in the trellis decoding procedures within the decoder 191. However, the soft data bits in these de-interleaved symbols were affected by the trellis decoding procedures within the decoder 191 only owing to their being included with the soft parity bits in 2-bit symbols relating to initial data-slicing procedures within the decoder 191.

The SISO decoder 184 for outer convolutional coding supplies successive soft decisions with regard to complete 2-bit symbols to a symbol re-interleaver 185 to be re-interleaved to the order of those symbols as they were most recently supplied from the SISO decoder 181 for two-thirds-rate trellis coding. A processor 186 combines re-interleaved soft decisions from the symbol re-interleaver 185 with the soft decisions most recently supplied from the SISO decoder 181 to determine the extrinsic data to be fedback to memory within the SISO decoder 181 as accessed via the I/O unit 182.

The SISO decoder 194 for outer convolutional coding supplies successive soft decisions with regard to complete 2-bit symbols to a symbol re-interleaver 195 to be re-interleaved to the order of those symbols as they were most recently supplied from the SISO decoder 191 for two-thirds-rate trellis coding. A processor 196 combines re-interleaved soft decisions from the symbol re-interleaver 195 with the soft decisions most recently supplied from the SISO decoder 191 to determine the extrinsic data to be fedback to memory within the SISO decoder 191 as accessed via the I/O unit 192.

Figure 39:
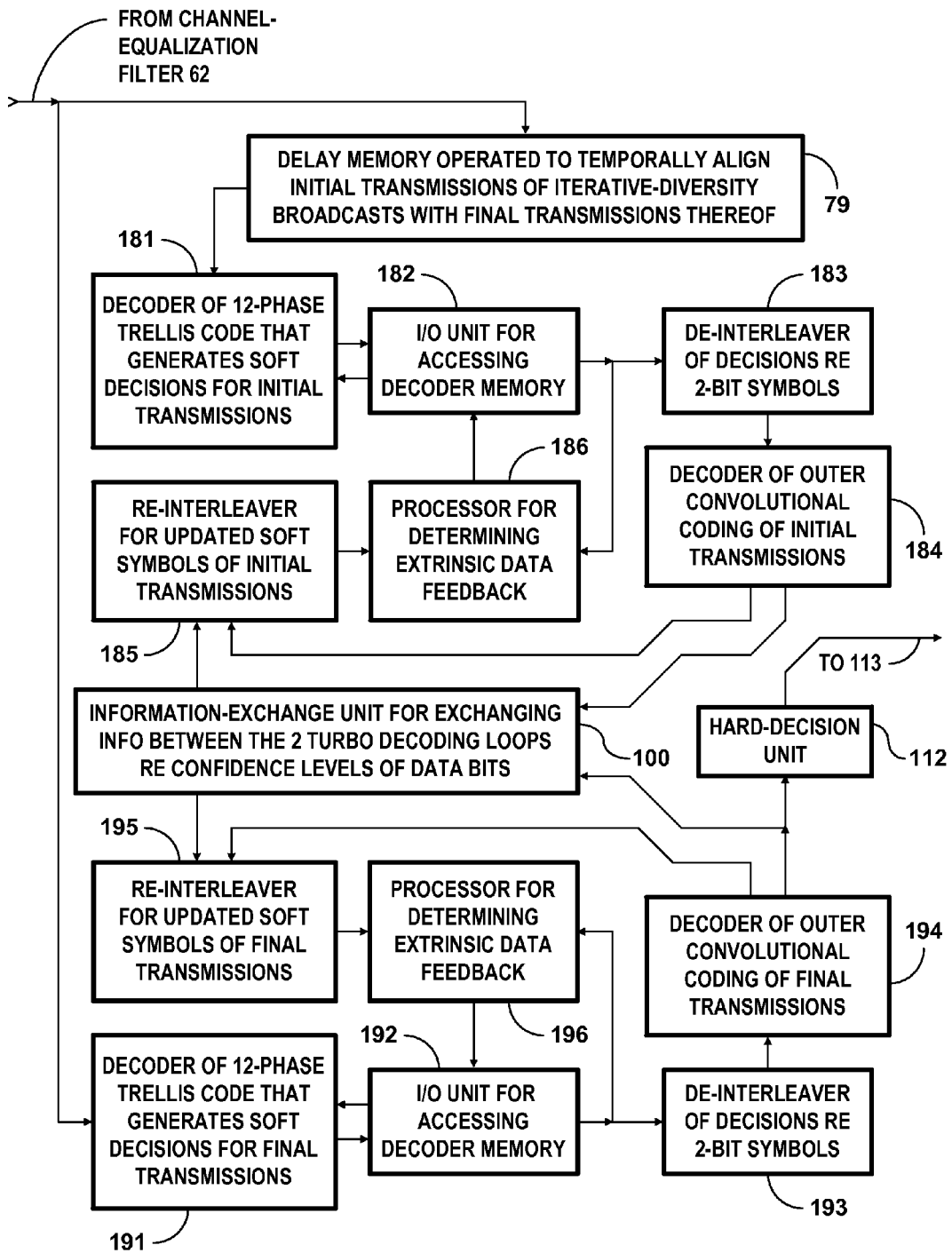
FIG. 39 is a schematic diagram of a fifth arrangement of the elements of paired turbo decoders shown in the FIG. 17B portion of the FIG. 17 receiver apparatus, which turbo decoders decode SCCC iterative-diversity transmissions.

FIG. 39 shows in some detail a first generic way to construct the FIG. 17B turbo decoders 180 and 190 for decoding iterative-diversity signals comprising component SCCC transmissions at respective code rates each one-third 8VSB symbol rate. The FIFO delay memory 79 is written with the initial-component transmissions of iteratively transmitted data that appear in the response of the channel-equalization filter 62, temporarily storing each of them until the corresponding final-component transmission of that data appears in the response of the channel-equalization filter 62. Each initial-component transmission of data is then read to provide input signal to the decoder 181 for 12-phase trellis coding that is contemporaneous with the corresponding final-component transmission of that data being applied as input signal to the decoder 191 for 12-phase trellis coding.

The decoder 181 for 12-phase trellis coding decodes the inner convolutional coding of the initial-component transmissions for iterative-diversity reception and has an I/O unit 182 for communicating with memory within the decoder 181. The decoder 181 supplies soft decisions concerning the interleaved outer convolutional coding of the initial transmissions via its I/O unit 182 to the input port of the symbol de-interleaver 183. The output port of the symbol de-interleaver 183 is connected for supplying de-interleaved soft decisions concerning the initial transmissions to the decoder 184 for the one-half-rate outer convolutional coding.

The decoder 191 for 12-phase trellis coding decodes the inner convolutional coding of the final transmissions for iterative-diversity reception and has an I/O unit 192 for communicating with memory within the decoder 191. The decoder 191 supplies soft decisions concerning the interleaved outer convolutional coding of the final transmissions via its I/O unit 192 to the input port of the symbol de-interleaver 193. The output port of the symbol de-interleaver 193 is connected for supplying de-interleaved soft decisions concerning the final transmissions to the decoder 194 for the one-half-rate outer convolutional coding.

The decoders 184 and 194 for outer convolutional coding are similar soft-input, soft-output (SISO) decoders the output ports of which are connected to feed back the portions of their respective soft decisions concerning data bits to the information-exchange unit 100. The output ports of the decoders 184 and 194 are further connected to feed back the portions of their respective soft decisions concerning parity bits the input ports of the symbol interleavers 185 and 195, respectively, by-passing information-exchange unit 100. The information-exchange unit 100 exchanges information regarding soft data bits between the turbo decoders 180 and 190. Then, based on the exchanged information, the information-exchange unit 100 adjusts those soft data bits before forwarding them to the input ports of symbol re-interleavers 185 and 195. The symbol re-interleaver 185 re-interleaves the soft data bits from the information-exchange unit 100 together with related soft parity bits to provide re-interleaved turbo feedback signal to be used in iterated operation of the turbo decoder 180. The symbol re-interleaver 195 re-interleaves the soft data bits from the information-exchange unit 100 together with related soft parity bits to provide re-interleaved turbo feedback signal to be used in iterated operation of the turbo decoder 180.

A processor 186 for determining extrinsic data feed back to the I/O unit 182 of the trellis decoder 181 is connected for receiving re-interleaved soft symbols from the output port of the symbol re-interleaver 185. The processor 186 is further connected for receiving the original soft decisions of the trellis decoder 181 as extracted from memory in the decoder 181 via its I/O unit 182. The processor 186 calculates the extrinsic data as the difference between the soft decisions in these input signals. The processor 186 is connected for supplying the extrinsic data to the I/O unit 182 to be relayed back to the memory within the trellis decoder 181 that temporarily stores input data samples.

A processor 196 for determining extrinsic data feed back to the I/O unit 192 of the trellis decoder 191 is connected for receiving re-interleaved soft symbols from the output port of the symbol re-interleaver 195. The processor 196 is further connected for receiving the original soft decisions of the trellis decoder 191s as extracted from memory in the decoder 191 via its I/O unit 192. The processor 196 calculates the extrinsic data from these input signals and is connected for supplying the extrinsic data to the I/O unit 192 to be relayed back to the memory within the trellis decoder 191 that temporarily stores input data samples.

Hard-decision unit 112 has an input port connected for receiving soft decisions from the output port of the decoder 194 for the outer convolutional coding of the final ones of iterative transmissions of data. The hard-decision unit 112 has an output port connected for supplying the 8-bit byte former 113 shown in FIG. 17B with hard decisions generated in respect to data bits.

Figure 40:
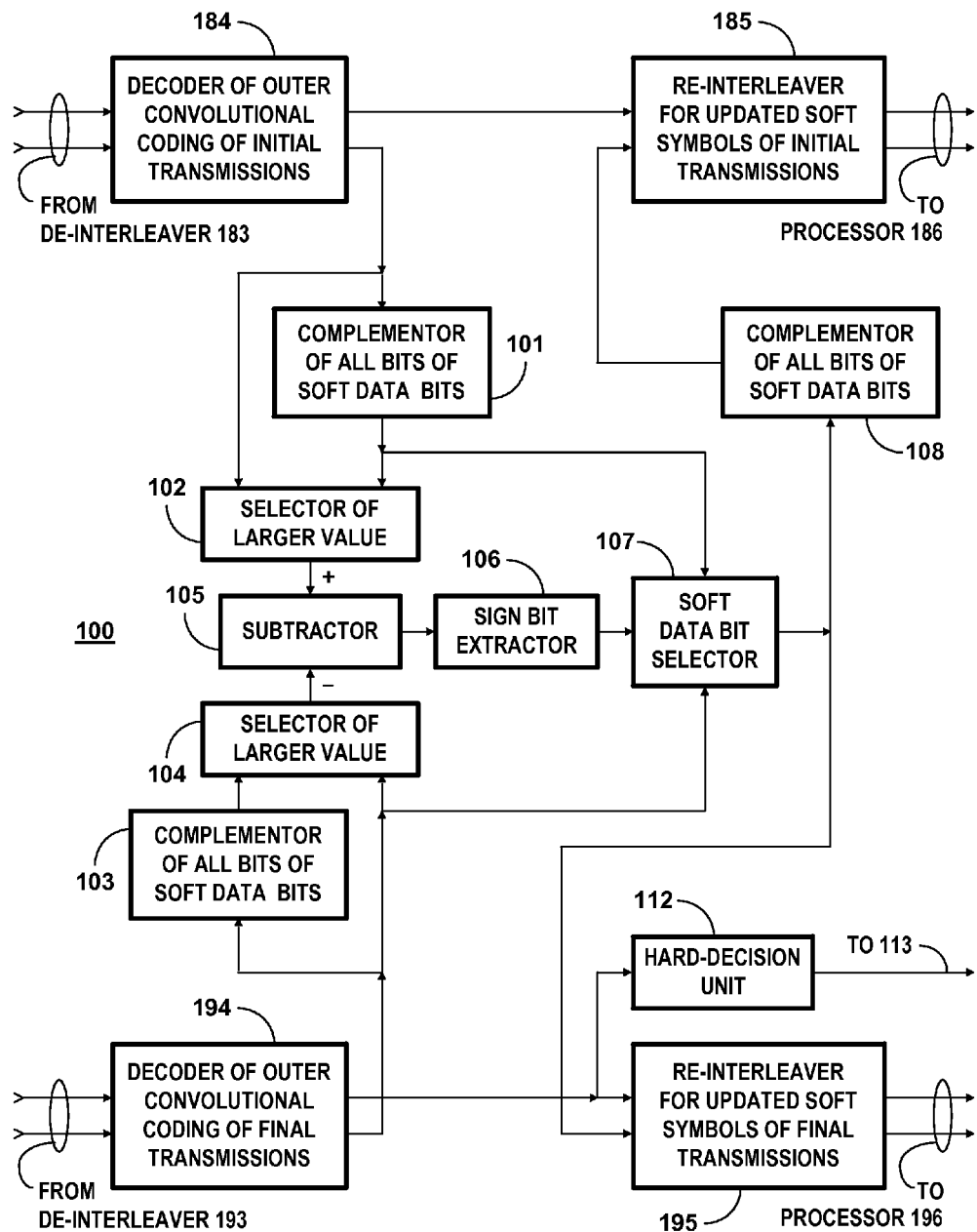
FIGS. 40 and 41 are detailed schematic diagrams of alternative specific embodiments of the portions of the FIG. 39 paired turbo decoders used for exchanging information between them concerning confidence levels of soft data bits.

FIG. 40 shows in more detail a more specific embodiment of the FIG. 39 information-exchange unit 100 for exchanging information regarding data bits between the turbo decoders 180 and 190. The output port of the decoder 184 of the outer convolutional coding of the initial-component transmissions is connected for supplying successive soft data bits to a complementor 101 of all of the bits in each successive soft bit. The output port of the decoder 184 is further connected for supplying successive soft parity bits to the input port of the symbol re-interleaver 185. A selector 102 is connected for reproducing in its response the larger of each soft data bit supplied from the output port of the decoder 184 and the complementary soft data bit supplied from the complementor 101. The confidence level bits reproduced by the selector 102 in its response are an absolute-value indication of the level of confidence that the soft data bit supplied from the output port of the decoder 184 is correct.

The output port of the decoder 194 of the outer convolutional coding of the final-component transmissions is connected for supplying successive soft data bits to a complementor 103 of all of the bits in each successive soft bit. The output port of the decoder 194 is further connected for supplying successive soft parity bits to the input port of the symbol re-interleaver 195. A selector 104 is connected for reproducing in its response the larger of each soft data bit supplied from the output port of the decoder 194 and the complementary soft data bit supplied from the complementor 103. The confidence level bits reproduced by the selector 104 in its response are an absolute-value indication of the level of confidence that the soft data bit supplied from the output port of the decoder 194 is correct.

A digital subtractor 105 is connected for receiving the responses of the selectors 102 and 103 as its minuend input signal and as its subtrahend input signal, respectively. The subtractor 105 is connected for supplying its difference output signal to a sign-bit extractor 106. In practice, the sign-bit extractor 106 is realized simply by discarding all bits save the sign bit. The sign-bit from the sign-bit extractor 106 is applied as control signal to a soft-data-bit selector 107. The soft-data-bit selector 107 is connected to receive, as one of its two input signals, the responses of the complementor 101 to the successive soft data bits from the output port of the decoder 184. The soft-data-bit selector 107 is connected to receive, as the other of its two input signals, the successive soft data bits from the output port of the decoder 194. The soft-data-bit selector 107 is connected to supply successively selected soft data bits to a complementor 108 of all of the bits in each successive soft bit. The complementor 108 is connected to supply the complementary soft data bit reproduced therefrom to the input port of the symbol re-interleaver 185, there to be joined by soft parity bits from the output port of the decoder 184. The soft-data-bit selector 107 is connected to supply successively selected soft data bits to the input port of the symbol re-interleaver 195 also, there to be joined by soft parity bits from the output port of the decoder 194.

If the sign bit extracted by the sign-bit extractor 106 is positive, this indicates that the confidence level as to the correctness of the soft data bit from the output port of the decoder 184 is better than the confidence level as to the correctness of the soft data bit from the output port of the decoder 194. Responsive to this indication received as control signal, the soft-data-bit selector 107 is conditioned to reproduce from its output port the complementary soft data bit from the output port of the decoder 184 as complemented by the complementor 101. The soft data bit that the soft-data-bit selector 107 reproduces is supplied to the input port of the symbol re-interleaver 195 and to the complementor 108 for being complemented before being supplied to the input port of the symbol re-interleaver 185.

If the sign bit extracted by the sign-bit extractor 106 is negative, this indicates that the confidence level as to the correctness of the soft data bit from the output port of the decoder 194 is better than the confidence level as to the correctness of the soft data bit from the output port of the decoder 184. Responsive to this indication received as control signal, the soft-data-bit selector 107 is conditioned to reproduce from its output port the soft data bit from the output port of the decoder 194. The soft data bit that the soft-data-bit selector 107 reproduces is supplied to the input port of the symbol re-interleaver 195 and to the complementor 108 for being complemented before being supplied to the input port of the symbol re-interleaver 185.

Figure 41:
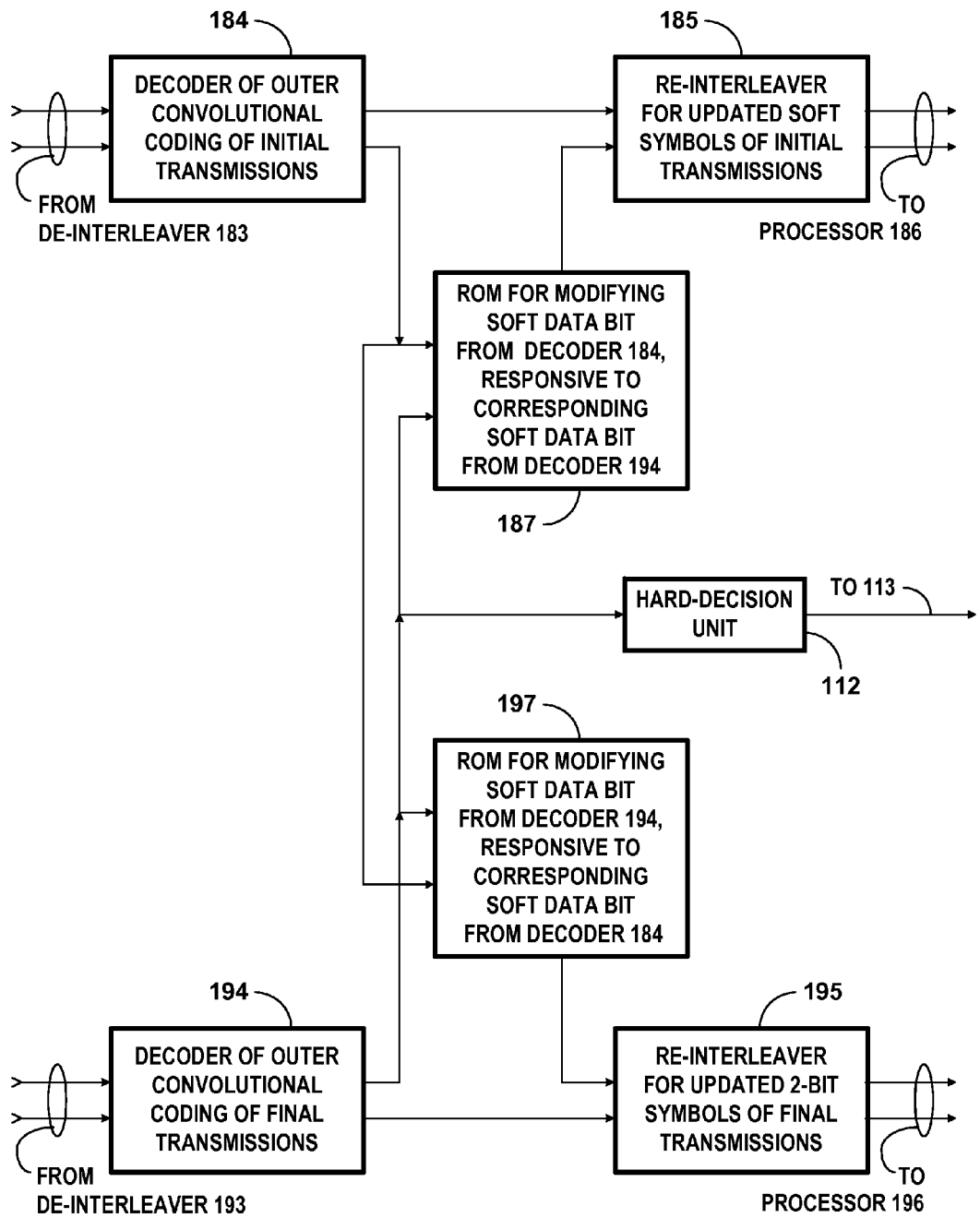

FIG. 41 shows an information-exchange unit that replaces the FIG. 40 information-exchange unit 100 for exchanging information regarding soft data bits between the two turbo decoders 180 and 190 in another specific embodiment of them arranged as shown in FIG. 39. This replacement circuitry comprises the read-only memories 187 and 197, which have stored contents similar to those of ROMs 87 and 97, respectively. The decoder 184 for outer convolutional coding of initial transmissions is connected to supply soft bits of data to each of the ROMs 187 and 197 as a first half of its input addressing. The decoder 194 for outer convolutional coding of final transmissions is connected to supply soft bits of data to each of the ROMs 187 and 197 as a second half of its input addressing. The ROM 187 is connected to supply the soft data bits of its output response to the input port of the symbol re-interleaver 185, there to be joined by soft parity bits from the output port of the decoder 184. The output response of the ROM 187 modifies the decoder 184 response received as the first half of its input address, the modification responding to the decoder 194 response received as the second half of its input address. The ROM 197 is connected to supply the soft data bits of its output response to the input port of the symbol re-interleaver 195, there to be joined by soft parity bits from the output port of the decoder 194. The output response of the ROM 197 modifies the decoder 194 response received as the second half of its input address, the modification responding to the decoder 184 response received as the first half of its input address.

Figure 42:
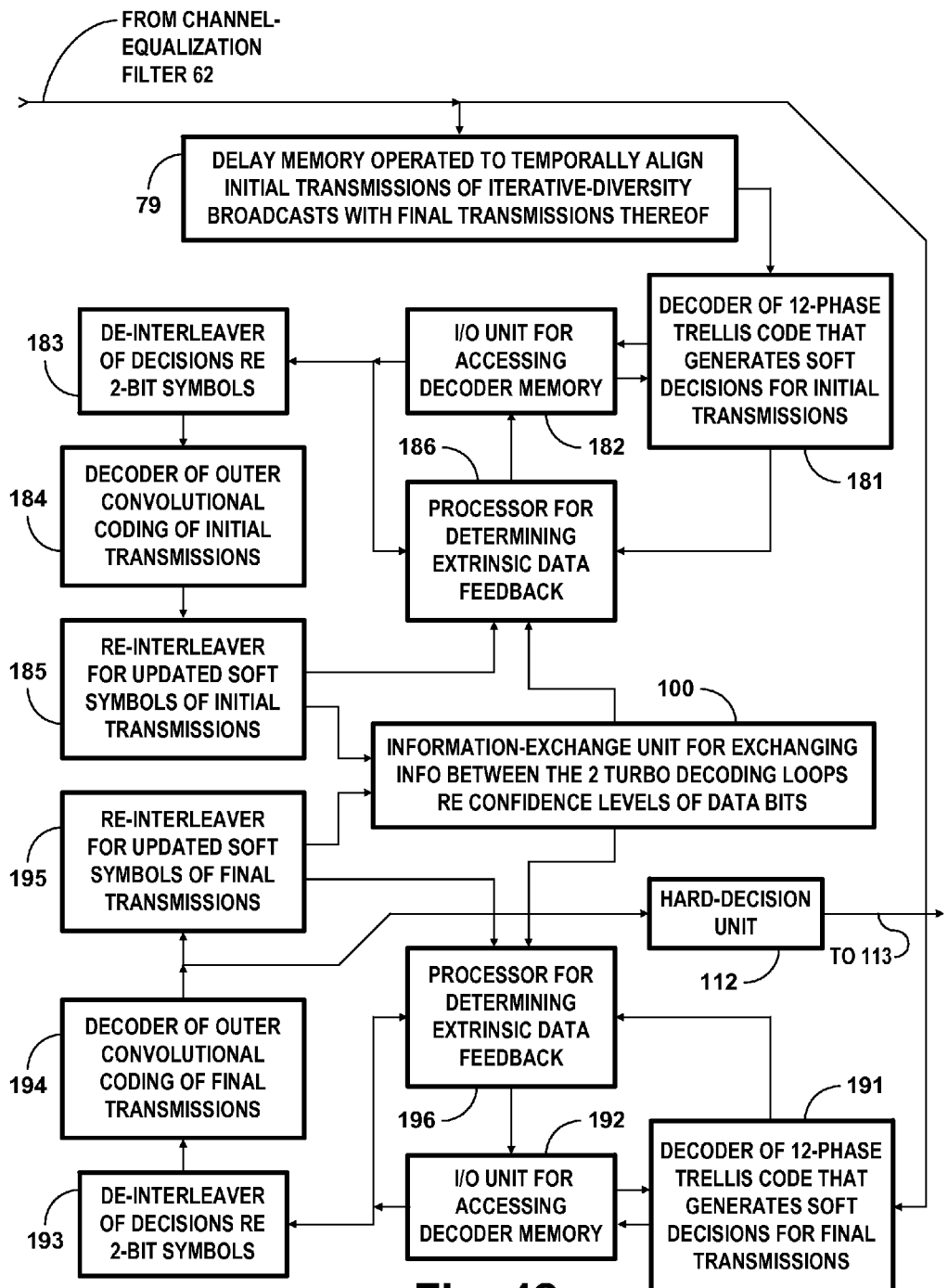
FIG. 42 is a schematic diagram of a sixth arrangement of the elements of paired turbo decoders shown in the FIG. 17B portion of the FIG. 17 receiver apparatus, which turbo decoders decode SCCC iterative-diversity transmissions.

FIG. 42 shows in some detail a second generic way to construct the FIG. 17B turbo decoders 180 and 190 for decoding iterative-diversity signals comprising component SCCC transmissions at respective code rates each one-third 8VSB symbol rate. The construction shown in FIG. 42 differs from that shown in FIG. 39 with regard to the positioning of the information-exchange unit 100 for exchanging information regarding data bits between the paired turbo decoding loops. The output port of the decoder 184 is connected for supplying updated soft decisions regarding data bits of the initial transmissions to the input port of the symbol re-interleaver 185. The output port of the decoder 194 is connected for supplying soft decisions regarding data bits of the final transmissions to the input port of the symbol re-interleaver 195. The output ports of the symbol re-interleavers 185 and 195 are connected to feed back the portions of their respective re-interleaved soft decisions concerning data bits to the information-exchange unit 100 for exchanging information regarding soft data bits between the turbo decoders 180 and 190. Based on the exchanged information, the information-exchange unit 100 adjusts those soft data bits before forwarding adjusted soft data bits to the processors 186 and 196 for determining extrinsic data. The output ports of the symbol re-interleavers 185 and 195 are further connected to feed back the portions of their respective re-interleaved soft decisions concerning parity bits to the processors 186 and 196, respectively, by-passing the information-exchange unit 100.

Figure 43:
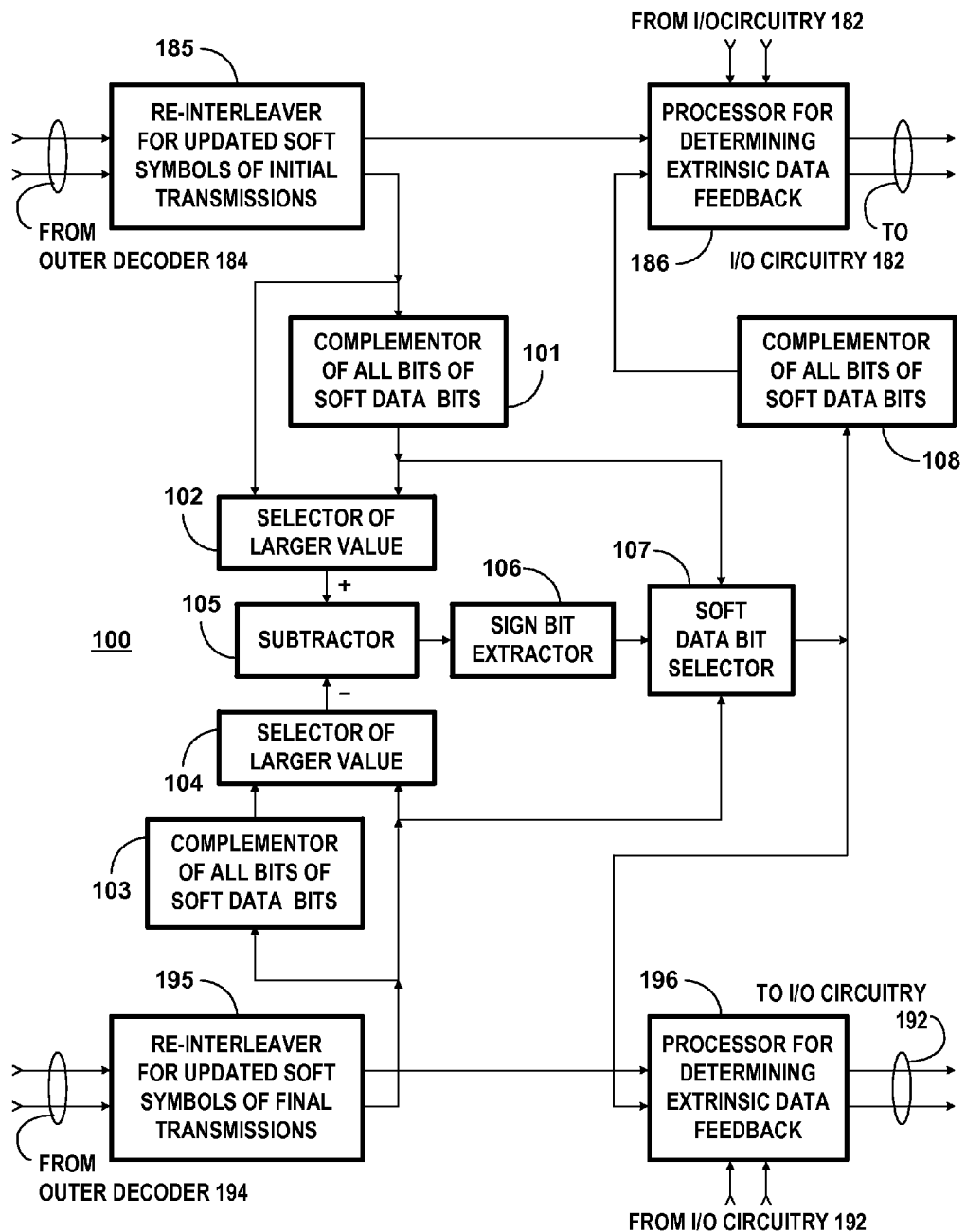
FIGS. 43 and 44 are detailed schematic diagrams of alternative specific embodiments of the portions of the FIG. 42 paired turbo decoders used for exchanging information between them concerning confidence levels of soft data bits.

FIG. 43 shows in more detail the FIG. 42 information-exchange unit 100 for exchanging information regarding data bits between the paired turbo decoding loops. The FIG. 43 information-exchange unit 100 is similar to the FIG. 40 information-exchange unit 100 except for being placed after, rather than before, the symbol re-interleavers 185 and 186 in the paired turbo decoding loops.

FIG. 43 shows the output port of the symbol re-interleaver 185 connected for supplying successive soft data bits to the complementor 101 of all of the bits in each successive soft bit. The selector 102 is connected for reproducing in its response the larger of each soft data bit supplied from the output port of the symbol re-interleaver 185 and the complementary soft data bit supplied from the complementor 101. The confidence level bits reproduced by the selector 102 in its response are an absolute-value indication of the level of confidence that the soft data bit supplied from the output port of the symbol re-interleaver 185 is correct.

FIG. 43 shows the output port of the symbol re-interleaver 195 connected for supplying successive soft data bits to the complementor 103 of all of the bits in each successive soft bit. The selector 104 is connected for reproducing in its response the larger of each soft data bit supplied from the output port of the symbol re-interleaver 195 and the complementary soft data bit supplied from the complementor 103. The confidence level bits reproduced by the selector 104 in its response are an absolute-value indication of the level of confidence that the soft data bit supplied from the output port of the symbol re-interleaver 195 is correct.

The digital subtractor 105 is connected for receiving the responses of the selectors 102 and 103 as its minuend input signal and as its subtrahend input signal, respectively. The subtractor 105 is connected for supplying its difference output signal to the sign-bit extractor 106, and the sign-bit from the sign-bit extractor 106 is applied as control signal to the soft-data-bit selector 107. The soft-data-bit selector 107 is connected to receive, as one of its two input signals, the responses of the complementor 101 to the successive soft data bits from the output port of the symbol re-interleaver 185. The soft-data-bit selector 107 is connected to receive, as the other of its two input signals, the successive soft data bits from the output port of the symbol re-interleaver 195. The soft-data-bit selector 107 is connected to supply successively selected soft data bits to the complementor 108 of all of the bits in each successive soft bit. The complementor 108 is connected to supply the complementary soft data bit reproduced therefrom to one of the two input ports of the processor 186 for determining extrinsic data feedback, there to be joined by soft parity bits from the output port of the symbol re-interleaver 185. The soft-data-bit selector 107 is connected to supply successively selected soft data bits to one of the two input ports of the processor 196 for determining extrinsic data feedback, there to be joined by soft parity bits from the output port of the symbol re-interleaver 195.

If the sign bit extracted by the sign-bit extractor 106 is positive, this indicates that the confidence level as to the correctness of the soft data bit from the output port of the symbol re-interleaver 185 is better than the confidence level as to the correctness of the soft data bit from the output port of the symbol re-interleaver 195. Responsive to this indication received as control signal, the soft-data-bit selector 107 is conditioned to reproduce from its output port the complementary soft data bit from the output port of the symbol re-interleaver 185 as complemented by the complementor 101.

If the sign bit extracted by the sign-bit extractor 106 is negative, this indicates that the confidence level as to the correctness of the soft data bit from the output port of the symbol re-interleaver 195 is better than the confidence level as to the correctness of the soft data bit from the output port of the symbol re-interleaver 185. Responsive to this indication received as control signal, the soft-data-bit selector 107 is conditioned to reproduce from its output port the soft data bit from the output port of the symbol re-interleaver 195.

Figure 44:
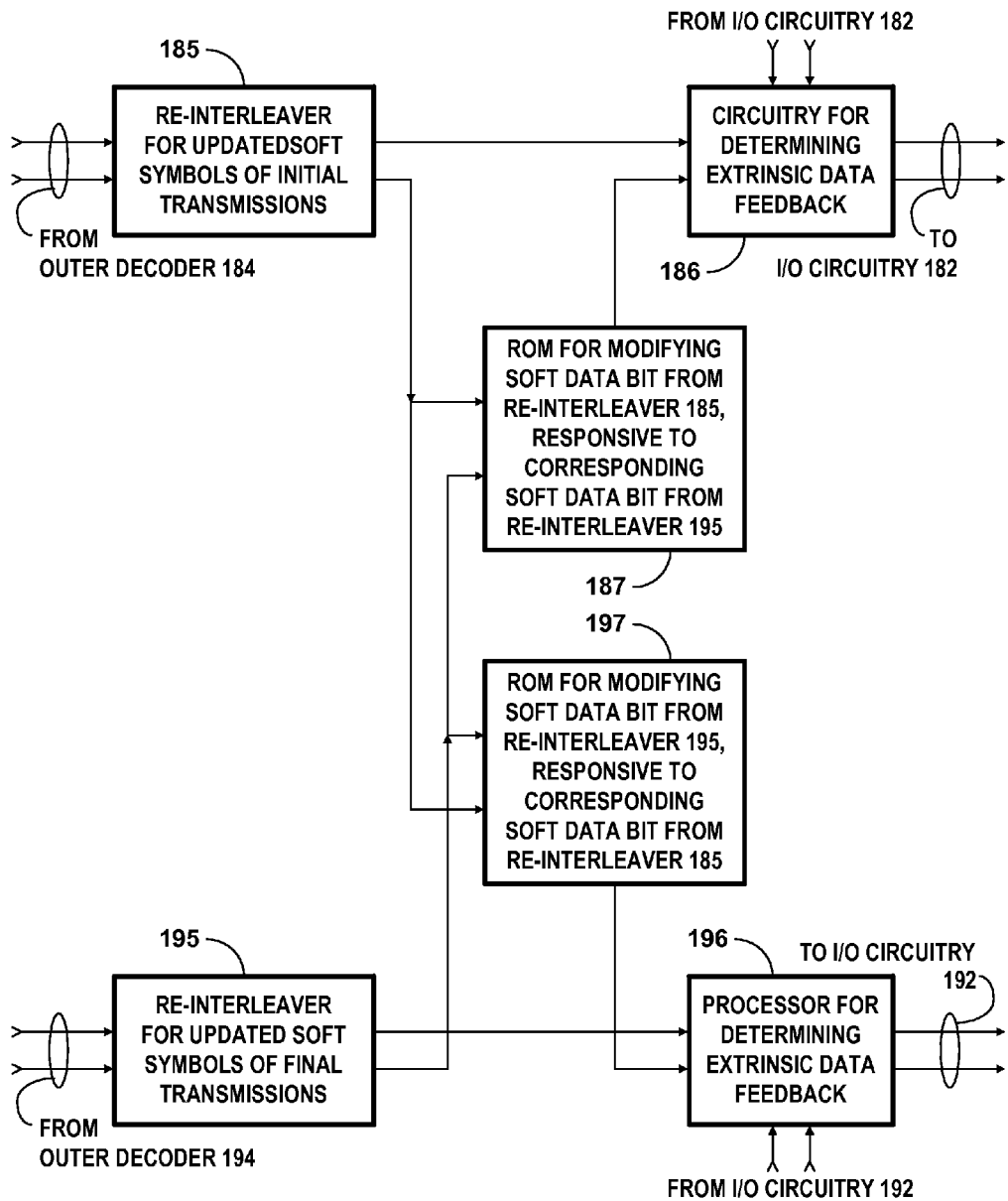

FIG. 44 shows an information-exchange unit that replaces the FIG. 43 information-exchange unit 100 for exchanging information regarding soft data bits between the two turbo decoders 180 and 190 in another specific embodiment of them arranged as shown in FIG. 42. This replacement circuitry comprises the read-only memories 187 and 197. The symbol re-interleaver 185 is connected to supply soft bits of data to each of the ROMs 187 and 197 as a first half of its input addressing. The symbol re-interleaver 195 is connected to supply soft bits of data to each of the ROMs 187 and 197 as a second half of its input addressing. The ROM 187 is connected to supply the soft data bits of its output response to the processor 186 for determining extrinsic data feedback. The output response of the ROM 187 modifies the symbol re-interleaver 185 response received as the first half of its input address, the modification responding to the symbol re-interleaver 195 response received as the second half of its input address. The ROM 197 is connected to supply the soft data bits of its output response to the processor 196 for determining extrinsic data feedback. The output response of the ROM 197 modifies the symbol re-interleaver 195 response received as the second half of its input address, the modification responding to the symbol re-interleaver 185 response received as the first half of its input address.

Figure 45:
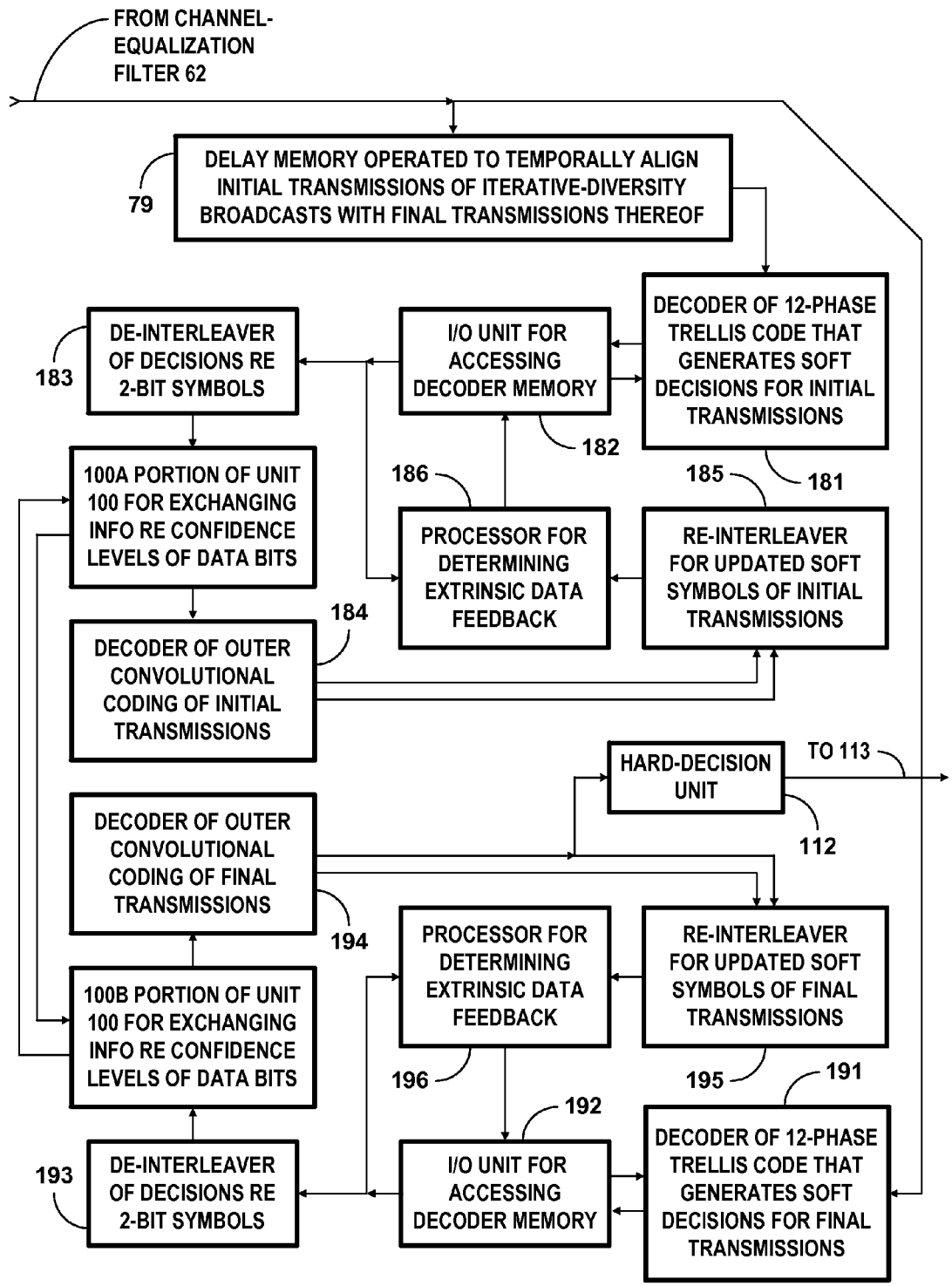
FIG. 45 is a schematic diagram of a seventh arrangement of the elements of paired turbo decoders shown in the FIG. 17B portion of the FIG. 17 receiver apparatus, which turbo decoders decode SCCC iterative-diversity transmissions.

FIG. 45 shows in some detail a third generic way to construct the FIG. 17B turbo decoders 180 and 190 for decoding iterative-diversity signals comprising component SCCC transmissions at respective code rates each one-third 8VSB symbol rate. The construction shown in FIG. 45 differs from that shown in FIG. 39 and from that shown in FIG. 42 with regard to the positioning of the information-exchange unit 100 within the paired turbo decoding loops. The information-exchange unit 100 is not connected within the turbo loop connections from the decoders 184 and 194 for outer convolutional coding back to the decoders 181 and 191 for inner convolutional coding.

FIG. 45 shows the output port of the de-interleaver 183 connected to supply 2-bit symbols concerning the initial ones of iterative-diversity transmissions to a portion 100A of the information-exchange unit 100 for exchanging information regarding data bits between the paired decoders 180 and 190 for turbo decoding the iterative transmissions. FIG. 45 shows the output port of the de-interleaver 193 connected to supply 2-bit symbols concerning the final ones of iterative-diversity transmissions to a portion 100B of the information-exchange unit 100. FIG. 45 shows the input port of the outer decoder 184 connected for receiving 2-bit symbols concerning the initial ones of iterative-diversity transmissions from the portion 100A of the information-exchange unit 100, as possibly modified in response to data bits from the final ones of iterative-diversity transmissions. FIG. 45 shows the input port of the outer decoder 194 connected for receiving 2-bit symbols concerning the final ones of iterative-diversity transmissions from the portion 100B of the information-exchange unit 100, as possibly modified in response to data bits from the initial ones of iterative-diversity transmissions. The portions 100A and 100B of the information-exchange unit 100 process only the soft data bits in the 2-bit symbols they respectively receive, passing on the accompanying soft parity bits possibly with some shimming delay to compensate for any latent delay in processing the soft data bits.

Figure 46:
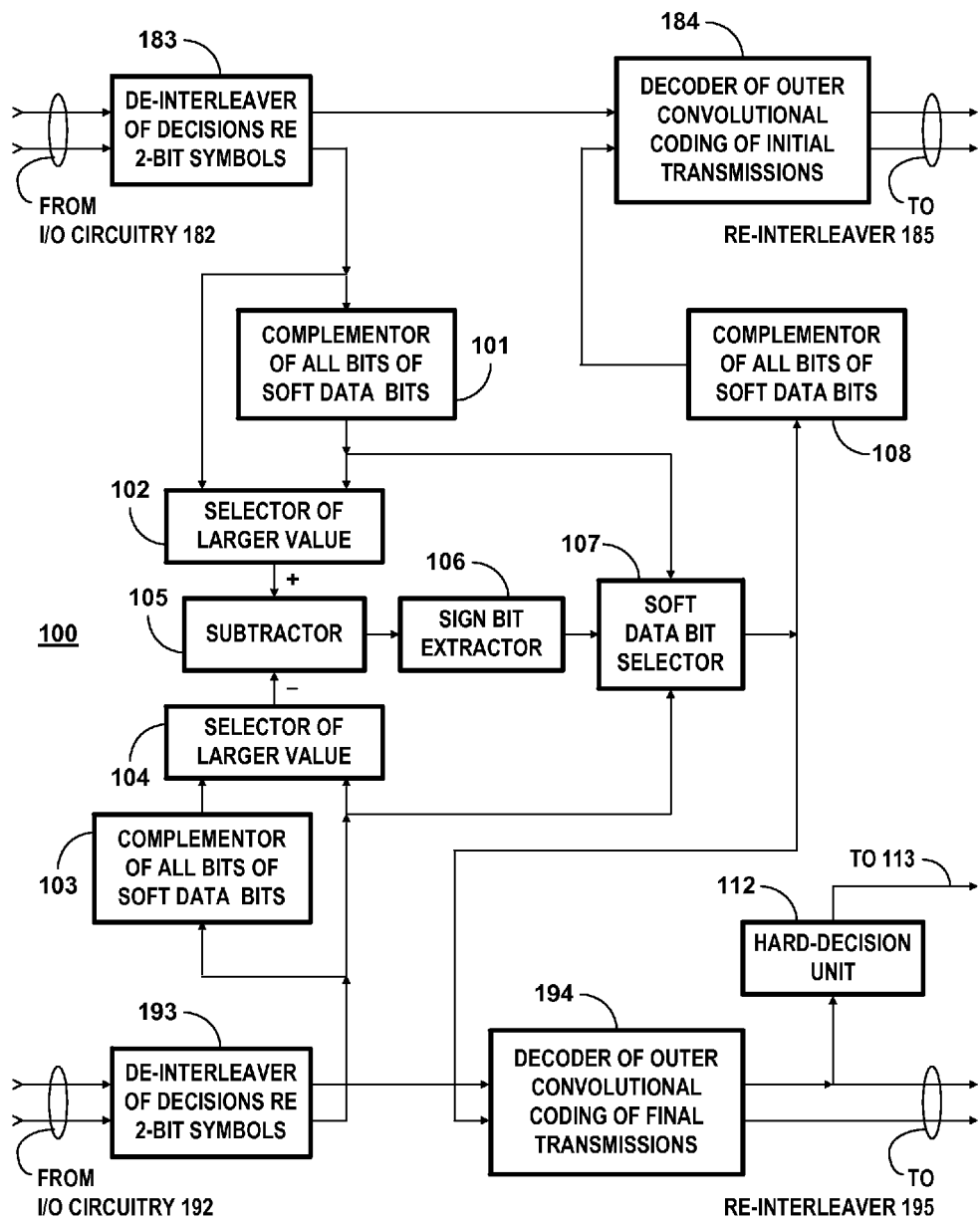
FIGS. 46 and 47 are detailed schematic diagrams of alternative specific embodiments of the portions of the FIG. 45 paired turbo decoders used for exchanging information between them concerning confidence levels of soft data bits.

FIG. 46 shows in more detail the FIG. 45 information-exchange unit 100 for exchanging information regarding data bits between the paired turbo loops of the turbo decoders 180 and 190. The FIG. 46 information-exchange unit 100, except for its placement within the paired turbo decoding loops, is similar to the FIG. 40 information-exchange unit 100 and to the FIG. 43 information-exchange unit 100.

FIG. 46 shows the output port of the symbol de-interleaver 183 connected for supplying successive soft data bits to the complementor 101 of all of the bits in each successive soft bit. The output port of the de-interleaver 183 is further connected for supplying successive soft parity bits to the input port of the decoder 184 for outer convolutional coding. The selector 102 is connected for reproducing in its response the larger of each soft data bit supplied from the output port of the de-interleaver 183 and the complementary soft data bit supplied from the complementor 101. The confidence level bits reproduced by the selector 102 in its response are an absolute-value indication of the level of confidence that the soft data bit supplied from the output port of the de-interleaver 183 is correct.

FIG. 46 shows the output port of the symbol de-interleaver 193 connected for supplying successive soft data bits to the complementor 103 of all of the bits in each successive soft bit. The output port of the de-interleaver 193 is further connected for supplying successive soft parity bits to the input port of the decoder 194 for outer convolutional coding. The selector 104 is connected for reproducing in its response the larger of each soft data bit supplied from the output port of the de-interleaver 193 and the complementary soft data bit supplied from the complementor 103. The confidence level bits reproduced by the selector 104 in its response are an absolute-value indication of the level of confidence that the soft data bit supplied from the output port of the de-interleaver 193 is correct.

The digital subtractor 105 is connected for receiving the responses of the selectors 102 and 103 as its minuend input signal and as its subtrahend input signal, respectively. The subtractor 105 is connected for supplying its difference output signal to the sign-bit extractor 106, and the sign-bit from the sign-bit extractor 106 is applied as control signal to the soft-data-bit selector 107. The soft-data-bit selector 107 is connected to receive, as one of its two input signals, the responses of the complementor 101 to the successive soft data bits from the output port of the de-interleaver 183. The soft-data-bit selector 107 is connected to receive, as the other of its two input signals, the successive soft data bits from the output port of the de-interleaver 193. The soft-data-bit selector 107 is connected to supply successively selected soft data bits to the complementor 108 of all of the bits in each successive soft bit. The complementor 108 is connected to supply the complementary soft data bit reproduced therefrom to the input port of the decoder 184 for outer convolutional coding of initial-component transmissions for iterative diversity, there to be joined by soft parity bits from the output port of the de-interleaver 184. The soft-data-bit selector 107 is connected to supply successively selected soft data bits to the input port of the decoder 194 for outer convolutional coding of single-time transmissions or of final-component transmissions for iterative diversity, there to be joined by soft parity bits from the output port of the de-interleaver 194.

If the sign bit extracted by the sign-bit extractor 106 is positive, this indicates that the confidence level as to the correctness of the soft data bit from the output port of the de-interleaver 183 is better than the confidence level as to the correctness of the soft data bit from the output port of the de-interleaver 193. Responsive to this indication received as control signal, the soft-data-bit selector 107 is conditioned to reproduce from its output port the complementary soft data bit from the output port of the de-interleaver 183 as complemented by the complementor 101.

If the sign bit extracted by the sign-bit extractor 106 is negative, this indicates that the confidence level as to the correctness of the soft data bit from the output port of the de-interleaver 193 is better than the confidence level as to the correctness of the soft data bit from the output port of the de-interleaver 183. Responsive to this indication received as control signal, the soft-data-bit selector 107 is conditioned to reproduce from its output port the soft data bit from the output port of the de-interleaver 193.

Figure 47:
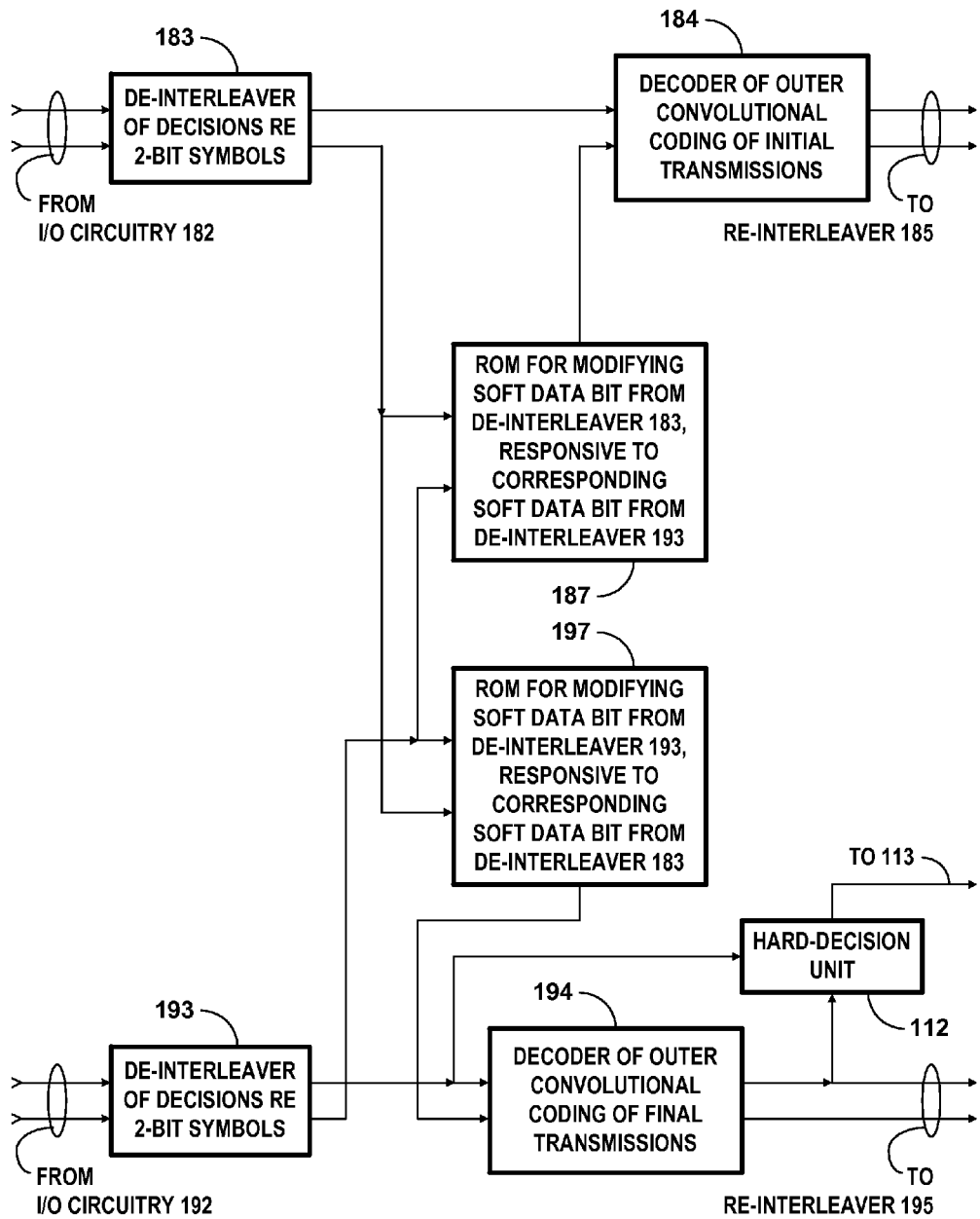

FIG. 47 shows an information-exchange unit that replaces the FIG. 46 information-exchange unit 100 for exchanging information regarding soft data bits between the two turbo decoders 180 and 190 in another specific embodiment of them arranged as shown in FIG. 45. This replacement circuitry comprises the read-only memories 187 and 197. The symbol de-interleaver 183 is connected to supply soft bits of data to each of the ROMs 187 and 197 as a first half of its input addressing. The symbol de-interleaver 193 is connected to supply soft bits of data to each of the ROMs 187 and 197 as a second half of its input addressing. The ROM 187 is connected to supply the soft data bits of its output response to the to the input port of the decoder 184 for outer convolutional coding of initial-component transmissions for iterative diversity, there to be joined by soft parity bits forwarded from the de-interleaver 183. The output response of the ROM 187 modifies the de-interleaver 183 response received as the first half of its input address, the modification responding to the de-interleaver 193 response received as the second half of its input address. The ROM 197 is connected to supply the soft data bits of its output response to the input port of the decoder 194 for outer convolutional coding of single-time transmissions or of final-component transmissions for iterative diversity, there to be joined by soft parity bits forwarded from the de-interleaver 193.

Figure 48:
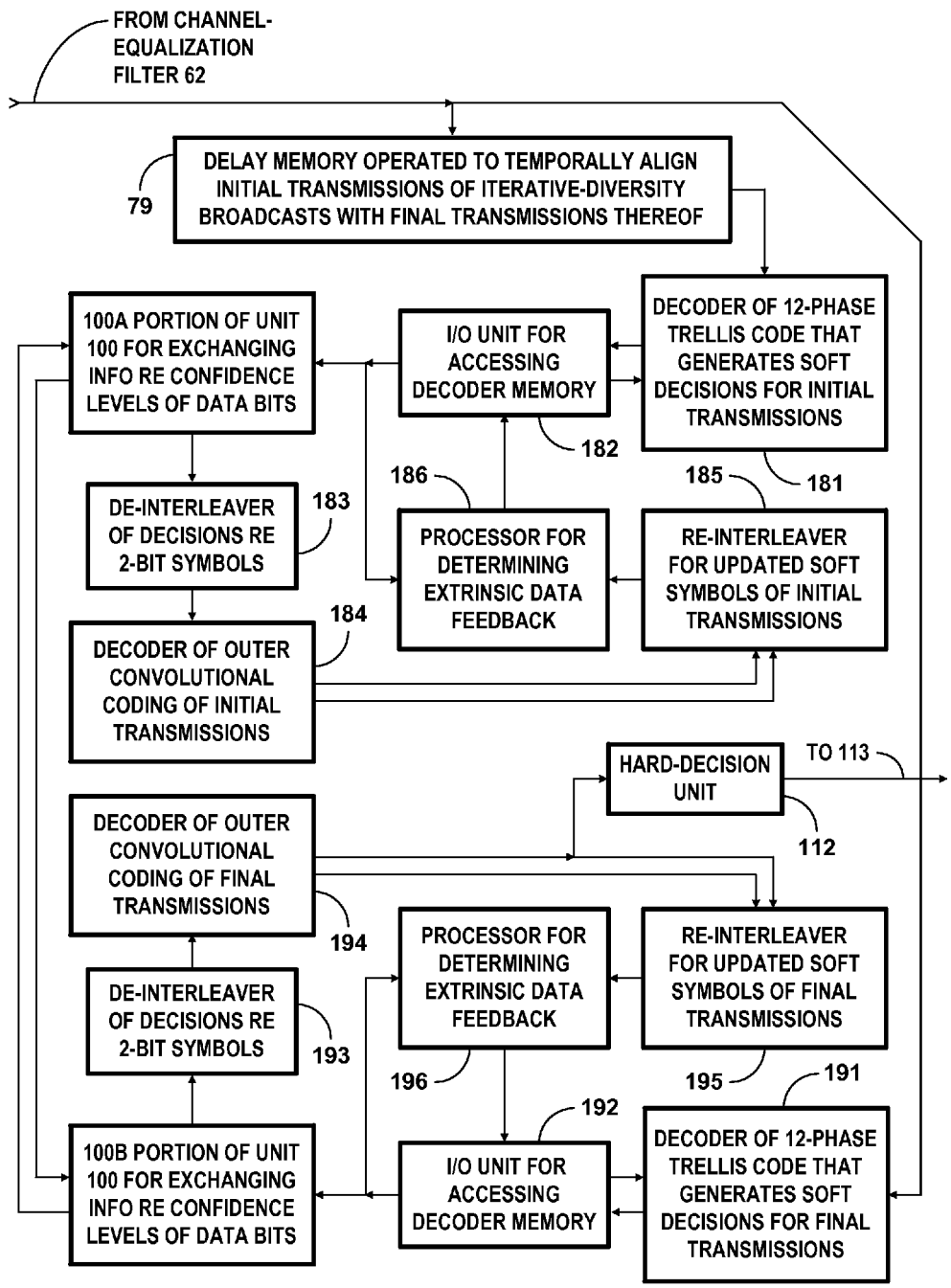
FIG. 48 is a schematic diagram of an eighth arrangement of the elements of paired turbo decoders shown in the FIG. 17B portion of the FIG. 17 receiver apparatus, which turbo decoders decode SCCC iterative-diversity transmissions.

FIG. 48 shows a fourth generic way to construct the FIG. 17B turbo decoders 180 and 190 for decoding iterative-diversity signals comprising component SCCC transmissions at respective code rates each one-third 8VSB symbol rate. The construction shown in FIG. 48 differs from that shown in FIG. 39, in FIG. 42 and in FIG. 45 with regard to the positioning of the information-exchange unit 100 for exchanging information regarding data bits between the paired turbo decoders 180 and 190.

FIG. 48 shows the output port of the I/O unit 182 for memory within the trellis decoder 181 connected to supply 2-bit symbols concerning the initial ones of iterative-diversity transmissions to the portion 100A of the information-exchange unit 100 for exchanging information regarding data bits within the two loops for turbo decoding the iterative-diversity transmissions. FIG. 48 shows the output port of the I/O unit 192 for memory within the trellis decoder 191 connected to supply 2-bit symbols concerning the final ones of iterative-diversity transmissions to the portion 100B of the information-exchange unit 100. FIG. 48 shows the input port of the de-interleaver 183 connected for receiving 2-bit symbols concerning the initial ones of iterative-diversity transmissions from the portion 100A of the information-exchange unit 100, as possibly modified in response to data bits from the final ones of iterative-diversity transmissions. FIG. 48 shows the input port of the de-interleaver 193 connected for receiving 2-bit symbols concerning the final ones of iterative-diversity transmissions from the portion 100B of the information-exchange unit 100, as possibly modified in response to data bits from the initial ones of iterative-diversity transmissions. The portions 100A and 100B of the information-exchange unit 100 process only the soft data bits in the 2-bit symbols they respectively receive, passing on the accompanying soft parity bits possibly with some shimming delay to compensate for any latent delay in processing the soft data bits.

Figure 49:
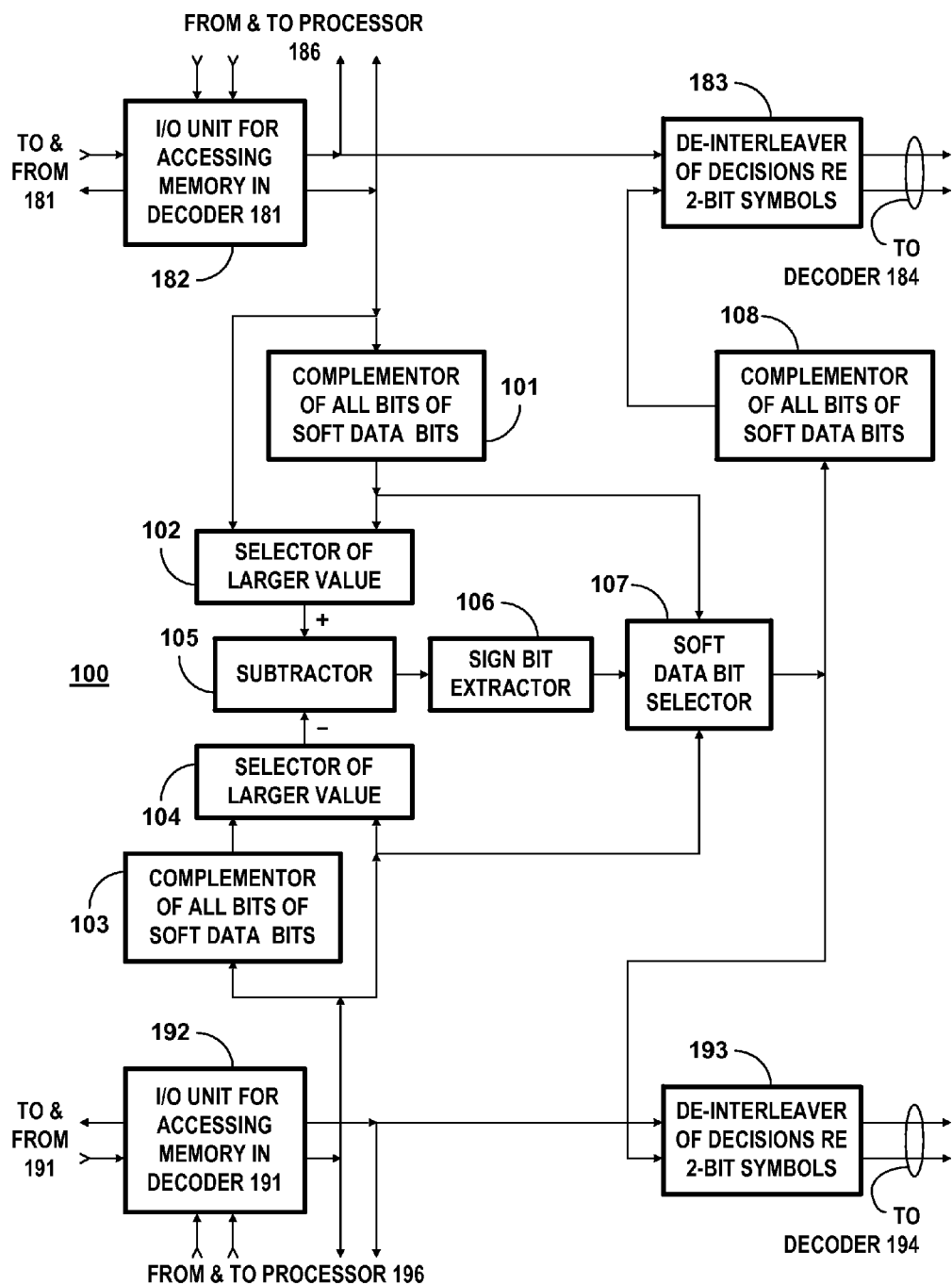
FIGS. 49 and 50 are detailed schematic diagrams of alternative specific embodiments of the portions of the FIG. 45 paired turbo decoders used for exchanging information between them concerning confidence levels of soft data bits.

FIG. 49 shows in more detail the FIG. 48 information-exchange unit 100 for exchanging information regarding data bits between the paired turbo decoding loops of the turbo decoders 180 and 190. During an initial portion of each cycle of turbo decoding, the I/O unit 182 for accessing memory in the decoder 181 supplies soft 2-bit symbols of interleaved outer convolutional coding. FIG. 49 shows the output port of the I/O unit 182 connected for applying the successive soft parity bits of the interleaved outer convolutional coding directly to the input port of the de-interleaver 183. FIG. 49 shows the output port of the I/O unit 182 further connected for supplying the successive soft data bits of the interleaved outer convolutional coding to the complementor 101 of all of the bits in each successive soft bit. The selector 102 is connected for reproducing in its response the larger of each soft data bit supplied from the output port of the I/O unit 182 and the complementary soft data bit supplied from the complementor 101. The confidence level bits reproduced by the selector 102 in its response are an absolute-value indication of the level of confidence that the soft data bit supplied from the output port of the I/O unit 182 is correct.

During an initial portion of each cycle of turbo decoding, the I/O unit 192 for accessing memory in the decoder 191 supplies soft 2-bit symbols of interleaved outer convolutional coding. FIG. 49 shows the output port of the I/O unit 192 connected for applying the successive soft parity bits of the interleaved outer convolutional coding directly to the input port of the de-interleaver 193. FIG. 49 shows the output port of the I/O unit 192 further connected for supplying successive soft data bits to the complementor 103 of all of the bits in each successive soft bit. The selector 104 is connected for reproducing in its response the larger of each soft data bit supplied from the output port of the de-interleaver 193 and the complementary soft data bit supplied from the complementor 103. The confidence level bits reproduced by the selector 104 in its response are an absolute-value indication of the level of confidence that the soft data bit supplied from the output port of the I/O unit 192 is correct.

The digital subtractor 105 is connected for receiving the responses of the selectors 102 and 103 as its minuend input signal and as its subtrahend input signal, respectively. The subtractor 105 is connected for supplying its difference output signal to the sign-bit extractor 106, and the sign-bit from the sign-bit extractor 106 is applied as control signal to the soft-data-bit selector 107. The soft-data-bit selector 107 is connected to receive, as one of its two input signals, the responses of the complementor 101 to the successive soft data bits from the output port of the I/O unit 182. The soft-data-bit selector 107 is connected to receive, as the other of its two input signals, the successive soft data bits from the output port of the I/O unit 192. The soft-data-bit selector 107 is connected to supply successively selected soft data bits to the complementor 108 of all of the bits in each successive soft bit. The complementor 108 is connected to supply the complementary soft data bit reproduced therefrom to the input port of the de-interleaver 183, there to be joined by soft data bits from the I/O unit 182. The soft-data-bit selector 107 is connected to supply successively selected soft data bits to the input port of the de-interleaver 193, there to be joined by soft data bits from the I/O unit 192.

If the sign bit extracted by the sign-bit extractor 106 is positive, this indicates that the confidence level as to the correctness of the soft data bit from the output port of the I/O unit 182 is better than the confidence level as to the correctness of the soft data bit from the output port of the I/O unit 193. Responsive to this indication received as control signal, the soft-data-bit selector 107 is conditioned to reproduce from its output port the complementary soft data bit from the output port of the I/O unit 182 as complemented by the complementor 101.

If the sign bit extracted by the sign-bit extractor 106 is negative, this indicates that the confidence level as to the correctness of the soft data bit from the output port of the I/O unit 192 is better than the confidence level as to the correctness of the soft data bit from the output port of the I/O unit 182. Responsive to this indication received as control signal, the soft-data-bit selector 107 is conditioned to reproduce from its output port the soft data bit from the output port of the I/O unit 192.

Figure 50:
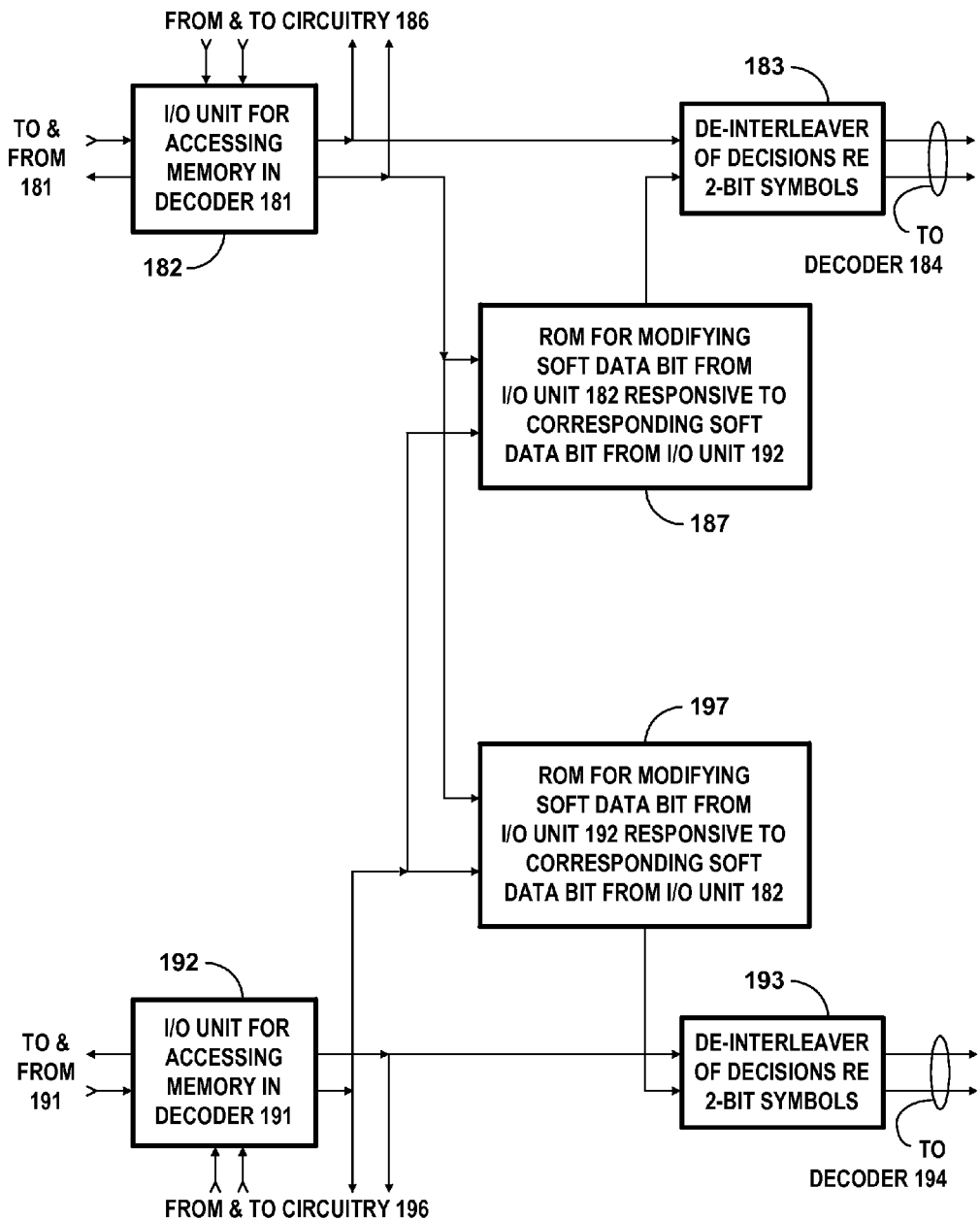

FIG. 50 shows an information-exchange unit that replaces the FIG. 49 information-exchange unit 100 for exchanging information regarding soft data bits between the two turbo decoders 180 and 190 in another specific embodiment of them arranged as shown in FIG. 48. This replacement circuitry comprises the read-only memories 187 and 197. The output port of the I/O unit 182 for memory within the decoder 181 is connected to supply soft bits of data to each of the ROMs 187 and 197 as a first half of its input addressing. The output port of the I/O unit 182 is further connected to supply soft parity bits to the input port of the symbol de-interleaver 183. The output port of the I/O unit 192 for memory within the trellis decoder 191 is connected to supply soft bits of data to each of the ROMs 187 and 197 as a second half of its input addressing. The output port of the I/O unit 192 is further connected to supply soft parity bits to the input port of the symbol de-interleaver 193. The ROM 187 is connected to supply its output response as soft-data-bit signal applied to the input port of the de-interleaver 183, there to be joined by soft parity bits supplied from the I/O unit 182. The output response of the ROM 197 modifies the I/O unit 182 response received as the first half of its input address, the modification responding to the I/O unit 192 response received as the second half of its input address. The ROM 197 is connected to supply its output response as soft-data-bit signal applied to the input port of the de-interleaver 193, there to be joined by soft parity bits supplied from the I/O unit 192. The output response of the ROM 197 modifies the I/O unit 192 response received as the second half of its input address, the modification responding to the I/O unit 182 response received as the first half of its input address.

Figure 51:
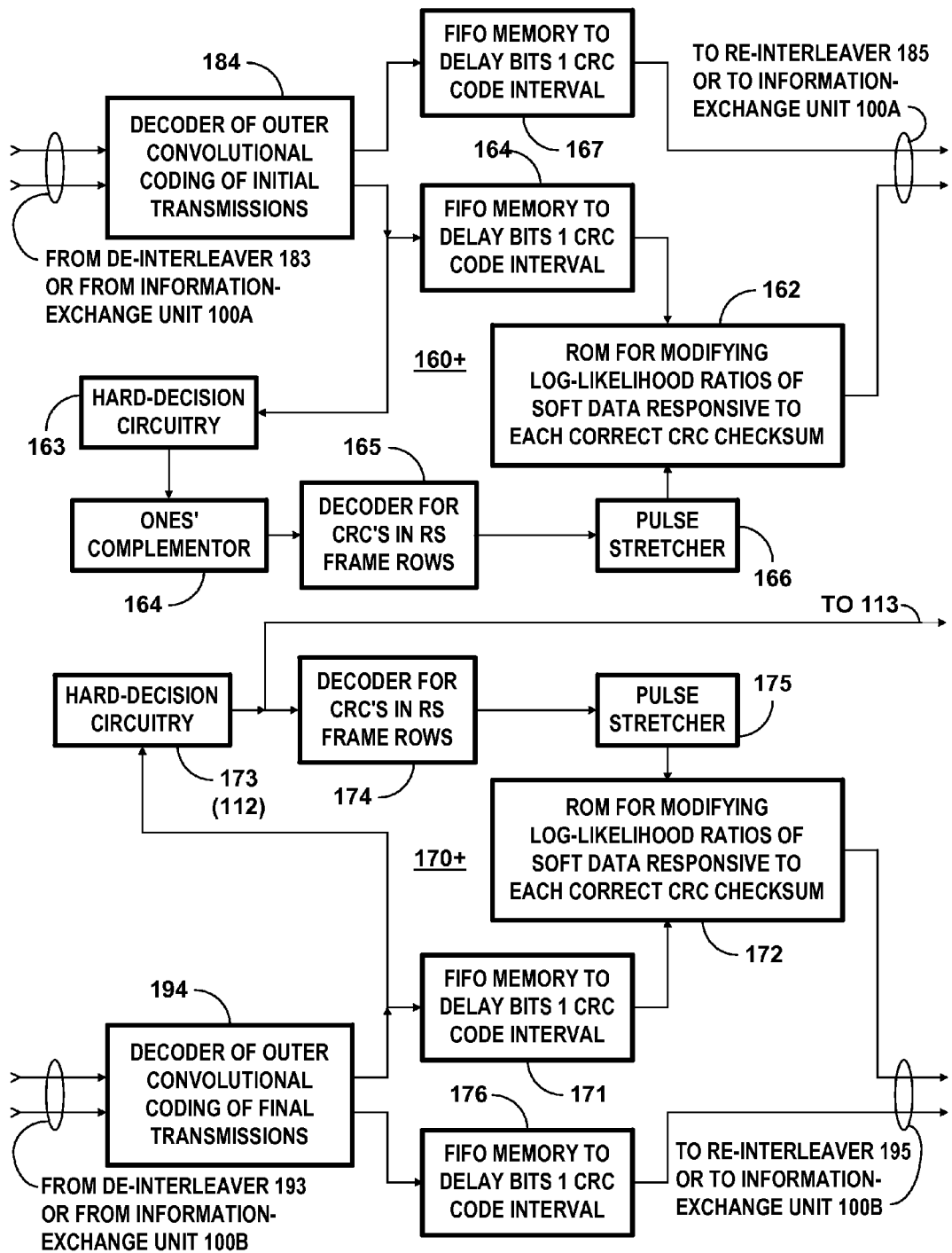
FIGS. 51, 52, 53 and 54 are schematic diagrams of modifications to the paired turbo decoders diagrammed in FIGS. 39, 42, 45 and 48, which modifications provide for updating the confidence levels of soft data bits indicated to be correct in the results of decoding cyclic redundancy check (CRC) coding.

FIG. 51 shows how CRC decoding can be used to modify the confidence levels of soft data bits supplied from the outer decoders 184 and 194 of any of the embodiments of the FIG. 17B portion of receiver apparatus shown in FIG. 39, 42, 45 or 48. In FIG. 51 the apparatus 160+ modifies the confidence levels of soft (complementary) data bits supplied from the outer decoder 184 responsive to the decoding of CRC codewords contained within the rows of bytes in the RS Frames for the initial-component transmissions for iterative diversity. After a delay as long as the time taken for decoding each of the CRC codewords, the FIFO memory 161 reproduces the soft (complementary) data bits supplied from the outer decoder 184 and supplies them to the ROM 162 as partial input addressing thereto. The soft complemented data bits written to the FIFO memory 161 as input addressing are also applied as input signal to hard-decision unit 163. The hard-decision unit 163 responds to supply (complementary) data bits to the ones' complementor 164. The ones' complementor 164 responds to supply data bits to the input port of the decoder 165 for decoding CRC codewords contained in complemented form within each row of bytes in each successive RS Frame for those initial-component transmissions for iterative diversity. The pulse stretcher 166 reproduces the CRC decoding result for the duration of a CRC codeword read from the FIFO memory 161 and is connected for applying that reproduced CRC decoding result to the ROM 162 for completing its input addressing. If the decoder 165 does not detect any error in the CRC codeword, the decoder 165 supplies a ONE to the pulse stretcher 166. The stretched-in-time ONE from the pulse stretcher 166 conditions the ROM 162 to increase the confidence levels of the soft (complementary) data bits in the CRC codeword as supplied from the ROM 162 to the symbol re-interleaver 185 or to the information-exchange unit 100A. If the decoder 165 detects error in the CRC codeword, the decoder 165 supplies a ZERO to the pulse stretcher 166. The stretched-in-time ZERO from the pulse stretcher 166 conditions the ROM 162 to leave unaltered the confidence levels of the soft (complementary) data bits in the CRC codeword as supplied from the ROM 162 to the symbol re-interleaver 185 or to the information-exchange unit 100A.

In FIG. 51 the apparatus 170+ modifies the confidence levels of soft data bits supplied from the outer decoder 194 responsive to CRC decoding of CRC codewords contained within the rows of bytes in the RS Frames for the final-component transmissions for iterative diversity. After a delay as long as the time taken for decoding each of the CRC codewords, the FIFO memory 171 reproduces the soft data bits supplied from the outer decoder 194 and supplies them to the ROM 172 as partial input addressing thereto. The soft data bits written to the FIFO memory 171 as input addressing are also applied as input signal to hard-decision unit 173. The hard-decision unit 173 responds to supply data bits as the input signal to the input port of the decoder 174 for decoding CRC codewords contained within each row of bytes in each successive RS Frame for the initial-component transmissions for iterative diversity. The pulse stretcher 175 reproduces the CRC decoding result for the duration of a CRC codeword read from the FIFO memory 171 and is connected for applying that reproduced CRC decoding result to the ROM 172 for completing its input addressing. If the decoder 174 does not detect any error in the CRC codeword, the decoder 174 supplies a ONE to the pulse stretcher 175. The stretched-in-time ONE from the pulse stretcher 175 conditions the ROM 172 to increase the confidence levels of the soft data bits in the CRC codeword as supplied from the ROM 172 to the symbol re-interleaver 195 or to the information-exchange unit 100B. If the decoder 174 detects error in the CRC codeword, the decoder 174 supplies a ZERO to the pulse stretcher 175. The stretched-in-time ZERO from the pulse stretcher 175 conditions the ROM 172 to leave unaltered the confidence levels of the soft data bits in the CRC codeword as supplied from the ROM 172 to the symbol re-interleaver 195 or to the information-exchange unit 100B.

Figure 52:
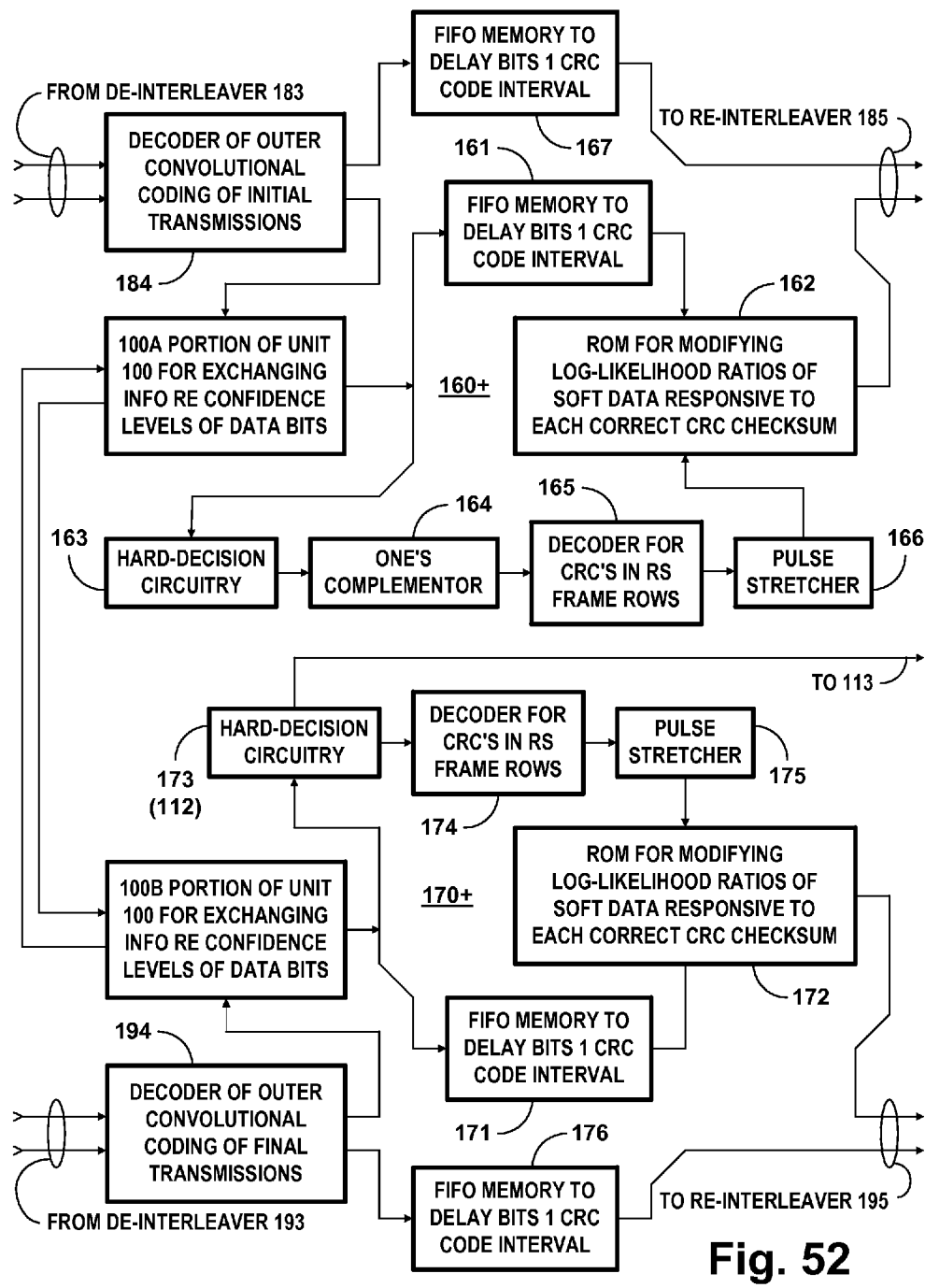

FIG. 52 shows a modification of the FIG. 39 embodiment of the FIG. 17B portion of receiver apparatus, which modification relocates the apparatuses 160+ and 170+ after the information-exchange unit 100 but before the symbol re-interleavers 185 and 195. FIG. 52 shows the portion 100A of the information-exchange unit 100 for exchanging information between turbo decoding loops being connected for receiving soft data bits from the output port of the outer decoder 184 and for supplying soft data bits with adjusted confidence levels to the apparatus 160+. The apparatus 160+ is apt to adjust further the confidence levels of the soft data bits it reproduces for application to the input port of the symbol re-interleaver 185, which further adjustments are made responsive to CRC decoding results. FIG. 52 shows the portion 100B of the information-exchange unit 100 for exchanging information between turbo decoding loops being connected for receiving soft data bits from the output port of the outer decoder 194 and for supplying soft data bits with adjusted confidence levels to the apparatus 170+. The apparatus 170+ is apt to adjust further the confidence levels of the soft data bits it reproduces for application to the input port of the symbol re-interleaver 195, which further adjustments are made responsive to CRC decoding results.

Figure 53:
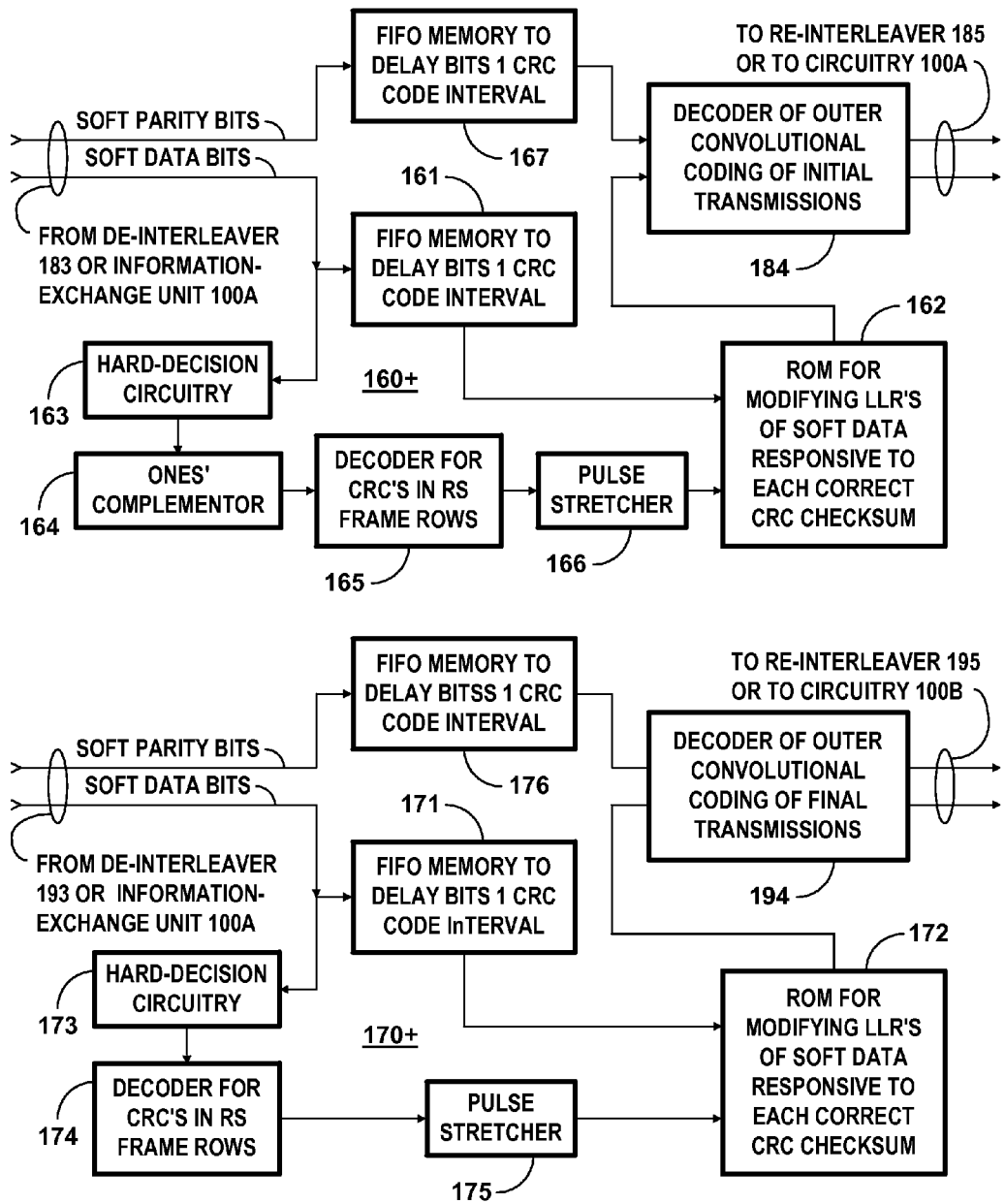

FIG. 53 shows how CRC decoding can be used to modify the confidence levels of soft data bits supplied to the outer decoders 184 and 194 of any of the embodiments of the FIG. 17B portion of receiver apparatus shown in FIG. 39, 42, 45 or 48. The apparatuses 160+ and 170+ for performing these modifications are relocated to be before the decoders 184 and 194 of outer convolutional coding, respectively, rather than after them as shown in FIGS. 51 and 52.

In FIG. 53 the apparatus 160+ modifies the confidence levels of soft data bits supplied from the output port of the de-interleaver 183, either directly or via the portion 100A of the information-exchange unit 100 for exchanging information between turbo decoding loops. The modifications are made responsive to decoding of CRC codewords contained within rows of bytes in the RS Frames for the initial components of iterative-diversity transmissions. The FIFO memory 161 delays the soft data bits supplied from the de-interleaver 183 as partial input addressing to the ROM 162 used to modify their confidence levels, the delay being for the duration of a CRC codeword. The soft data bits written to the FIFO memory 161 as input addressing are also applied as input signal to the hard-decision unit 163. The hard-decision unit 163 responds to supply (complementary) data bits to a ones' complementor 164. The ones' complementor 164 responds to supply data bits to the input port of a decoder 165 for the CRC codewords contained in complemented form within each row of bytes in each successive RS Frame for those initial-component transmissions for iterative diversity. The pulse stretcher 166 reproduces the CRC decoding result for the duration of a CRC codeword read from the FIFO memory 161 and is connected for applying that reproduced CRC decoding result to the ROM 162 for completing its input addressing. If the decoder 165 does not detect any error in the CRC codeword, the decoder 165 supplies a ONE to the pulse stretcher 166. The stretched-in-time ONE from the pulse stretcher 166 conditions the ROM 162 to increase the confidence levels of the soft (complementary) data bits in the CRC codeword as supplied from the ROM 162 to the input port of the outer decoder 184. If the decoder 165 detects error in the CRC codeword, the decoder 165 supplies a ZERO to the pulse stretcher 166. The stretched-in-time ZERO from the pulse stretcher 166 conditions the ROM 162 to leave unaltered the confidence levels of the soft (complementary) data bits in the CRC codeword as supplied from the ROM 162 to the input port of the outer decoder 184. In FIG. 53 the FIFO memory 167 is re-connected for delaying the soft parity bits applied to the input port of the outer decoder 184, either from the output port of the de-interleaver 183 or from the output port of the information-exchange unit 100A. This delay compensates for the latent delay of the soft (complementary) data bits in the path through the FIFO memory 161 and the ROM 162.

The apparatus 170+ modifies the confidence levels of soft data bits supplied to the outer decoder 194 responsive to CRC decoding of decoding of CRC codewords contained within rows of bytes in the RS Frames for the final-component transmissions for iterative diversity. The FIFO memory 171 delays the soft data bits supplied as partial input addressing to the ROM 172 used to modify their confidence levels, the delay being for the duration of a CRC codeword. The soft data bits written to the FIFO memory 171 as input addressing are also applied as input signal to the hard-decision unit 173. The hard-decision unit 173 responds to supply data bits as the input signal to the input port of the decoder 174 for the CRC coding of parity bytes in each successive RS Frame for the final-component transmissions for iterative diversity. The pulse stretcher 175 reproduces the CRC decoding result for the duration of a CRC codeword read from the FIFO memory 171 and is connected for applying that reproduced CRC decoding result to the ROM 172 for completing its input addressing. If the decoder 174 does not detect any error in the CRC codeword, the decoder 174 supplies a ONE to the pulse stretcher 175. The stretched-in-time ONE from the pulse stretcher 175 conditions the ROM 172 to increase the confidence levels of the soft (complementary) data bits in the CRC codeword as supplied from the ROM 172 to the input port of the outer decoder 184. If the decoder 174 detects error in the CRC codeword, the decoder 174 supplies a ZERO to the pulse stretcher 175. The stretched-in-time ZERO from the pulse stretcher 175 conditions the ROM 172 to leave unaltered the confidence levels of the soft (complementary) data bits in the CRC codeword as supplied from the ROM 172 to the input port of the outer decoder 194. In FIG. 53 the FIFO memory 176 is re-connected for delaying the soft parity bits supplied to the input port of the outer decoder 194, either from the output port of the de-interleaver 193 or from the output port of the information-exchange unit 100B. This delay compensates for the latent delay of the soft (complementary) data bits in the path through the FIFO memory 171 and the ROM 172.

Figure 54:
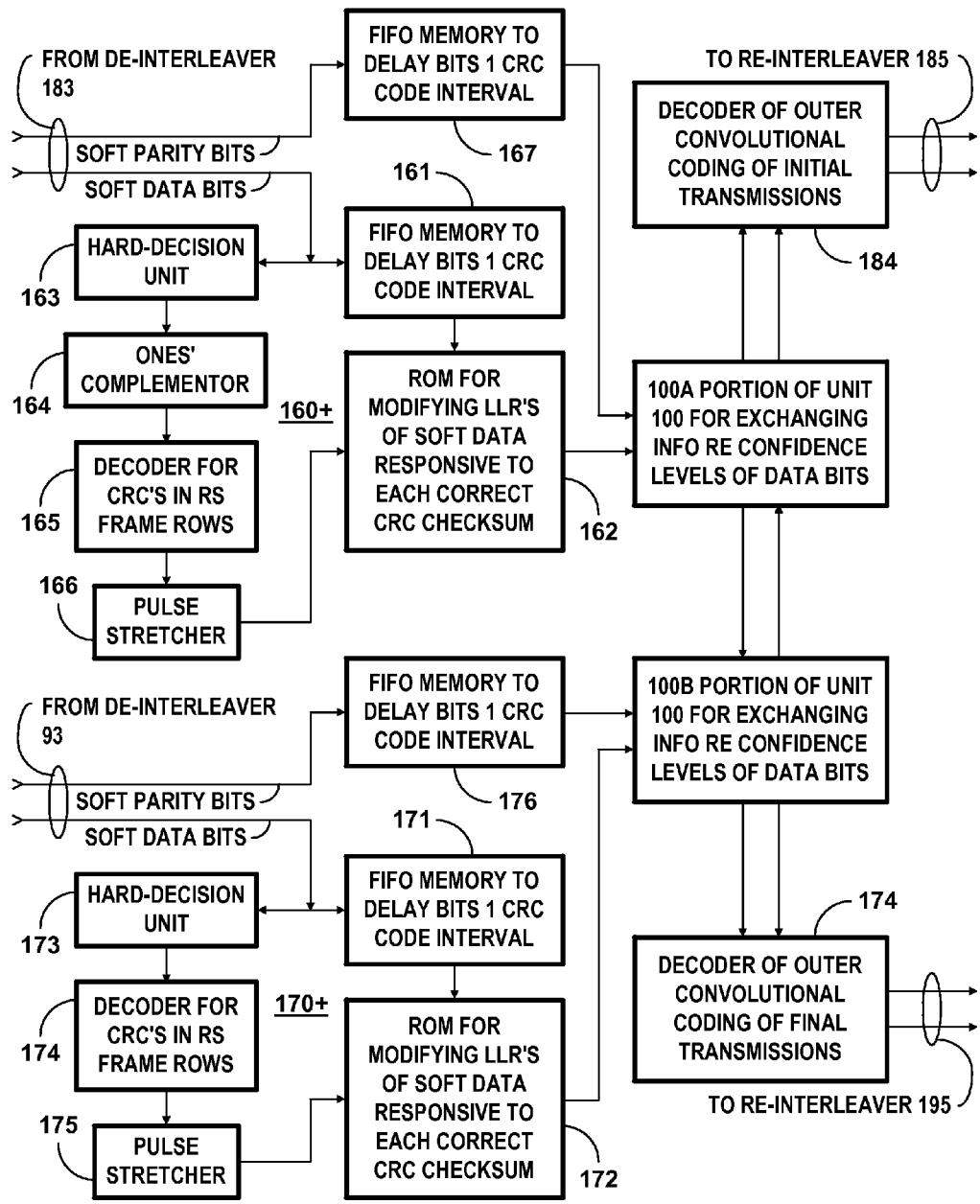

FIG. 54 shows another arrangement using CRC decoding to modify the confidence levels of soft data bits in a modification of the FIG. 46 embodiment of the FIG. 15B portion of receiver apparatus. This modification relocates the apparatuses 160+ and 170+ to just before the information-exchange unit 100.

In FIG. 54 the apparatus 160+ reproduces soft data bits supplied to it from the output port of the de-interleaver 183. However, the apparatus 160+ is apt to modify the confidence levels of certain ones of those soft data bits before reproducing them, which modifications are made responsive to decoding of CRC codewords contained in the rows of bytes in the RS Frames for the initial-component transmissions for iterative diversity. In FIG. 54 the apparatus 160+ is connected for supplying the soft data bits of its response to the portion 100A of the information-exchange unit 100 as input signal thereto. FIG. 54 shows the input port of the outer decoder 184 connected for receiving soft bits descriptive of 2-bit symbols of the outer convolutional coding of the initial-component transmissions for iterative diversity from the portion 100A of the information-exchange unit 100 for exchanging information between turbo decoding loops. FIG. 54 shows the FIFO memory 167 re-connected for delaying the soft parity bits applied to the input port of the portion 100A of the information-exchange unit 100. This compensates for the latent delay of the soft data bits in the path through the FIFO memory 161 and the ROM 162.

In FIG. 54 the apparatus 170+ reproduces soft data bits supplied to it from the output port of the de-interleaver 193. However, the apparatus 170+ is apt to modify the confidence levels of certain ones of those soft data bits before reproducing them, which modifications are made responsive to CRC decoding of CRC codewords contained in the rows of bytes in the RS Frames for the final-component transmissions for iterative diversity. In FIG. 54 the apparatus 170+ is connected for supplying the soft data bits of its response to the portion 100B of the information-exchange unit 100 as input signal thereto. FIG. 54 shows the input port of the outer decoder 194 connected for receiving soft bits descriptive of 2-bit symbols of the outer convolutional coding of the initial-component transmissions for iterative diversity from the portion 100B of the information-exchange unit 100 for exchanging information between turbo decoding loops. FIG. 54 shows the FIFO memory 176 re-connected for delaying the soft parity bits applied to the input port of the portion 100B of the information-exchange unit 100. This compensates for the latent delay of the soft data bits in the path through the FIFO memory 171 and the ROM 172.

Figure 55:
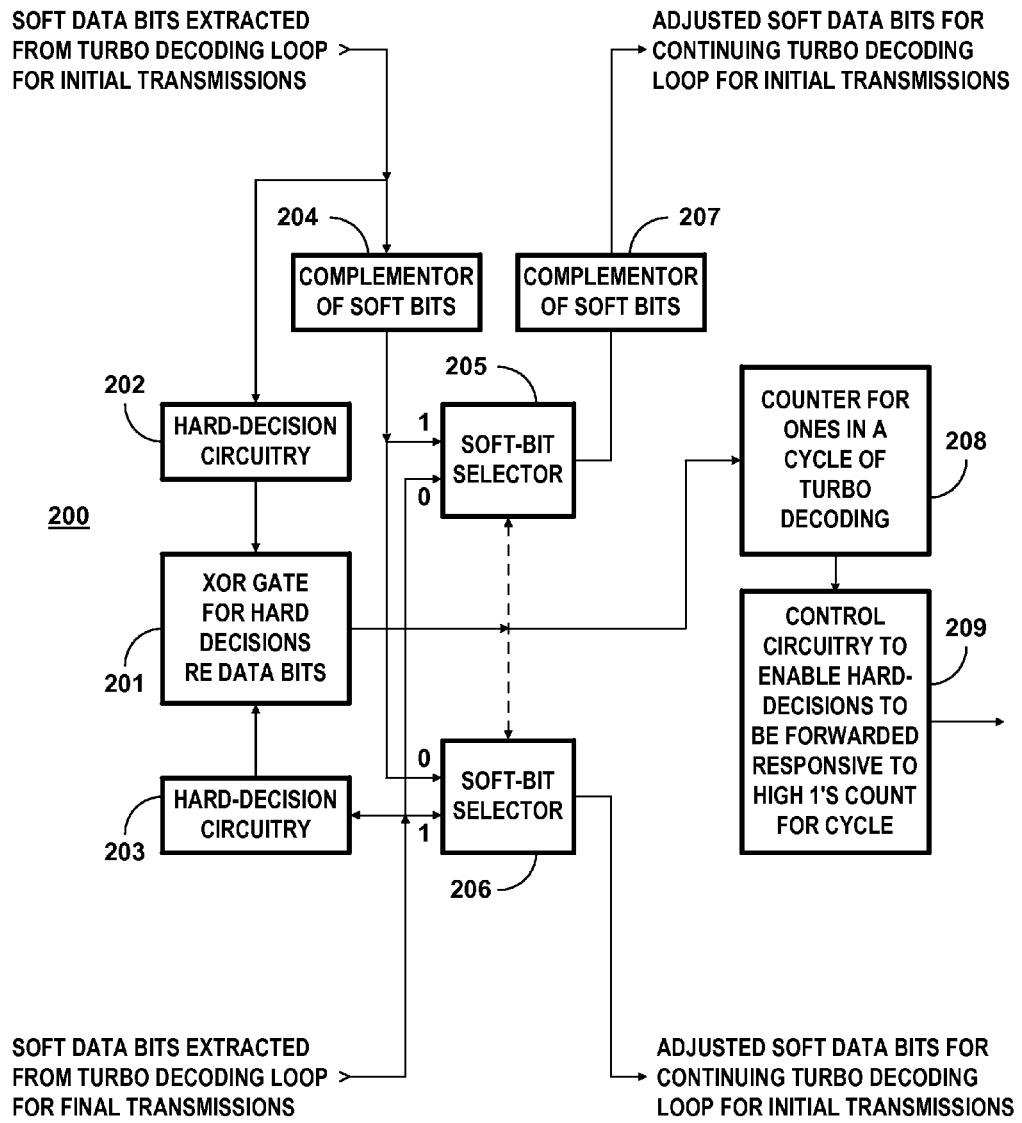
FIG. 55 is a schematic diagram of an information-exchange unit for exchanging information between paired turbo decoders that is alternative to those shown in FIGS. 22, 25, 28, 31, 40, 43, 46 and 49.

FIG. 55 shows an information-exchange unit 200 as used for selectively exchanging information between paired turbo decoding loops in each of the U.S. Provisional Applications Ser. Nos. 61/196,303, 61/196,847, 61/197,105, 61/197,554, 61/198,961 and 61/204,300 incorporated in its entirety herewithin. When hard data bits from the loop for turbo decoding final-component transmissions have values the same as complemented correspondingly-timed hard data bits from the loop for turbo decoding initial-component transmissions, there is no exchange between the loops of the soft data bits from which these hard bits are extracted. When hard data bits from the loop for turbo decoding final-component transmissions have values different from complemented correspondingly-timed hard data bits from the loop for turbo decoding initial-component transmissions, the soft data bits from which these hard bits are extracted are exchanged between the two loops. That is, soft data bits are swapped from each of the paired turbo decoding loops to the other. The information-exchange unit 200 is no longer preferred, because it does not suppress erroneous data bits in the turbo decoding loops as quickly as the information-exchange unit 100 shown in FIGS. 22, 25, 28, 31, 40, 43, 46 and 49.

FIG. 55 shows the construction of the information-exchange unit 200, which comprises elements 201, 202, 203, 204, 205, 206 and 207. The information-exchange unit 200 selectively swaps MSB information between the turbo coding loop for initial-component transmissions and the turbo coding loop for final-component transmissions. The swapping of MSB information is controlled by the response of an exclusive-OR gate 201 connected to receive as its two input signals the respective responses of hard-decision circuitry 202 and of hard-decision circuitry 203. The hard-decision circuitry 202 is connected to respond to soft data bits taken from the turbo decoding loop for initial-component transmissions for iterative diversity. The hard-decision circuitry 203 is connected to respond to soft data bits taken from the turbo decoding loop for final-component transmissions for iterative diversity.

If the contemporaneous responses of the hard-decision circuitry 202 and of the hard-decision circuitry 203 differ, which should be the usual case, the response of the XOR gate 201 is a logic ONE. Responsive to this logic ONE, MSB information is not swapped between the turbo coding loop for initial-component transmissions and the turbo coding loop for final-component transmissions. If the contemporaneous responses of the hard-decision circuitry 202 and of the hard-decision circuitry 203 are the same, the response of the XOR gate 201 is a logic ZERO. Responsive to this logic ZERO, soft data bits are swapped between the turbo coding loop for initial-component transmissions and the turbo coding loop for final-component transmissions. The circuitry for selectively swapping the soft MSBs is more particularly described in the following three paragraphs.

The input port of a complementor 204 of soft bits is connected to receive soft data bits taken from the turbo decoding loop for initial-component transmissions for iterative diversity. Each of the soft bits of the output signal from the complementor 204 ones' complements the respective soft data bit of its input signal, including both the hard bit of its input signal and the bits descriptive of the log-likelihood ratio of that hard bit. Selective swapping of soft data bits is done using soft-data-bit selectors 205 and 206 controlled by the response of the XOR gate 201.

When the XOR gate 201 response is a logic ONE, the soft-bit selector 205 is conditioned to reproduce the complemented soft data bit supplied to the "1" input of the soft-data-bit selector 205 by the complementor 204 of soft bits. The input port of another complementor 207 of soft bits is connected to receive the output signal of the soft-data-bit selector 205. Each of the soft bits of the output signal from the complementor 207 ones' complements the respective soft data bit of its input signal, including both the hard bit of its input signal and the bits descriptive of the log-likelihood ratio of that hard bit. The output port of the complementor 207 is connected to supply the complemented soft data bits from the soft-data-bit selector 205 to continue the turbo decoding loop for initial-component transmissions for iterative diversity. When the XOR gate 201 response is a logic ONE, the soft-data-bit selector 206 is conditioned to reproduce the soft data bit taken from the turbo decoding loop for initial-component transmissions for iterative diversity, as supplied to the "1" input of the soft-data-bit selector 206. The soft-data-bit selector 206 is connected for supplying its output signal to continue the turbo decoding loop for final-component transmissions for iterative diversity.

When the XOR gate 201 response is a logic ZERO, the soft-data-bit selector 205 is conditioned to reproduce the soft data bit taken from the turbo decoding loop for final-component transmissions for iterative diversity, as supplied to the "0" input of the soft-data-bit selector 205. The complementor 207 supplies complements of the soft bits in the output signal of the soft-data-bit selector 205 supply the complemented soft data bits from the soft-data-bit selector 205 for continuing with the turbo decoding loop for initial-component transmissions for iterative diversity. When the XOR gate 201 response is a logic ZERO, the soft-bit selector 206 is conditioned to reproduce complemented soft data bits taken from the turbo decoding loop for initial-component transmissions for iterative diversity, as supplied to the "0" input of the soft-bit selector 206 by the complementor 204 of soft bits. The soft-data-bit selector 206 supplies its output signal to continue the turbo decoding loop for final-component transmissions for iterative diversity.

FIG. 55 also shows circuitry that can help in making the decision as to when turbo decoding procedures for iterative-diversity transmissions can be concluded and hard decisions can be forwarded from the hard-decision circuitry 203 to subsequent portions of the FIG. 17 receiver apparatus. A counter 208 is connected for counting the ONEs in the response of the XOR gate 209 during each cycle of turbo decoding. The counter 208 is further connected for supplying the ONEs count to control circuitry 209. The control circuitry 209 determines when the ONEs count is high enough that further cycles of turbo decoding will not be required after the current one. Responsive to this information turbo decoding of the same data is discontinued after the subsequent outer decoding procedure. This information is used for controlling the forwarding of hard decisions from the hard-decision circuitry 112 to subsequent portions of the FIG. 17 receiver apparatus, for example.

Modifications of the information-exchange unit 100 shown in FIGS. 22, 25, 28, 31, 40, 43, 46 and 49 suppress erroneous data bits in the turbo decoding loops incrementally and may be less susceptible to occasional inadvertent loss of data. The information-exchange unit 100 shown in FIGS. 22, 25, 28, 31, 40, 43, 46 and 49 is a component in these modifications. The input soft data bits to and the corresponding output soft data from each portion of the information-exchange unit 100 as so shown are combined in a weighted averaging procedure, thereby to generate soft data bits of a respective one of the two ultimate datastreams from the modified information-exchange unit.

It will be apparent to those skilled in the art and acquainted with this disclosure that various modifications and variations can be made in the invention described without departing from the spirit or scope of the invention as expressed in the following claims. This should be kept in mind when evaluating the scope of each of the following claims. In the claims which follow, the word "said" rather than the word "the" is used to indicate the existence of an antecedent basis for a term having being provided earlier in the claims. The word "the" is used for purposes other than to indicate the existence of an antecedent basis for a term having being provided earlier in the claims, the usage of the word "the" for other purposes being consistent with normal grammar in the American English language.

What is claimed is:

1. A transmitter apparatus for broadcasting mobile/handheld (M/H) data, in a form of an 8-level-modulation vestigial-sideband (8-VSB) signal that is intended to be reproduced by M/H receivers and that differs from the form used for broadcasting main service data intended to be reproduced by digital television (DTV) receivers, at least some of which M/H data is transmitted twice at separate times as iterative-diversity (ID) data, said transmission apparatus comprising:
    an M/H pre-processor for pre-processing said M/H data to generate pre-processed M/H data by randomizing, trans-verse-Reed-Solomon (TRS) coding, cyclic redundancy check (CRC) coding, outer convolutional coding, and byte-deinterleaving said M/H data,
    memory included within said M/H pre-processor, respective portions of which said memory temporarily store M/H data for respective RS Frames, each of said respective portions of said memory being read up to two times, said iterative diversity data being generated by reading twice from selected ones of said portions of said memory;
    an M/H post-processor for post-processing each of said M/H frames, by systematic/non-systematic Reed-Solomon (R-S) coding, convolutional byte-interleaving and modified trellis-coding; and
    a transmitter connected for receiving said post-processed M/H frames as a modulating signal,
    wherein a block processor within said M/H pre-processor comprises a ½ code-rate convolutional encoder for outer convolutional coding of randomized M/H data that has been TRS-coded and CRC-coded, and wherein the modified trellis coding within said M/H post-processor comprises ⅔ code-rate trellis coding that cooperates with said outer convolutional coding in such way as to generate parallel concatenated convolutional coding (PCCC) for said randomized M/H data that has been TRS-coded and CRC-coded.

2. The transmitter apparatus of claim 1, wherein before outer convolutional coding of bits of said randomized M/H data that has been TRS-coded and CRC-coded, the block processor selectively ones' complements each of said bits supplied by an initial one of two readings of any one of said portions of said memory temporarily storing said RS Frames of randomized M/H data, but none of said bits from a final reading of any one of said portions of said memory temporarily storing said RS Frames of randomized M/H data.

3. The transmitter apparatus of claim 1,
wherein a block processor within said M/H pre-processor comprises a ½ code-rate convolutional encoder for outer convolutional coding of randomized M/H data that has been TRS-coded and CRC-coded;
wherein the modified trellis coding within said M/H post-processor comprises ⅔ code-rate trellis coding that cooperates with said outer convolutional coding in such way as to generate serial concatenated convolutional coding (SCCC) for said randomized M/H data that has been TRS-coded and CRC-coded; and
wherein before outer convolutional coding of bits of said randomized M/H data that has been TRS-coded and CRC-coded, the block processor selectively ones' complements each of said bits supplied by an initial one of two readings of any one of said portions of said memory temporarily storing said RS Frames of randomized M/H data, but none of said bits from a final reading of any one of said portions of said memory temporarily storing said RS Frames of randomized M/H data.

4. The transmitter apparatus of claim 1,
wherein each reading of said respective portions of said memory which temporarily store M/H data for respective RS Frames is completed within one of successive M/H Frame intervals, each said M/H Frame interval divided into a respective five successive equal-length sub-Frame intervals, and each said sub-Frame interval sub-divided into a respective 16 successive Slot intervals for possible inclusion of M/H data, each reading of said respective portions of said memory which temporarily store M/H data for respective RS Frames taking place during corresponding Slot intervals in successive sub-Frame intervals of said one of successive M/H Frame intervals in which that said reading is completed; and
wherein each final reading of particular M/H data from a selected one of said portions of said memory is delayed from an initial reading of that said particular M/H data by a number, at least zero, of M/H Frame time intervals plus an odd number of further Slot.

5. The transmitter apparatus of claim 1,
wherein the M/H pre-processor comprises a signaling encoder for processing Transmission Parameter Channel (TPC) data and Fast Information Channel (FIC) data by for parallel concatenated convolutional coding thereof and inclusion within each of said Slot intervals also including accompanying M/H data that has been pre-processed as specified in claim 1; and
wherein said signaling encoder includes a TPC generator for supplying TPC data that comprises information concerning the nature of any iterative-diversity transmission of said accompanying pre-processed M/H data in addition to information as to which position within one of said sub-Frames said accompanying M/H data occupies, the Ensemble with which said accompanying pre-processed M/H data is associated, and information concerning forward-error-correction (FEC) coding of said Ensemble with which said accompanying pre-processed M/H data is associated.

6. The transmission apparatus of claim 1,
wherein the M/H pre-processor comprises a signaling encoder for processing Transmission Parameter Channel (TPC) data and Fast Information Channel (FIC) data by for parallel concatenated convolutional coding thereof and inclusion within each of said Slot intervals also including accompanying M/H data that has been pre-processed as specified in claim 1; and
wherein said signaling encoder includes a FIC generator for supplying Chunks of FIC data, a respective payload portion of each of said Chunks of FIC data including a respective indication in regard to each Ensemble within said accompanying pre-processed M/H data as to whether that said Ensemble is currently being transmitted a final time.

7. The transmitter apparatus of claim 1,
wherein the M/H pre-processor comprises a signaling encoder for processing Transmission Parameter Channel (TPC) data and Fast Information Channel (FIC) data by for parallel concatenated convolutional coding thereof and inclusion within each of said Slot intervals also including accompanying M/H data that has been pre-processed as specified in claim 1; and
wherein said signaling encoder includes a FIC generator for supplying Chunks of FIC data, a respective payload portion of each of said Chunks of FIC data including a respective field in regard to each Ensemble within said accompanying pre-processed M/H data as to the character of any multiple ensemble service involving that said Ensemble, including the character of any multiple ensemble service involving iterative-diversity transmissions.

8. A transmitter apparatus for generating 8VSB digital television (DTV) signals in general accordance with specifications of the ATSC Mobile DTV Standard published by the Advanced Television Systems Committee, but supportive of iterative-diversity reception by receivers that combine the components of iterative-diversity transmissions during decoding procedures, said Standard specifying the transmission of M/H data for mobile/handheld receivers within at least one selected one of 16 Slot intervals in each of five sub-frames of each M/H Frame interval extending over 20 data frames of 8VSB digital television signal, said transmitter apparatus comprising:
an M/H Frame encoder for separating successive bytes of M/H service multiplex signal for data randomization and subsequent temporary storage in byte storage locations associated with rows of RS Frames within respective ones of a plurality of RS Frame memories within said M/H Frame encoder, for subjecting the successive bytes of data-randomized M/H service multiplex signal temporarily stored within each one of said plurality of RS Frame memories to transversal Reed-Solomon (TRS) coding with the resulting parity bytes temporarily stored in byte storage locations associated with further rows of that said one of said plurality of RS Frame memories, and for subjecting the successive bytes of data-randomized M/H service multiplex signal and TRS parity bytes temporarily stored within each one of said plurality of RS Frame memories to row by row lateral cyclic-redundancy-check coding with the resulting parity bytes for each row appended to the conclusion thereof when each row of bytes within that said one of said plurality of RS Frame memories is read from said M/H Frame encoder, each one of said plurality of RS Frame memories with temporarily stored bytes arranged to have its byte storage locations read at least once before being re-written and selected ones of said plurality of RS Frame memories with temporarily stored bytes arranged to have its byte storage locations read twice before being re-written, each said reading of the byte storage locations of an RS Frame being completed within a single one of said M/H Frame intervals;
a block processor connected for converting bytes read from temporary storage in said selected ones of said plurality of RS Frame memories to a bit-serial-format signal, for coding said modified bit-serial-format signal in accordance with an outer convolutional code that halves effective code rate to generate first sets of successive two-bit symbols, for ones' complementing the bits of said bit-serial-format signal originating from one of two readings of bytes from said selected ones of said plurality of RS Frame memories to generate a modified bit-serial-format signal, for coding said modified bit-serial-format signal in accordance with said outer convolutional code that halves effective code rate to generate second sets of successive two-bit symbols, for interleaving said two-bit symbols in said first sets thereof to generate respective first sets of interleaved two-bit symbols that are converted to bytes of respective first sets of M/H Blocks, and for interleaving said two-bit symbols in said second sets thereof to generate respective second sets of interleaved two-bit symbols that are converted to bytes of respective second sets of M/H Blocks;

a signaling encoder for supplying Transport Parameter Channel (TPC) and Fast Information Channel (FIC) signals that are encoded using parallelly concatenated convolutional coding (PCCC);

a Group formatter connected for receiving said first sets of M/H Blocks and said second sets of M/H Blocks from said block processor, for receiving said TPC and said FIC signals in PCCC form from said signaling encoder, for assembling successive M/H Groups each composed of a plurality of said M/H Blocks selected from one of said first and said second sets of M/H Blocks and a respective sequence of said TPC and said FIC signals encoded using PCCC, and for de-interleaving bytes of said M/H Groups and placeholder bytes for other signals assembled together therewith as they will appear in a modulating signal, said de-interleaving being complementary to convolutional byte interleaving performed further on in said transmitter apparatus, the resulting de-interleaved signal being supplied as a Group formatter response;

a packet formatter connected for receiving said Group formatter response and generating MPEG-2 transport stream packets responsive to said Group formatter response;

a packet multiplexer connected for time-division multiplexing MPEG-2 transport stream packets generated by said packet formatter together with MPEG-2 transport stream packets of the main service, thereby generating a combined transport stream of MPEG-2 packets;

a M/H post processor connected for receiving said combined transport stream of MPEG-2 packets, for data-randomizing said MPEG-2 transport stream packets of the main service, for Reed-Solomon encoding the bytes of said combined transport stream of MPEG-2 packets, for convolutionally interleaving the bytes of the successive resulting Reed-Solomon codewords, and for trellis coding the convolutionally byte-interleaved Reed-Solomon codewords for supplying a trellis-coded output signal in which said bytes of M/H service multiplex signal are encoded as concatenated convolutional coding (CCC);

modulator apparatus connected for generating said modulating signal responsive to said trellis-coded output signal of said M/H post processor; and radio-frequency transmission apparatus for transmitting a radio frequency wave with amplitude modulated in accordance with said modulating signal.

9. The transmitter apparatus of claim 8, wherein each of said five successive sub-frames in each of said M/H Frame intervals is considered to contain sixteen successive Slots for possible inclusion of respective M/H Groups; which sixteen successive Slots are identified as Slots #0, #1, #2, #3, #4, #5, #6, #7, #8, #9, #10, #11, #12, #13, #14 and #15 respectively; wherein the initial component transmissions of an iterative diversity signal are encoded in Slots identified by a first set of Slot numbers and the final component transmissions of an iterative diversity signal are encoded in Slots identified by a second set of Slot numbers, said first and said second sets of Slot numbers each containing Slot numbers completely different from those contained by the other.

10. A transmitter apparatus for transmitting a radio-frequency signal the amplitude, of which is modulated in accordance with an 8-level modulating signal, said transmitter apparatus comprising:

a first convolutional encoder for encoding randomized data bits, to supply respective 2-bit symbols each reproducing the randomized data bit accompanied by a respective one of parity bits generated by said first convolutional encoder;

a symbol interleaver for permuting the order of said 2-bit symbols as supplied from said first convolutional encoder in a response from said symbol interleaver composed of interleaved 2-bit symbols, each successive one of said interleaved 2-bit symbols composed of an interleaved randomized data bit accompanied by a respective interleaved one of said parity bits generated by said first convolutional encoder;

a second convolutional encoder for encoding said interleaved randomized data bits of said interleaved 2-bit symbols in said response from said symbol interleaver, to supply respective further 2-bit symbols each reproducing a respective one of said interleaved randomized data bits accompanied by a respective one of said parity bits generated by said second convolutional encoder;

a symbol mapper for said 8-level modulating signal, each of said eight levels being identified by a three-bit digital number, at times of PCCC transmission at one-third code rate the most significant bits of said three-bit digital numbers corresponding to parity bits generated by said first convolutional encoder, at times of PCCC transmission at one-third code rate the least significant bits of said three-bit digital numbers corresponding to parity bits generated by said second convolutional encoder, and at times of PCCC transmission at one-third code rate the bits of intermediate significance within said three-bit digital numbers corresponding to said interleaved randomized data bits reproduced by said second convolutional encoder.

11. A receiver apparatus for final-component transmissions of concatenated convolutionally coded (CCC) data and for initial-component transmissions of corresponding CCC data, said CCC data and said corresponding CCC data each conveyed within 8-level symbols modulating a carrier wave for iterative-diversity broadcasting, said receiver apparatus comprising:

apparatus for demodulating said carrier wave and supplying soft decisions concerning said 8-level symbols of said final-component transmissions conveying said CCC data and of any of said preceding initial-component transmissions conveying corresponding CCC data;

delay memory connected for delaying those of said soft decisions concerning said 8-level symbols conveying said CCC data within any said initial-component transmissions so as to be contemporaneous with those of said soft decisions concerning said 8-level symbols conveying said CCC data within corresponding ones of said final-component transmissions;

paired first and second turbo decoders of similar construction, said first turbo decoder including a respective first turbo decoding loop and said second turbo decoder including a respective second turbo decoding loop, said first turbo decoder connected for receiving as an input signal thereof said soft decisions concerning said 8-level symbols conveying said CCC data within said final-component transmissions, said second turbo decoder connected for receiving as an input signal thereof said soft decisions concerning said 8-level symbols conveying said CCC data within said initial-component transmissions, as delayed by said delay memory so as to be contemporaneous with those of said soft decisions concerning said 8-level symbols conveying said CCC data within said final-component transmissions; and an information-exchange unit connected for exchanging information concerning the confidence levels of soft data bits between said respective turbo decoding loops of said paired first and second turbo decoders of similar construction.

12. The receiver apparatus of claim 11, further comprising:
respective decoders for responding to Transmission Parameter Channel (TPC) data and to Fast Information Channel (FIC) data, said TPC data and said FIC data both transmitted with said final-component transmissions of said CCC data and with said initial-component transmissions of corresponding CCC data;

said receiver apparatus being arranged to respond to indications in portions of said TPC data transmitted within a current Slot interval that M/H data transmitted within said current Slot interval is a part of said iterative diversity broadcasting, by writing initial-component transmissions of corresponding CCC data for a selected M/H service into said delay memory to be temporarily stored for a prescribed time and then read to said second turbo decoder as input signal thereto.

13. The receiver apparatus of claim 11, wherein said receiver apparatus is arranged to detect from a particular one of fields within said TPC data transmitted within a current Slot interval, an indication of said prescribed time for temporarily storing initial-component transmissions of corresponding CCC data for a selected M/H service.

14. The receiver apparatus of claim 11, further comprising:
respective decoders for responding to Transmission Parameter Channel (TPC) data and to Fast Information Channel (FIC) data, said TPC data and said FIC data both transmitted with said final-component transmissions of said CCC data and with said initial-component transmissions of corresponding CCC data;

said receiver apparatus being arranged to respond to fields within the payload portion of Chunks of said FIC data indicative of the nature of multiple-Ensemble services for determining the nature of iterative diversity broadcasting of currently received signals.

15. The receiver apparatus of claim 11, wherein said information-exchange unit is constructed for replacing the one of corresponding soft data bits from said respective turbo decoding loops of said paired first and second turbo decoders with lower confidence level with a replacement soft data bit of higher confidence level, said replacement soft data bit being derived from the one of corresponding soft data bits from said respective turbo decoding loops of said paired first and second turbo decoders with higher confidence level.

16. The receiver apparatus of claim 11, wherein said information-exchange unit is constructed from read-only memory addressed by soft data bits from corresponding points in said first turbo decoding loop and in said second turbo decoding loop, said read-only memory connected for supplying modified soft data bits for continuing said first turbo decoding loop, and said read-only memory connected for supplying modified soft data bits for continuing said second turbo decoding loop.

17. The receiver apparatus of claim 11,
wherein the receiver apparatus is provided for initial-component transmissions and final-component transmissions of CCC data conveyed within 8-level symbols modulating a carrier wave for iterative-diversity broadcasting,
wherein said information-exchange unit is constructed for exchanging corresponding soft data bits between said respective turbo decoding loops when the hard bits of said corresponding soft data bits both have the same value.

18. The claim 11 receiver apparatus,
wherein the receiver apparatus is provided for initial-component transmissions and final-component transmissions of parallel concatenated convolutionally coded (PCCC) data conveyed within 8-level symbols modulating a carrier wave for iterative-diversity broadcasting;
wherein a respective 3-bit binary number is encoded within each of said 8-level symbols in said initial-component transmissions, the bit other than the most significant and least significant bits thereof being a respective one of interleaved randomized data bits, the most significant bit of the respective 3-bit binary number encoded within each of said 8-level symbols in said initial-component transmissions being a respective one of parity bits for outer convolutional coding of said randomized data bits, and the least significant bit of the respective 3-bit binary number encoded within each of said 8-level symbols in said initial-component transmissions being a respective one of parity bits for inner convolutional coding of said interleaved randomized data bits; and
wherein a respective 3-bit binary number is encoded within each of said 8-level symbols in said final-component transmissions, the bit other than the most significant and least significant bits thereof being a respective one of interleaved one's complements of said randomized data bits, the most significant bit of the respective 3-bit binary number encoded within each of said 8-level symbols in said final-component transmissions being a respective one of parity bits for outer convolutional coding of said one's complements of said randomized data bits, and the least significant bit of the respective 3-bit binary number encoded within each of said 8-level symbols in said final-component transmissions being a respective one of parity bits for inner convolutional coding of said interleaved one's complements of said randomized data bits.

19. The claim 11 receiver apparatus,
wherein the receiver apparatus is provided for initial-component transmissions and final-component transmissions of serial concatenated convolutionally coded (SCCC) data conveyed within 8-level symbols modulating a carrier wave for iterative-diversity broadcasting;
wherein a respective 3-bit binary number is encoded within each of said 8-level symbols in said initial-component transmissions, the most significant bit thereof being a respective one of interleaved randomized data bits, the bit other than the most significant and least significant bits of the respective 3-bit binary number encoded within each of said 8-level symbols in said initial-component transmissions being a respective one of interleaved parity bits for outer convolutional coding of said randomized data bits, and the least significant bit of the respective 3-bit binary number encoded within each of said 8-level symbols in said initial-component transmissions being a respective one of parity bits for inner convolutional coding of said interleaved parity bits for outer convolutional coding of said randomized data bits; and wherein a respective 3-bit binary number is encoded within each of said 8-level symbols in said final-component transmissions, the most significant bit thereof of being a respective one of interleaved ones' complements of said randomized data bits, the bit other than the most significant and least significant bits of the respective 3-bit binary number encoded within each of said 8-level symbols in said initial-component transmissions being a respective one of interleaved parity bits for outer convolutional coding of said ones' complements of said randomized data bits, and the least significant bit of the respective 3-bit binary number encoded within each of said 8-level symbols in said initial-component transmissions being a respective one of parity bits for inner convolutional coding of said interleaved parity bits for outer convolutional coding of said ones' complements of said randomized data bits.

* * * * *